US 6,756,921 B2

(12) United States Patent
Kimura et al.

(10) Patent No.: US 6,756,921 B2
(45) Date of Patent: Jun. 29, 2004

(54) MULTIPLE QUALITY DATA CREATION ENCODER, MULTIPLE QUALITY DATA CREATION DECODER, MULTIPLE QUANTITY DATA ENCODING DECODING SYSTEM, MULTIPLE QUALITY DATA CREATION ENCODING METHOD, MULTIPLE QUALITY DATA CREATION DECODING METHOD, AND MULTIPLE QUALITY DATA CREATION ENCODING/ DECODING METHOD

(75) Inventors: Tomohiro Kimura, Tokyo (JP); Fumitaka Ono, Tokyo (JP); Masayuki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/398,033

(22) PCT Filed: Dec. 20, 2001

(86) PCT No.: PCT/JP01/11172
§ 371 (c)(1),
(2), (4) Date: Apr. 1, 2003

(87) PCT Pub. No.: WO02/054602
PCT Pub. Date: Jul. 11, 2002

(65) Prior Publication Data

US 2004/0036635 A1 Feb. 26, 2004

(30) Foreign Application Priority Data

Dec. 27, 2000 (JP) ........................................ 2000-396972

(51) Int. Cl.[7] ................................................ H03M 7/00
(52) U.S. Cl. ............................ 341/50; 341/51; 341/107
(58) Field of Search ............................. 341/50, 51, 107, 341/58, 94, 106

(56) References Cited

U.S. PATENT DOCUMENTS 5,059,976 A 10/1991 Ono et al.

(List continued on next page.)

FOREIGN PATENT DOCUMENTS

JP 5-56267 A 3/1993

(List continued on next page.)

OTHER PUBLICATIONS

Pennebaker, et al. "JPEG Still Image Data Compression Standard", Chapter 9: JPEG Binary Arithmetic Coding/ pp. 149–167. (No date).

(List continued on next page.)

Primary Examiner—Jean Jeanglaude
(74) Attorney, Agent, or Firm—Birch, Stewart, Kolasch & Birch, LLP

(57) ABSTRACT

Plural decoded results are obtained from one code data based on with/without change information attached to encoding information shared by the receiver.

An encoder having a modeling unit 502A' for modeling input data sequence 501 to obtain a data value 503 and a parameter 504, an encoding unit 505' for encoding output from the modeling unit, and a code sending unit 506' for sending output from the encoding unit, the encoder includes:

a) a setting changing unit 523A for instructing to change one of the data value and the parameter based on change information 521; and
at least one of following b-1) and b-2):
b-1) a data manipulating unit 530A for manipulating either of the data value 503 or the parameter 504 output from the modeling unit to output to the encoding unit based on the change information instructed by the setting changing unit; and
b-2) a code manipulating unit 531A for obtaining encoded result by instructing the encoding unit to perform predetermined change or manipulating sending code output sent by the code sending unit based on the change information instructed by the change setting unit. Further, a decoder having corresponding function is provided.

26 Claims, 63 Drawing Sheets

U.S. PATENT DOCUMENTS

| | | |
|---|---|---|
| 5,307,062 A | 4/1994 | Ono et al. |
| 5,404,140 A | 4/1995 | Ono et al. |
| RE35,781 E | 5/1998 | Ono et al. |
| 5,818,369 A * | 10/1998 | Withers .................. 341/107 |
| 6,222,887 B1 * | 4/2001 | Nishikawa et al. .... 375/240.26 |

FOREIGN PATENT DOCUMENTS

| | | | |
|---|---|---|---|
| JP | 6-112840 A | | 4/1994 |
| JP | 07-111646 A | | 4/1995 |
| JP | 08-181966 A | | 7/1996 |
| JP | 08-331395 A | | 12/1996 |
| JP | 09-205630 A | | 8/1997 |
| JP | 11-73102 A | | 3/1999 |
| WO | WO 00/31878 | * | 6/2000 |

OTHER PUBLICATIONS

Mitchell, et al. "Software Implementations of the Q–Coder" IBM J. Res. Develop, vol. 32, No. 6, Nov. 1988; pp. 753–774.

International Telecommunication Union; "ITU–T Recommendation T.82" 6.4/6.5 typical prediction, 6.6 deterministic prediction, 6.8 Arithmetic coding (pp. 13–45). (No date).

* cited by examiner

Fig. 12

| ENCODING | CX1 = 1 | , MPS(0) = 0 | , MPS(1) = 1 | ←INITIAL VALUE |
|---|---|---|---|---|
| NUMBER | 1 | 2 | 3 | 4 | =N |
| DATA VALUE | 1 | 1 | 0 | 1 | =DN |
| CONTEXT | 1 | 1 | 1 | 0 | =CXN (=DN-1) |
| PREDICTION VALUE | 1 | 1 | 1 | 0 | =MPS(CXN) |
| SYMBOL | 0 | 0 | 1 | 1 | =SYMN (=DN xor MPS(CXN)) |

UPPER LIMIT VALUE
SYMBOL 1   1.000

| | SYMBOL 1 CORRESPONDING REGION A1 (UPPER PARTIAL REGION) | | | |
|---|---|---|---|---|
| INITIAL VALUE | 0.100 | 0.0100 | 0.01000 | 0.010000 | 0.0100000 |
| A=1.000 (INTERVAL) | | | 1 | 0.001100 | 0.0011000 FINAL EFFECTIVE REGION |
| C=0.000 (CODE) | | | 0.00100 | 0.001000 | |
| BOUNDARY SYMBOL 0 | SYMBOL 0 CORRESPONDING REGION A1 (LOWER PARTIAL REGION) | | | |
| C=CODE VALUE (ON DECODING) | | 0.0000 | 0.00000 | | |

LOWER LIMIT VALUE   0.000

| DECODING | CX1 = 0 | , MPS(0) = 0 | , MPS(1) = 0 | ←INITIAL VALUE |
|---|---|---|---|---|
| NUMBER | 1 | 2 | 3 | 4 | =N |
| CONTEXT | 0 | 0 | 0 | 1 | =CXN (=DN-1) |
| PREDICTION VALUE | 0 | 0 | 1 | 0 | =MPS(CXN) |
| SYMBOL | 0 | 0 | 1 | 1 | =SYMN |
| DATA VALUE | 0 | 0 | 1 | 1 | =DN (=SYMN xor MPS(CXN)) |

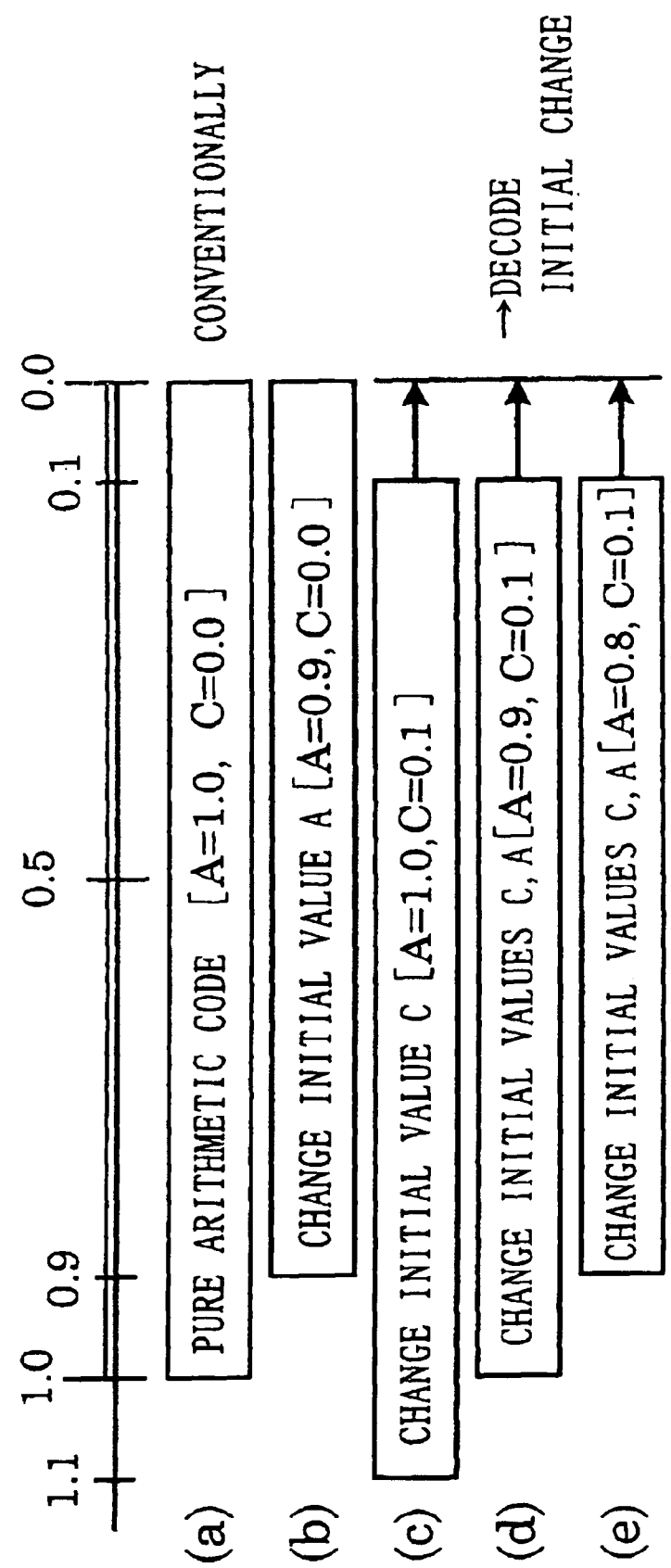

Fig.28

|   | DATA VALUE | | | CONVERTED VALUE | | |
|---|---|---|---|---|---|---|
| 0 | 0 | 0 | 0 | 0 | 0 | 0 |
| 1 | 0 | 0 | 1 | 0 | 0 | 1 |
| 2 | 0 | 1 | 0 | 0 | 1 | 1 |
| 3 | 0 | 1 | 1 | 0 | 1 | 0 |
| 4 | 1 | 0 | 0 | 1 | 1 | 0 |
| 5 | 1 | 0 | 1 | 1 | 1 | 1 |
| 6 | 1 | 1 | 0 | 1 | 0 | 1 |
| 7 | 1 | 1 | 1 | 1 | 0 | 0 |

Fig. 31

| UPPER BIT PLANE | | INITIAL VALUE | | | DATA VALUE | | | |
|---|---|---|---|---|---|---|---|---|
| ENCODING | DECODING | CX1 | MPS(0) | MPS(1) | D1 | D2 | D3 | D4 |
| | ERROR | 1 | 0 | 1 | 1 | 1 | 0 | 1 |
| | ERROR | 0 | 0 | 0 | 0 | 0 | 1 | 1 |
| | ERROR | 0 | 0 | 1 | 0 | 0 | 1 | 0 |
| | ERROR | 0 | 1 | 0 | 1 | 0 | 0 | 0 |
| | CORRECT | 1 | 1 | 1 | 1 | 1 | 0 | 0 |
| | ERROR | 1 | 0 | 0 | 1 | 0 | 1 | 1 |
| | ERROR | 1 | 1 | 1 | 0 | 1 | 0 | 1 |
| | ERROR | 1 | 1 | 1 | 1 | 1 | 0 | 0 |

| UPPER BIT PLANE | | INITIAL VALUE | | | DATA VALUE | | | |
|---|---|---|---|---|---|---|---|---|
| ENCODING | DECODING | CX1 | MPS(0) | MPS(1) | D1 | D2 | D3 | D4 |
| | ERROR | 0 | 1 | 0 | 0 | 1 | 0 | 0 |
| | ERROR | 0 | 0 | 1 | 1 | 0 | 0 | 1 |
| | CORRECT | 0 | 0 | 0 | 1 | 1 | 1 | 0 |
| | ERROR | 0 | 1 | 1 | 0 | 1 | 0 | 0 |
| | ERROR | 1 | 1 | 0 | 0 | 1 | 1 | 0 |
| | ERROR | 1 | 0 | 1 | 0 | 0 | 0 | 1 |
| | ERROR | 1 | 1 | 0 | 1 | 0 | 0 | 1 |
| | ERROR | 1 | 1 | 1 | 0 | 1 | 1 | 0 |

Fig.40

| ENCODING | CX1= 0 | , MPS(0)= 0 | , MPS(1)= 0 | | ←INITIAL VALUE |
|---|---|---|---|---|---|
| NUMBER | 1 | 2 | 3 | 4 | =N |
| DATA VALUE | 0 | 1 | 0 | 1 | =D_N |
| CONTEXT | 0 | 0 | 1 | 0 | =CX_N (=D_{N-1}) |
| PREDICTION VALUE | 0 | 0 | 0 | 0 | =MPS(CX_N) |
| SYMBOL | 0 | 1 | 0 | 1 | =SYM_N |
| | | | | | (=D_N xor MPS(CX_N) ) |

UPPER LIMIT VALUE    1.000

| | | DIVIDE REGION | | SYMBOL NEXT INTERVAL | OPERATION FOR ENCODING | OPERATION FOR DECODING |
|---|---|---|---|---|---|---|
| INITIAL VALUE | SYMBOL 1 CORRESPONDING REGION A1 (UPPER PARTIAL REGION) | A1=A×1/2 | | 1 UPDATA TO A1 | C=C+A0, A=A1 | C=C−A0, A=A1 |
| A=1.000 (INTERVAL) | | A0=A−A1 | | 0 UPDATA TO A0 | (C=C), A=A0 | (C=C), A=A0 |
| C=0.000 (CODE) | | | | | | |

BUNDARY   0.100   0.1000   0.10000

SYMBOL 0 | SYMBOL 0 CORRESPONDING REGION A0 | | | | | |

C=CODE VALUE (ON DECODING)

(LOWER PARTIAL REGION)

LOWER LIMIT VALUE   0.000   0.0000

Effective region progression:
- 0.100 → 0.1000 → 0.10000
- 0.01100 → 0.011000 → 0.0110000
- 0.010100 → 0.0101000
- 0.0100 → 0.01000 → 0.010000

FINAL EFFECTIVE REGION
CODE VALUE C=0.0101000
(LOWER LIMIT VALUE OF FINAL EFFECTIVE REGION)

EFFECTIVE REGION : (LOWER LIMIT VALUE) C≤EFFECTIVE REGION<C+A

| DECODING | CX1= 0 | , MPS(0)= 0 | , MPS(1)= 0 | | ←INITIAL VALUE |
|---|---|---|---|---|---|
| NUMBER | 1 | 2 | 3 | 4 | =N |
| CONTEXT | 0 | 0 | 1 | 0 | =CX_N (=D_{N-1}) |
| PREDICTION VALUE | 0 | 0 | 0 | 0 | =MPS(CX_N) |
| SYMBOL | 0 | 1 | 0 | 1 | =SYM_N |
| DATA VALUE | 0 | 1 | 0 | 1 | =D_N |
| | | | | | (=SYM_N xor MPS(CX_N) ) |

(A) 2-LINE MODEL TEMPLATE (B) 3-LINE MODEL TEMPLATE

Fig.45

| ST | LSZ | NLPS | NMPS | SWTCH | ST | LSZ | NLPS | NMPS | SWTCH |
|---|---|---|---|---|---|---|---|---|---|
| 0 | 0x5a1d | 1 | 1 | 1 | 57 | 0x01a4 | 55 | 58 | 0 |
| 1 | 0x2586 | 14 | 2 | 0 | 58 | 0x0160 | 56 | 59 | 0 |
| 2 | 0x1114 | 16 | 3 | 0 | 59 | 0x0125 | 57 | 60 | 0 |
| 3 | 0x080b | 18 | 4 | 0 | 60 | 0x00f6 | 58 | 61 | 0 |
| 4 | 0x03d8 | 20 | 5 | 0 | 61 | 0x00cb | 59 | 62 | 0 |
| 5 | 0x01da | 23 | 6 | 0 | 62 | 0x00ab | 61 | 63 | 0 |
| 6 | 0x00e5 | 25 | 7 | 0 | 63 | 0x008f | 61 | 32 | 0 |
| 7 | 0x006f | 28 | 8 | 0 | 64 | 0x5b12 | 65 | 65 | 1 |
| 8 | 0x0036 | 30 | 9 | 0 | 65 | 0x4d04 | 80 | 66 | 0 |
| 9 | 0x001a | 33 | 10 | 0 | 66 | 0x412c | 81 | 67 | 0 |
| 10 | 0x000d | 35 | 11 | 0 | 67 | 0x37d8 | 82 | 68 | 0 |
| 11 | 0x0006 | 9 | 12 | 0 | 68 | 0x2fe8 | 83 | 69 | 0 |
| 12 | 0x0003 | 10 | 13 | 0 | 69 | 0x293c | 84 | 70 | 0 |
| 13 | 0x0001 | 12 | 13 | 0 | 70 | 0x2379 | 86 | 71 | 0 |
| 14 | 0x5a7f | 15 | 15 | 1 | 71 | 0x1edf | 87 | 72 | 0 |
| 15 | 0x3f25 | 36 | 16 | 0 | 72 | 0x1aa9 | 87 | 73 | 0 |
| 16 | 0x2cf2 | 38 | 17 | 0 | 73 | 0x174e | 72 | 74 | 0 |
| 17 | 0x207c | 39 | 18 | 0 | 74 | 0x1424 | 72 | 75 | 0 |
| 18 | 0x17b9 | 40 | 19 | 0 | 75 | 0x119c | 74 | 76 | 0 |
| 19 | 0x1182 | 42 | 20 | 0 | 76 | 0x0f6b | 74 | 77 | 0 |
| 20 | 0x0cef | 43 | 21 | 0 | 77 | 0x0d51 | 75 | 78 | 0 |
| 21 | 0x09a1 | 45 | 22 | 0 | 78 | 0x0bb6 | 77 | 79 | 0 |
| 22 | 0x072f | 46 | 23 | 0 | 79 | 0x0a40 | 77 | 48 | 0 |
| 23 | 0x055c | 48 | 24 | 0 | 80 | 0x5832 | 80 | 81 | 1 |
| 24 | 0x0406 | 49 | 25 | 0 | 81 | 0x4d1c | 88 | 82 | 0 |
| 25 | 0x0303 | 51 | 26 | 0 | 82 | 0x438e | 89 | 83 | 0 |
| 26 | 0x0240 | 52 | 27 | 0 | 83 | 0x3bdd | 90 | 84 | 0 |
| 27 | 0x01b1 | 54 | 28 | 0 | 84 | 0x34ee | 91 | 85 | 0 |
| 28 | 0x0144 | 56 | 29 | 0 | 85 | 0x2eae | 92 | 86 | 0 |
| 29 | 0x00f5 | 57 | 30 | 0 | 86 | 0x299a | 93 | 87 | 0 |
| 30 | 0x00b7 | 59 | 31 | 0 | 87 | 0x2516 | 86 | 71 | 0 |
| 31 | 0x008a | 60 | 32 | 0 | 88 | 0x5570 | 88 | 89 | 1 |
| 32 | 0x0068 | 62 | 33 | 0 | 89 | 0x4ca9 | 95 | 90 | 0 |
| 33 | 0x004e | 63 | 34 | 0 | 90 | 0x44d9 | 96 | 91 | 0 |
| 34 | 0x003b | 32 | 35 | 0 | 91 | 0x3e22 | 97 | 92 | 0 |
| 35 | 0x002c | 33 | 9 | 0 | 92 | 0x3824 | 99 | 93 | 0 |
| 36 | 0x5ae1 | 37 | 37 | 1 | 93 | 0x32b4 | 99 | 94 | 0 |
| 37 | 0x484c | 64 | 38 | 0 | 94 | 0x2e17 | 93 | 86 | 0 |
| 38 | 0x3a0d | 65 | 39 | 0 | 95 | 0x56a8 | 95 | 96 | 1 |
| 39 | 0x2ef1 | 67 | 40 | 0 | 96 | 0x4f46 | 101 | 97 | 0 |
| 40 | 0x261f | 68 | 41 | 0 | 97 | 0x47e5 | 102 | 98 | 0 |
| 41 | 0x1f33 | 69 | 42 | 0 | 98 | 0x41cf | 103 | 99 | 0 |
| 42 | 0x19a8 | 70 | 43 | 0 | 99 | 0x3c3d | 104 | 100 | 0 |
| 43 | 0x1518 | 72 | 44 | 0 | 100 | 0x375e | 99 | 93 | 0 |
| 44 | 0x1177 | 73 | 45 | 0 | 101 | 0x5231 | 105 | 102 | 0 |
| 45 | 0x0e74 | 74 | 46 | 0 | 102 | 0x4c0f | 106 | 103 | 0 |
| 46 | 0x0bfb | 75 | 47 | 0 | 103 | 0x4639 | 107 | 104 | 0 |
| 47 | 0x09f8 | 77 | 48 | 0 | 104 | 0x415e | 103 | 99 | 0 |
| 48 | 0x0861 | 78 | 49 | 0 | 105 | 0x5627 | 105 | 106 | 1 |
| 49 | 0x0706 | 79 | 50 | 0 | 106 | 0x50e7 | 108 | 107 | 0 |
| 50 | 0x05cd | 48 | 51 | 0 | 107 | 0x4b85 | 109 | 103 | 0 |
| 51 | 0x04de | 50 | 52 | 0 | 108 | 0x5597 | 110 | 109 | 0 |
| 52 | 0x040f | 50 | 53 | 0 | 109 | 0x504f | 111 | 107 | 0 |
| 53 | 0x0363 | 51 | 54 | 0 | 110 | 0x5a10 | 110 | 111 | 1 |
| 54 | 0x02d4 | 52 | 55 | 0 | 111 | 0x5522 | 112 | 109 | 0 |
| 55 | 0x025c | 53 | 56 | 0 | 112 | 0x59eb | 112 | 111 | 1 |
| 56 | 0x01f8 | 54 | 57 | 0 | | | | | |

Fig. 46

ENCODING REGISTER C ~30A

| 0 0 0 | c | b b b b b b b b | s s s | x x x x x x x x x x x x x x x x |
|---|---|---|---|---|
| | Cc → ~35 | Cb ~34 | Cs ~33 | · DECIMAL POINT  Cx ~32 |

DECODING REGISTER C ~30B

| x x x x x x x x | x x x x | b b b b b b b b b | 0 0 0 0 0 0 0 |
|---|---|---|---|
| CHIGH ~38 | (Cx) ~39 | (Cb) ~37 | CLOW ~36 |
| · DECIMAL POINT | | | |

REGION RANGE REGISTER A ~31

| 0 0 0 0 0 0 0 0 | 0 0 0 0 0 0 0 0 | a a a a a a a a a a a a a a a a |
|---|---|---|
| | | · DECIMAL POINT |

```
3    2 2              1 1                                        0
1    4 3              6 5              8 7                       0
MSB                                                            : LSB
```

MULTIPLE QUALITY DATA CREATION ENCODER, MULTIPLE QUALITY DATA CREATION DECODER, MULTIPLE QUANTITY DATA ENCODING DECODING SYSTEM, MULTIPLE QUALITY DATA CREATION ENCODING METHOD, MULTIPLE QUALITY DATA CREATION DECODING METHOD, AND MULTIPLE QUALITY DATA CREATION ENCODING/ DECODING METHOD

TECHNICAL FIELD

The present invention relates to an apparatus and a system for providing receive data of various kinds of quality level from send data mainly because of sender's intention in a sending/receiving apparatus for data including precise image data used for such as a facsimile, the Internet, an image database.

BACKGROUND ART

In the following, related art of the invention will be explained.

FIGS. 35 and 36 are block diagrams showing configurations of conventional encoder and decoder. In an encoder of FIG. 35, data sequence 501 is input to a modeling unit 502A, data value 503 and a parameter (for encoding) 504 are sequentially output, the data value is encoded at an encoding unit 505, and a code sending unit 506 outputs code 507.

In a decoder of FIG. 36, the code 507 is input to a code receiving unit 508, and a decoding unit 509 decodes the data value 503 to be decoded using the parameter (for decoding) 504 sequentially input from a modeling unit 502B and the code 507, and decoded data value 503 is output to the modeling unit 502B to output the data sequence 501.

Here, conventionally, the encoder keeps data contents confidential by switching lines for exchanging bits by a data bit switch, as shown in FIG. 37, by input (point A) of the data sequence 501 shown in FIG. 35, or by encrypting the data with an encryptor as shown in FIG. 38, which encrypts the data using an ExOR with random number generated by a random number generator 561 constructed based on an encryption key 560, at output (point B) of the code 507.

In the conventional decryptor, the encrypted data is decrypted into the origianl code 507 using the ExOR with the same random number with the encoder at input (point B) of the code 507 as shown in FIG. 36, or the data is returned to the original data sequence 501 by exchanging bits at output (point A) of the data sequence 501.

As described above, conventionally, the encoder or the decoder is configured to employ encryption at point A or point B and to reproduce the original data sequence from the encoded data, independent from the encoding (compression) unit or the decoding (uncompression) unit.

With respect to such conventional technique, for example, the Japanese unexamined patent publication No. 8-331395, "Multiple Value Image Sending Apparatus" discloses a case in which the data is integrated by switching bits or using a simple logical conversion of bit value. Further, the Japanese unexamined patent publication No. 7-111646, "Scrambling Apparatus, Descrambling Apparatus, and Signal Processing Apparatus" discloses a case of encryption explained above. Further, the Japanese unexamined patent publication No. 8-181966, "Sending Apparatus, Receiving Apparatus, and Communication Processing System" discloses a case in which the data is encoded by distributing to plural layers and the encoded data is encrypted with various confidential strength. Yet further, the Japanese unexamined patent publication No. 9-205630, "Television Signal Sending/ Receiving Method, and Television Signal Sending/ Receiving Apparatus" discloses a case in which the data is encoded/sent by distributing to plural channels and the reproduction quality of receive data is made different by not reproducing a part of the receive data based on an access right or a kind of right, which the receiver holds.

As one example of conventional encoding method, an encryption employing arithmetic encoding which can obtain high compression ratio will be explained. The most representative encoder/decoder for arithmetic encoding is QM-Coder described in ITU-T, International Standard Recommendation T.82 and T.81. Generally, the arithmetic encoding performs optimization by learning the change of characteristics in order to decrease the reduction of the compression ratio, while the conventional encoding cannot increase the compression ratio since the encoding cannot trace the change of characteristics of the data. In particular, to determine parameters for encoding/decoding, the encoded/decoded data is referred to and the parameter is updated by feeding back the encoded/decoded result. Accordingly, when an error occurs in the decoding process, the decoder cannot generate/select a common parameter with the encoder after that, which generates a fatal error to the decoded data.

The features of the arithmetic encoding is used in some conventional arts such as the Japanese Unexamined Patent Publication No. 5-56267, "Encoding/Decoding Method", in which a dummy bit is added to the top of the arithmetic code generated or at an interval of predetermined bits, the code bit is inverted, or the table value is converted. The Japanese Unexamined patent Publication No. 6-112840, "Encoding/ Decoding Method and Apparatus" discloses a case in which an initial value of a certain effective region that is an arithmetic encoding parameter is changed. Further, the Japanese Unexamined Patent Publication No. 11-073102, "Secret Key Encryption/Decryption Method and Apparatus" discloses a case in which an initial value of the effective region and estimated probability, or assigned region range is changed. The above related arts treat the changed value as an encryption key.

Before concrete explanation of the arithmetic encoding, a concept of the binary value arithmetic encoding will be described referring to FIG. 39. In arithmetic encoding, a coordinate value of binary floating-point number which is equal to or greater than 0.0 and less than 1.0 on the number line becomes a code. In the encoding process, the above range on the number line is assumed as the effective region and is divided based on the occurrence probability of the binary symbol, and a partial region corresponding to a symbol which actually occurs is treated as a new effective region and the above division will be repeated. MPS (ore Probable Symbol) means that a data value having more occurrence probability occurs, while LPS (Less Probable Symbol) means that a data value having less occurrence probability occurs. One coordinate value within the effective region updated by the final symbol is output as a code. During the encoding process, the code is operated as a lower limit value of the effective region, and updated as well as the effective region which is a difference between an upper limit value and the lower limit value within the figure. The code can be a coordinate value having the smallest number of effective digits after truncating 0s consecutively appeared to the last digit of the coordinate value. At this time, the code bit which is lacked at decoding can be compensated with truncated 0. Or the code bit which is truncated at encoding and compensated at decoding can be 1 if the values of manipulating bit are coincided between the encoding unit and the decoding unit.

The binary value arithmetic encoding and decoding will be explained referring to FIG. 40. In the figure, decimals on the number line show binary coordinate, the symbol 0 means MPS, and the symbol 1 means LPS. In encoding process, when an initial value of an interval A is set to 1.000, an initial value of a code C is set to 0.000, and a binary value sequence is DN=0101, the encoding will proceed as follows. The first binary data 0 matches the prediction value 0, and the symbol 0 (MPS) will be issued as "prediction match". Then, the interval is updated by the interval A0. To facilitate the explanation, the context is a data value which occurred previously to the current value, the corresponding region to the symbol is equally divided (generally, it is divided by ratio of the occurrence probability), and the LPS interval Al is placed at upper to the MPS interval A0. The context (the initial value) corresponding to the first binary data, which does not have the previous data value, is set to 0, the prediction value (the initial value) corresponding to the context 0, 1 are both set to 0, and the first reference is shown by a frame in the figure. Next, the second binary data 1 has the context of value 0 of the previous (first) data, which shows the prediction value 0. The second binary data 1 does not match the prediction value 0, so that a symbol 1 (LPS) is issued as "mismatch". The region range is updated by the interval A1. At this time, the interval A0 is added to the code C to update the lower limit value so as to be the lower limit value of the effective region. Similarly, the third, the fourth binary data are processed, and the lower limit value C=0.0101000 of the final effective region becomes a code value.

In case of decoding, the initial value of the region range A is set to 1.000, the initial value of the code C is set to the above binary decimal 0.0101000, the initial values of the context and the prediction value are set to the same values with the encoding process, and then the decoding process starts. On decoding the first binary data, the prediction value 0 is obtained corresponding to the context 0 as well as the encoding process. As the code C is included in the lower partial region A0, the corresponding symbol 0 (MPS) is decoded. Namely, as the first binary data does not match the prediction value, the prediction value 0 is decoded as the binary data value 0. The second binary data 1 has the context of the data value 0 of the previous (first) data, so that the prediction value 0 is obtained. As the code C is included in the upper partial region A1, the corresponding symbol is 1 (LPS). Namely, the second data does not match the prediction value, so that a non-prediction value (1−prediction value 0) is decoded as the binary data value 1. At this time, since the code C is updated as a displacement from the lower limit value of the effective region, and the partial region range A0 is subtracted from the code C. Similarly, the third, the fourth binary data values are processed, the binary data values 0, 1 are decoded, and it can be seen that the encoded binary data are correctly decoded.

On practical implementation of the arithmetic encoding, subtraction arithmetic encoding, which corresponds to the increase of number of effective digits in the encoding operation, is generally used. Hereinafter, the arithmetic code means the subtraction arithmetic code, and QM-Coder is also categorized in the subtraction arithmetic code. FIG. 41 shows a concept of the subtraction arithmetic encoding and a renormalization. Here, when the effective region becomes less than ½ (0.100), the region is multiplied by power of 2, and the region is extended to greater than ½ (0.100), which is called the renormalization. Through this operation, the number of digits of the binary floating-point number at computing time is kept fixed. At this time, the code value of the integer part cannot be determined because the bits of the integer part of consecutive 1s from the decimal and the upper 0 may be changed by a carry-over generated by the coordinate computation afterwards. The bits which are located at the upper digits to the above 1s and 0 are not influenced by the carry-over, so that the bits can be output.

The QM-Coder can be implemented by tables and processing flows disclosed in International Standard Recommendation T.82 of ITU-T. In the following, standard operations of encoding and decoding defined by the above document will be explained, in which data to be encoded is binary image data.

FIGS. 42 and 43 are block diagrams showing configurations of an encoder and a decoder of QM-Coder. In the explanation of this conventional art, an image memories 5A and 5B are placed inside the encoder and the decoder.

The image memory 5A of a QM encoder LA accumulates an input image 6, generates a context (10 bits, total number 1024) which is a reference pattern of encoded adjacent 10 pixels indicated by Model Template for Pixel to be encoded, and outputs the pixel to be encoded.

The image memory 5B of a QM decoder 1B accumulates decoded pixels, generates the context for the pixels to be decoded, outputs the context, obtains and accumulates the pixels decoded using the context, and outputs the image 6.

In the image memories 5A and 5B, standard model templates of two lines and three lines, respectively shown in FIG. 44, and either of them is selected at starting time of encoding/decoding. Information showing which template is used is notified by a header of code data, and the same template is used by the encoder and the decoder.

In the QM-Coder, the prediction matching probability of the pixel value is estimated for each context of the pixels to be encoded/decoded, and encoding/decoding is performed by learning according to the variation of the prediction matching probability. Learning is done by rewriting two variable tables having the context as an index. One of the variable tables is an MPS table 7 of 1 bit which stores the pixel value MPS having higher occurrence probability as the prediction value. The other is an ST table 8 of 7 bits which stores a state number (0–112) obtained by specifying a ratio of the prediction matching probability of the prediction value into 113 states.

As well as the variable tables, a constant table probability estimation table) is provided, which is used for referring the state number (state) as an index on encoding/decoding. Set values of the table is shown in FIG. 45.

The four constant tables are an LSZ table 9 storing LSZ value which shows an LPS region range by 16 bits, an NMPS table 10 showing a next state of MPS transition by 7 bits, an NLPS table 11 showing a next state of LPS transition by 7 bits, and an SWTCH table 12 showing an inversion of prediction value based on the result by one bit. (These names expressed by capital alphabet letters for variable and constant tables will be used as array names in processing flow explained below.)

The LSZ table 9 is referred to by an operating unit of an arithmetic encoder 13A/an arithmetic decoder 13B and is not directly related to learning of adaptive prediction. In the arithmetic encoder 13A/the arithmetic decoder 13B, a calculation is operated using the LSZ value of the LSZ table 9, and when an operation precision is reduced, the operation is renormalized. When the renormalization occurs, learning is implemented at the same time.

If the encoding/decoding symbol 14 is MPS when the renormalization occurs, the NMPS value is written in the ST table 8, the NLPS value is written if the encoding/decoding symbol 14 is LPS. The state transition is thus performed. The MPS shows that the pixel to be encoded/decoded 3 match the prediction value MPS7, and the LPS shows mismatch. On encoding, a pixel-to-symbol converter 15A outputs a symbol 14 to the arithmetic encoder 13A, and on decoding, the arithmetic decoder 13B outputs the symbol 14 to a symbol-to-pixel converter 15B. The arithmetic encoder 13A and the arithmetic decoder 13B inform of the renormalization and the symbol to an updaters 16 and 17, and only the prediction value 7 and the value of state 8 indicated by the context for the pixel are updated.

When the renormalization is performed because of the LPS and the prediction matching probability is½, the MPS value 7 is inverted (operation "1−MPS") and the inverted value based on the result is written in the MPS table 7. It is detected whether the prediction matching probability is ½ or not using the SWTCH value 12 as a flag.

In this way, updating processes are respectively performed to the two variable tables ST 8 and MPS 7, and the tables have to be managed respectively. In FIGS. 42 and 43, the updaters 17 and 16 determine the update values for the table ST 8 and MPS 7, rewrite the values of the tables, and thus the update process has been performed.

The image 6 and the code 4 in FIGS. 42 and 43 correspond to the data sequence 501 and the code 507 in FIGS. 35 and 36, respectively. The context 2, the image 3, and the image memories 5A and 5B in FIGS. 42 and 43 correspond to the parameter 504, the data value 503, and the modeling units 502A and 502B in FIGS. 35 and 36, respectively. Further, the state table 8 and the prediction table 7 through the arithmetic encoder 13A and the arithmetic decoder 13B correspond to the encoding unit and the decoding unit in FIGS. 35 and 36, respectively. Yet further, input/output parts of the arithmetic encoder 13A and the arithmetic decoder 13B in FIGS. 42 and 43 correspond to the code transmitting unit 506 and the code receiving unit 508 in FIGS. 35 and 36, respectively.

Before an explanation of the encoding processing flow and the decoding processing flow, bit assignments of an encoding register C30A, a decoding register C30B, and a region range register A31 are shown in FIG. 46.

In the encoding register C30A, a decimal point is placed between bit 15 and bit 16, and "x" (16 bits) shows an operation unit Cx32 for the LSZ 9. If the operation results in carry-over, the bits of "x" is propagated to the high order bit. "s" (3 bits) shows a spacer bit unit Cs33, "b" (8 bits) shows a byte output unit Cb (Cb register) 34, and "c" (1 bit) shows a carry detector Cc35. In the encoding process, the value of the C register is updated to the lower limit value of the range corresponding to the encoded symbol as the code 4.

In the decoding register C30B, a low-order word CLOW 36 and a high-order word CHIGH 38 can be embodied by the registers of 32 bits. A decimal is set at position upper to the bit 31, which is MSB (Most Significant Bit). "b" (8 bits) is a high-order byte Cb37 of the byte inputting part (CLOW register 36), and "x" (16 bits) shows an operation unit Cx (CHIGH register 38) 39 corresponding to the LSZ 9. In the decoding process, the value of the C register is updated to an offset value of the code 4, which is coordinate of the region, from the lower limit value of the region corresponding to the decoded symbol.

The region range register A 31 is commonly used for the encoding and decoding processes. A decimal is set corresponding to the decimal of the encoding/decoding registers 30A and 30B, and "a" (16 bits) is placed as decimal part corresponding to the register part "x". At initial state, the integer part (bit 16) becomes "1". The region range (also called as "region size") is updated to A—LSZ (lower partial region range) or LSZ (upper partial region range). The region range register A31 is renormalized so that bit 15 showing weight of ½ becomes "1" except the initial value (the integer part="1"). It is guaranteed that the lower partial region is obtained even if any LSZ 9 is selected as the upper partial region range by keeping the weigh more than ½. In the renormalization, the A register 31 and the C register 30A or 30B are extended simultaneously.

In the QM-Coder, the upper partial region LSZ 9, which is fixed size for any state, is usually assigned to the LPS. When the lower partial region becomes smaller than the upper partial region, the upper partial region is assigned to the MPS by "conditional MPSILPS exchange". On encoding/decoding the LPS, or encoding/decoding MPS by applying "conditional MPS/LPS exchange", renormalization is always implemented.

The encoding/decoding processing flow will be explained according to the bit arrangement of the register. In the processing flow, a term "layer (of the resolution)" in case of hierarchical encoding and "stripe" means "stripe" of the image divided by N line unit (only the last stripe may have lines equal to or less than N lines). Here, it is assumed that the number of layers is 1, however, this encodingidecoding process can be applied to plural layers.

The following auxiliary variables CT 50, BUFFER 51, SC 52, and TEMP 53 are used for explaining the encoding/decoding process as well as variables, tables, and registers described above in the explanation of FIGS. 42, 43 and 46. The auxiliary variable CT 50 counts the number of shifts by the renormalizaion implemented in the C registers 30A, 30B and the A register 31. When the value becomes "0", the CT 50 is used for inputting/outputting byte of a next code. The auxiliary variable BUFFER 51 stores byte value of the code supplied from the C register 30A and stores byte value of the code input to the C register 30B. The SC 52 is used only for encoding, and counts the number byte value of 0xFF continuously occur in the code output from the C register 30A. The TEMP 53 is used only for encoding, and detects the carry-over to the BUFFER 51, obtains the low order 8 bits of the carry-over number as a new value of the BUFFER 51. The BUFFER 51 is set by the C register 30A through the TEMP 53. The BUFFER 51 never becomes 0xff without the carry-over. In case of the carry-over to the high order bits, the bits, the order of which is lower than the BUFFER 51, namely, the BUFFER 51 and SC 52 number of 0xff, may be changed. Accordingly, the code output from the C register 30A cannot be determined as the code 4.

FIG. 47 is a flowchart showing a general encoding process of the ENCODER. Among processing flows of the International Standard Recommendation T.82, prediction process for TP (Typical Prediction) and DP (Deterministic Prediction) are not directly related to the present invention nor the conventional art, thus an explanation for TP and DP is omitted. First, at step S101, INITENC is called to perform initialization of encoding process. At step S102, a pair of the pixel PIX and the context CX is read one by one to be encoded by the ENCODE process at step S103. At step S104, S102 and S103 are repeated until the stripe (or image) is finished to be supplied. Finally, FLUSH is called at step S105 to perform termination process.

FIG. 48 is a flowchart showing ENCODE processing flow. In this flow, a process to be called is switched based on match or mismatch between the encoding pixel value 3 and the prediction value 7. At step S111, match or mismatch between the pixel value 3 and the prediction value 7 is detected. When match is detected, the encoder encodes MPS, and when mismatch is detected, the encoder encodes LPS. At step S113, CODEMPS is called to encode the MPS, and at step S112, CODELPS is called to encode the LPS.

FIG. 49 is a flowchart showing CODELPS processing flow. The CODELPS is called for encoding the LPS, namely, the mismatch is detected between the encoding pixel value 3 and the prediction value 7. At step S121, the value of the A register 31 is temporarily updated to the lower partial region range. If step S122 results in "Yes", conditional MPSILPS exchange is applied. Namely, the value of the A register 31 is unchanged to encode the lower partial region and the C register 30A is not updated. If step S122 results in "No", the upper partial region is encoded. That is, at step S123, the C register 30A showing the lower limit value is updated and at step S124, the A register 31 showing the region range is updated. When the constant SWTCH value 12 equals "1" at step S125, the prediction value (MPS table) is inverted or updated at step S126. In LPS encoding, the state transition referring to the NLPS table 11 is performed at step S127. At step S128, renormalization is implemented by calling RENORME.

FIG. 50 is a flowchart showing CODEMPS processing flow. The CODEMPS is called for encoding MPS, that is, the encoding pixel value 3 matches to the prediction value 7. First, at step S131, the value of the A register 31 is temporarily updated to the lower partial region range. If step S132 results in "No", the CODEMPS process terminates with this step. If step S132 results in "Yes", the state transition is always implemented referring to the NMPS table 10 at step S136. And at step S137, the renormalization is implemented by calling RENORME. Before steps S136 and 137, if step S133 results in "Yes", the A register 31 does not change for encoding the lower partial region and the C register 30A is not updated. If step S133 results in "No", the conditional MPS/LPS exchange is applied and the upper partial region is encoded. At step S134, the C register 30A is updated and the A register 31 is updated at step S136.

FIG. 51 shows RENORME processing flow for implementing the renormalization. To shift the value of the A register 31 and the C register 30A to higher order by 1 bit respectively at steps S141 and S142 means to perform an operation equal to the multiplication by 2. At step S143, 1 is subtracted from the variable CT 50 and at step S144, it is checked whether the variable CT 50 is "0" or not. If step S144 results in "Yes", BYTEOUT process is called at step S145 and the C register 30A outputs the code 4 of one byte. At step S146, completion of the renormalization is detected. If the value of the A register 31 is less than 0x8000, steps S141 through S145 are repeated. If the value of the A register 31 is equal to or more than 0x8000, the region becomes equal to or greater than ½, and the renormalization process is completed.

FIG. 52 shows BYTEOUT processing flow for outputting the code 4 byte by byte from the C register 30A. A byte output section Cb 34 of the C register 30A shows a part to be output. The carry detector Cc 35 operates at the same time for detecting carry-over. At step S151, 9 bits of the sum of the Cb register 34 and the Cc register 35 are set to the variable TEMP 53. The byte output is processed by three ways based on the check at steps S152 and S159. Namely, a case where the carry-over has occurred at step S152 (TEMP>0x100; Cc=1), a case where the carry-over has not occurred and TEMP=0xFF, and a case where the carry-over has not occurred and TEMP<0xFF. If step S152 results in "Yes", at step S153, the code already output from the C register 30A and stored as the BUFFER 51 and carry-over value 1 is determined as a code. At step S154, SC 52 number of byte value 0 (stacked 0xFF has been converted into 0x00 by the carry-over) is written and "SC+1" bytes of the code value with carry-over is determined. At step S155, the variable SC 52 is set to "0" and at step S156, the low order 8 bits of the variable TEMP are set to the variable BUFFER 51. At step S157, the Cc register 35 and the Cb register 34, which are processed as variable TEMP 53, are cleared. At step S158, "8" is set to the variable CT 50 for processing 8 bits until a next byte is output. If step S159 results in "Yes", the code 4 cannot be determined and the variable SC 52 is incremented by "1" to accumulate 0xFF. If step S159 results in "No", the code 4 already output from the C register 30A is written as the value of the BUFFER 51 at step S153. At step S154, SC 52 number of byte value 0xFF are written and the code value of "SC+1" bytes is determined as the code value. At step S163, the variable SC 52 is set to "0" and at step S164, the variable TEMP 53 (8 bits, without carry-over) is set to the variable BUFFER 51.

FIG. 53 shows INITENC processing flow for setting the initial values of the ST table 8, the MPS table 7 and each variable at starting time of the encoding. In the figure, at step S171, "the first stripe of this layer" means "starting time of encoding an image" when the image does not include a concept of layer or stripe. In case of an image consisting of a plurality of stripes, processing can be continued without initializing the variable tables for each stripe. At step S171, it is checked if this is the first stripe of the pixel of this layer or forced reset of the tables. If step S171 results in "Yes", the ST table 8 and the MPS table 7, which are the variable tables for all the contexts CX 2, are initialized at step S172. The SC 52, the A register 31, the C register 30A and the variable CT 50 are initialized at steps S173, S174, S175 and S176, respectively. The initial value 11 of the CT 50 is the sum of the number of bits of the Cb register 34 and the number of bits of the Cs register 33. After processing 11 bits, the first code is output. If step S171 results in "No", the table values at the end of the previous stripe of the same layer are set to the variable tables at step S177 instead of the initialization, and the value of the table of the end of the previous stripe on the same layer.

FIG. 54 shows FLUSH processing flow for implementing termination process including sweeping out the remaining value in the C register 30A. At step S181, CLEARBITS is called to minimize the number of effective bits of the code remaining in the C register 30A. At step S182, FINAL-WRITES is called to finally output the variable BUFFER 51, SC 52 and the code 4, which has been undetermined and is now determined, of the C register 30A. At step S183, the first byte of the code 4 is removed because the variable BUFFER 51 is output (as integer part of the code) prior to the value output from the C register 30A. At step S184, the consecutive bytes "0x00" at the end of the code 4 can be removed, if desired, because the code 4 is decimal coordinates within the final effective range.

FIG. 55 shows CLEARBITS processing flow for minimizing the number of effective bits of the code 4 at the end of encoding. By this process, the code 4 is determined to be the value that ends with the greatest possible number of "0x00". At step S191, the variable TEMP 53 is set to the value obtained by clearing the low-order two bytes (Cx register 32) of the upper limit value of the final effective range. At step S192, it is checked if the value obtained by clearing the low-order two bytes of the upper limit value is larger than the value of the C register 30A. If step S192 results in "Yes", overcleared 1 bit (0x8000) is returned to the variable TEMP 53 at step S193 and the value of the C register 30A is set to the value after returning the overcleared bit. If step S192 results in "No", the value of the variable TEMP 53 is set in the C register 30A.

FIG. 56 shows FINALWRITES processing flow for writing the code determined at the end of encoding including remaining value in the C register 30A. At step S201, the C register is shifted by the number of bits shown by the values of the variable CT 50 to enable to output the code and to detect the carry-over. At step S202, it is checked if the carry-over has occurred or not. If step S202 results in "Yes", the carry-over has occurred and if "No", the carry-over has not occurred. As well as in the BYTEOUT processing flow, the code 4 of "SC+1" bytes is determined by writing the code value already output from the C register at steps S203 and S204 for the code value with the carry-over or at steps S207 and S208 for the code value without the carry-over. At step S205, the register Cb value (1 byte), and at step S206, the low-order 1 byte of the register Cb is output, respectively, and the coding is finished.

FIG. 57 shows DECODER processing flow illustrating a whole decoding process. As well as FIG. 47 of the encoding process, among processing flows of the International Standard Recommendation T.82, processes for TP (Typical Prediction) and DP (Deterministic Prediction) are not directly related to the present invention nor the conventional arts (the first and the second related arts), thus an explanation is omitted. First, at step S211, INITDEC is called to initialize the decoding process. At step S212, the contexts CX 2 is read one by one. At step S213, the pixel PIX 3 is decoded by the process DECODE. At step S214, steps S212 and S213 will be repeated until the stripe (or the image) is finished to be supplied. Further, at step S214, decoding process is finished after there is no remaining stripe.

FIG. 58 shows DECODE processing flow for decoding the decoding pixel. First, at step S221, the value of the A register 31 is temporarily updated by the lower partial region range. If step S222 results in "Yes", the lower partial region is decoded. If step S223 results in "Yes", MPS_EXCHANGE is called at step S224 and RENORMD is called at step S225 to implement the renormalization. If step S223 results in "No", the MPS is decoded without implementing the renormalization, and the prediction value 7 is taken as the pixel value 3. If step S222 results in "No", the upper partial region is decoded. LPS_EXCHANGE is called at step S227 and RENORMD is called at step S228 to implement the renormalization. In the path for calling MPS_EXCHANGE and LPS_EXCHANGE, even if the decoding region is determined, it is impossible to know which should be decoded between MPS and LPS without detecting which region is larger, MPS or LPS. Accordingly, each pixel value 3 is determined by the called processing flow.

FIG. 59 shows LPS_EXCHANGE processing flow for decoding the upper partial region. If step S231 results in "Yes", the MPS is decoded. At step S232, the C register 30B is updated and the A register 31 is updated at step S233. At step S234, the prediction value 7 is determined as the pixel value 3 without any change. At step S235, a state is moved to a next state by referring to the NMPS table 10. If step S231 results in "No", the LPS is decoded. At step S236, the C register 30B is updated and the A register 31 is updated at step S237. At step S238, non-prediction value "1−prediction value" is determined as the pixel value 3. If step S239 results in "Yes", the prediction value (MPS table) 7 is inverted or updated at step S240. At step S241, a state is moved to a next state by referring to the NLPS table 11.

FIG. 60 shows MPS_EXCHANGE processing flow for decoding the lower partial region. If step S251 results in "Yes", the LPS is decoded. At step S252, non-prediction value is determined as the pixel value 3. If step S253 results in "Yes", the prediction value (MPS table) is inverted or updated at step S254. At step S265, a state is moved to a next state by referring to the NLPS table 11. If step S251 results in "No", the MPS is decoded. At step S256, the prediction value 7 is determined as the pixel value 3 without any change. At step S257, a state is moved to a next state by referring to the NMPS table 10.

FIG. 61 shows RENORMD processing flow for implementing renormalization. At step S261, it is checked whether the value of the variable CT 50 is 0 or not. If step S261 results in "Yes", BYTEIN is called so as to input the code 4 of one byte into the C register 30B at step S262. At step S263, the A register 32 is shifted to higher-order by 1 bit and the C register 30B is shifted to higher-order by 1 bit at step S264. This shifting operation equals to duplication. At step S266, 1 is subtracted from the variable CT 50. At step S266, it is checked whether the renormalization is completed, that is, the value of the A register 31 is less than 0x8000, or not. If the value of the A register 32 is less than 0x8000, steps S261 through S265 are repeated. At step S267, it is checked whether the value of the variable CT 50 is 0 or not. If step S267 results in "Yes", BYTEIN is called so as to input the code of one byte into the C register 30B.

FIG. 62 shows BYTEIN processing flow for reading the code 4 into the C register 30B byte by byte. In the figure, "SCD" (Stripe Coded Data) is the code 4 for stripe. If step S271 results in "Yes", no code 4 is to be read at step S272, and the variable BUFFER 51 is set to "0". At step S273, the value of the variable BUFFER 51 is read into the CLOW register 36 (Cb 37), and at step S274, the variable CT 50 is set to "8" for processing the code of 8 bits until a next code is input. If step S271 results in "No", the code 4 of one byte is read from the "SCD" into the variable BUFFER 51 at step S275.

FIG. 63 shows INITDEC processing flow for setting initial values of the ST table 8, the MPS table 7 and each variable at starting time of the decoding. Initialization of the table values of steps S281, S282 and S290 are the same as ones of steps S171, S172 and S177 of INITENC processing flow in the encoding process. The initial value of the C register 30B is set by inserting 3 bytes of the code 4 into the Cx register 39 and the Cb register 37. At step S283, the C register 30B is cleared, and at step S284, BYTEIN is called so as to insert 1 byte of the code 4 into the Cb register 37. At step S285, the C register 30B is shifted by 8 bits, and at step S286, BYTEIN is called so as to insert 1 byte of the code 4 into the Cb register 37. At step S287, the C register 30B is shifted by 8 bits, and at step S288, BYTEIN is called so as to insert 1 byte of the code 4 into the Cb register 37. By these steps, the sum of 3 bytes of the code 4 is set in the Cx register 39 and the Cb register 37. The initial value of the A register 31 is set at step S289.

According to the conventional method for controlling reproduction quality of data, it is required for an encoding side or a sender side to prepare data used for each corresponding level in order to provide various quality levels of reproduced data contents to a user, which needs a large amount of storage capacity.

On the other hand, it is required for the user of the data contents to perform receiving operation plural times in order to previously confirm an outline of the data and subsequently receive the whole data.

Further, since a reproduction quality of the decoded data of a conventional code for the data contents is always at a fixed level, a copyright of the data contents cannot be protected.

Further, an encryption of the data is performed to promote a proper access to the data, however, this encryption process requires further processing load and processing time because the encryption is performed independently from the encoding operation. In particular, in case of a configuration in which parallel processing cannot be done such as S/W and thus requires sequential processing, which causes the circuit scale to increase and requires more processing time.

The present invention is provided to solve the above problems. The invention provides a system in which the encoding side or the sender side can supply uniformed information to the user only by sending one code data, and the receiving user of the decoding side can decode the data contents having various levels of reproduction quality by applying change information which is previously stored from the same code data.

Further, it is possible to allow only a proper user to access proper information by limiting the reproduction quality or by making the reproduction impossible.

Yet further, in case of encoding, simulated encryption is performed, so that encoding and encryption, decryption and decoding do not become independent processes, which reduces the processing load and processing time.

DISCLOSURE OF THE INVENTION

According to the present invention, an encoder for generating multiple quality data having a modeling unit for modeling input data sequence to obtain a data value and a parameter, an encoding unit for encoding an output from the modeling unit, and a code sending unit for sending an output from the encoding unit, the encoder includes:

a) a setting changing unit for instructing to change one of the data value and the parameter based on change information; and at least one of following b-1) and b-2):

b-1) a data manipulating unit for manipulating either of the data value or the parameter output from the modeling unit to output to the encoding unit based on the change information instructed by the setting changing unit; and b-2) a code manipulating unit for obtaining encoded result by instructing the encoding unit to perform predetermined change or manipulating sending code output sent by the code sending unit based on the change information instructed by the change setting unit.

The encoder for generating multiple quality data further includes an evaluating unit for evaluating sending output which has been changed based on the change information, and the encoder sets the change information again based on an evaluation result of the evaluating unit.

Further, the setting changing unit instructs to insert/delete a specific bit as the change information, and the data manipulating unit or the code manipulating unit correspondingly manipulates data based on the change information of inserting/deleting the specific bit.

Further, the setting changing unit instructs to change an initial value of context or a prediction value of the context as the change information, and the data manipulating unit or the code manipulating unit correspondingly manipulates data based on above change information.

Further, the setting changing unit instructs to add/delete a certain bit to/from encoding parameter on encoding, and the code manipulating unit correspondingly changes a value of an operation register for encoding performed by the encoding unit.

Further, the code manipulating unit performs one of the following: to change variable/constant tables in the encoding unit; to change a value of a register/a counter; and to change a coding rule.

The encoding unit for generating multiple quality data further includes a construction unit dividing unit for dividing the input data sequence into a predetermined data construction unit and outputting to the modeling unit, and the changing setting unit, the data manipulating unit, and the code manipulating unit performs operations by each data construction unit divided.

Further, the change information specifies a location of a setting storage area in which actual change information is previously stored, and the data manipulating unit manipulates the change on modeling or the code manipulating unit manipulates the change on encoding based on the actual change information stored in the setting storage area.

According to the invention, a decoder for generating multiple quality data having a code receiving unit for receiving input code sequence, a decoding unit for decoding the input code sequence received, and a modeling unit for obtaining data sequence from data value decoded and a self-generated parameter, the decoder includes:

a) a setting changing unit for setting change information instructing to change one of a data value and a parameter sent by an encoder; and at least one of following b-1) and b-2):

b-1) a code manipulating unit for manipulating the code sequence received based on the change information instructed by the setting changing unit to output to the code receiving unit or for obtaining a result decoded by the decoding unit which has been manipulated by instructing a predetermined change; and b-2) a data manipulating unit for obtaining a predetermined data sequence by instructing manipulation to the modeling unit to change the data value or the self-generated parameter output by the decoding unit based on the change information set by the setting changing unit.

Further, the setting changing unit sets inserting/deleting a specific bit as the change information, and the data manipulating unit or the code manipulating unit correspondingly performs process based on the inserting/deleting.

Further, the setting changing unit sets to change an initial value of context or a prediction value of the context as the change information, and the data manipulating unit or the code manipulating unit correspondingly performs changing process based on an instruction.

Further, the setting changing unit instructs to add/delete a certain bit to/from the parameter decoded as the change information, and the code manipulating unit correspondingly changes a value of an operation register for decoding performed by the decoding unit.

Further, the code manipulating unit performs one of the following: to change variable/constant tables in the decoding unit; to change a value of a register/a counter; and to change a coding rule.

The decoding unit for generating multiple quality data further includes a construction unit assembling unit for obtaining a normal data sequence from a predetermined data construction unit divided from the data sequence, and the construction unit assembling unit performs decoding and modeling for each of the predetermined data construction unit based on the change information set by the setting changing unit.

Further, the change information specifies a location of a setting storage area in which actual change information is previously stored, and the data manipulating unit manipulates the change on modeling or the code manipulating unit manipulates the change on decoding based on the actual change information stored in the setting storage area.

According to the invention, an encoding/decoding system for generating multiple quality data having a first modeling unit for modeling input data sequence to obtain a first data value and a first parameter, an encoding unit for encoding an output from the first modeling unit, and a code sending unit for sending an output from the encoding unit as a code sequence, a code receiving unit for receiving the code sequence, a decoding unit for decoding an output of the code receiving unit, and a second modeling unit for obtaining a second data sequence from a second data value decoded and a second self-generated parameter, the encoding/decoding system includes:
  an encoder having:
    a) a first setting changing unit for instructing to change one of the first data value and the first parameter based on change information; and
    b) at least one of a first data manipulating unit for manipulating either of the first data value or the first parameter output from the first modeling unit to output to the encoding unit based on the change information instructed by the first setting changing unit, and a first code manipulating unit for obtaining encoded result by instructing the encoding unit to perform predetermined change or manipulating sending code output sent by the code sending unit based on the change information instructed by the first changing setting unit; and
  a decoder having:
    c) a second setting changing unit for setting change information instructing to change one of a data value and a parameter sent by an encoder side; and
    d) at least one of a second code manipulating unit for manipulating the code sequence received based on the change information instructed by the second setting changing unit to output to the code receiving unit or for obtaining a result decoded by the decoding unit which has been manipulated by instructing a predetermined change, and a second data manipulating unit for obtaining a predetermined data sequence by instructing manipulation to the second modeling unit to change a second data value or second self-generated parameter output by the decoding unit based on the change information set by the second setting changing unit.

Further, the change information is sent to a decoder side after a predetermined procedure is completed.

According to the invention, an encoding method for generating multiple quality data having a modeling step for modeling input data sequence to obtain a data value and a parameter, an encoding step for encoding an output from the modeling step, and a code sending step for sending an output from the encoding step, the encoding method includes:

a) a setting changing step for instructing to change one of the data value and the parameter based on change information; and
    at least one of following b-1) and b-2):
  b-1) a data manipulating step for manipulating either of the data value or the parameter output from the modeling step to output before the encoding step based on the change information instructed by the setting changing step; and
  b-2) a code manipulating step for obtaining encoded result by instructing the encoding step to perform predetermined change or manipulating sending code output sent by the code sending step based on the change information instructed by the change setting step.

According to the invention, a decoding method for generating multiple quality data having a code receiving step for receiving input code sequence, a decoding step for decoding the input code sequence received, and a modeling step for obtaining data sequence from data value decoded and a self-generated parameter, the decoding method includes:

a) a setting changing step for setting change information instructing to change one of a data value and a parameter sent by an encoder; and
    at least one of following b-1) and b-2):
  b-1) a code manipulating step for manipulating the input code sequence received based on the change information instructed by the setting changing step to output to the code receiving step or for obtaining a result decoded by the decoding step which has been manipulated by instructing a predetermined change; and
  b-2) a data manipulating step for obtaining a predetermined data sequence by instructing manipulation to the modeling step to change the data value or the self-generated parameter output by the decoding step based on the change information set by the setting changing step.

According to the invention, an encoding/decoding method for generating multiple quality data having a first modeling step for modeling input data sequence to obtain a first data value and a first parameter, an encoding step for encoding an output from the first modeling step, and a code sending step for sending an output from the encoding step as a code sequence, a code receiving step for receiving the code sequence, a decoding step for decoding an output of the code receiving step, and a second modeling step for obtaining a second data sequence from a second data value decoded and a second self-generated parameter, the encoding/decoding method includes:
  a) a first setting changing step for instructing to change one of the first data value and the first parameter based on change information; and
  b) at least one of a first data manipulating step for manipulating either of the first data value or the first parameter output from the first modeling step to output to the encoding step based on the change information instructed by the first setting changing step, and a first code manipulating step for obtaining encoded result by instructing the encoding step to perform predetermined change or manipulating sending code output sent by the code sending step based on the change information instructed by the first changing setting step;
  c) a second setting changing step for setting change information instructing to change one of a data value and a parameter sent by an encoder side; and d) at least one of a second code manipulating step for manipulating the code sequence received based on the change information instructed by the second setting changing step to output to the code receiving step or for obtaining a result decoded by the decoding step which has been manipulated by instructing a predetermined change, and a second data manipulating step for obtaining a predetermined data sequence by instructing manipulation to the second modeling step to change a second data value or a second self-generated parameter output by the decoding step based on the change information set by the second setting changing step.

BRIEF DESCRIPTION OF THE DRAWINGS

FIG. 12 explains an example case in which an initial value of context is changed according to the first embodiment.

FIG. 13 explains an example case in which a value of an operation register is changed according to the first embodiment.

FIG. 28 explains a conversion into gray-code according to the second embodiment.

FIG. 31 shows an example of encoding/decoding constructed by two bit planes according to the second embodiment.

FIG. 36 shows a configuration of a conventional decoder.

FIG. 40 explains arithmetic encoding and decoding using binary arithmetic code.

FIG. 45 show a constant table for referring state numbers as an index on encoding/decoding.

FIG. 46 shows bit assignment of an encoding register, a decoding register and a region range register.

BEST MODE FOR CARRYING OUT THE INVENTION

Embodiment 1

Generally, in an encoder/a decoder, the data reproduction is guaranteed by a combination of the encoder for compressing data and the decoder for uncompressing the compressed data. In the encoding according to the International Standard encoding as described in the related art or the encoding which is recognized as an industrial standard, the data reproduction is implemented using a predetermined method. A facsimile machine is a typical example of these devices connected by mutual communication.

According to the recent development of the infrastructure, it becomes easy to download electronic data, either compressed using the above standard encoding method or not compressed, using computer system such as through the Internet which has been widely spread. Further, storage medium available as a supplement of books/magazines or direct mails stores various kinds of data. However, the contents of such data has a copyright, so that it is desired to protect the data by compressing and encrypting and to be accessed by only an authorized user. On the other hand, to perform encoding process for compression and encrypting process separately should increase installation scale and execution time, which causes a problem.

FIGS. 1 through 4 are block diagrams showing configurations of an encoder and a decoder, respectively, according to the embodiment of the invention.

Figure 1:
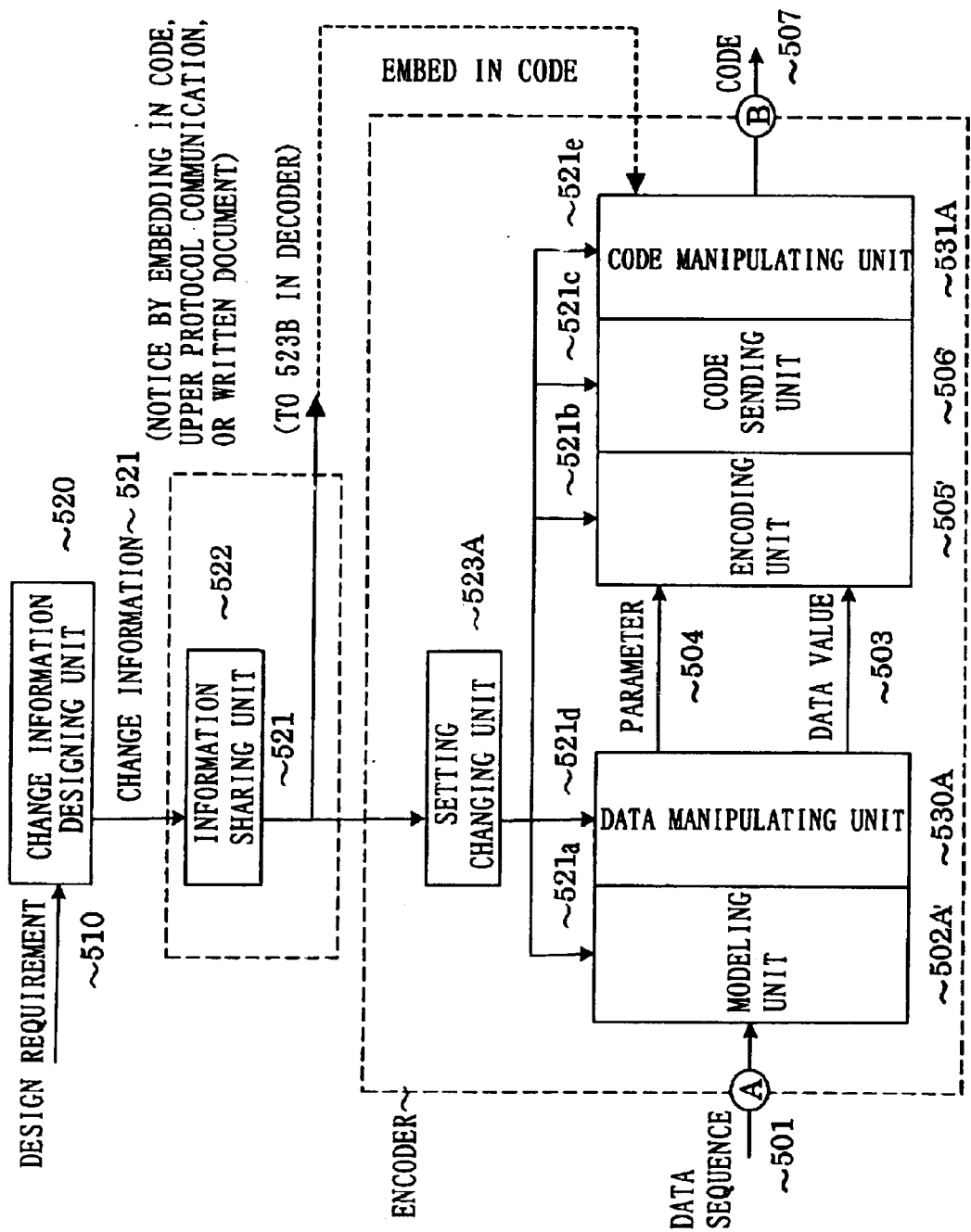
FIG. 1 shows a configuration of an encoder according to the first embodiment of the present invention.
Figure 2:
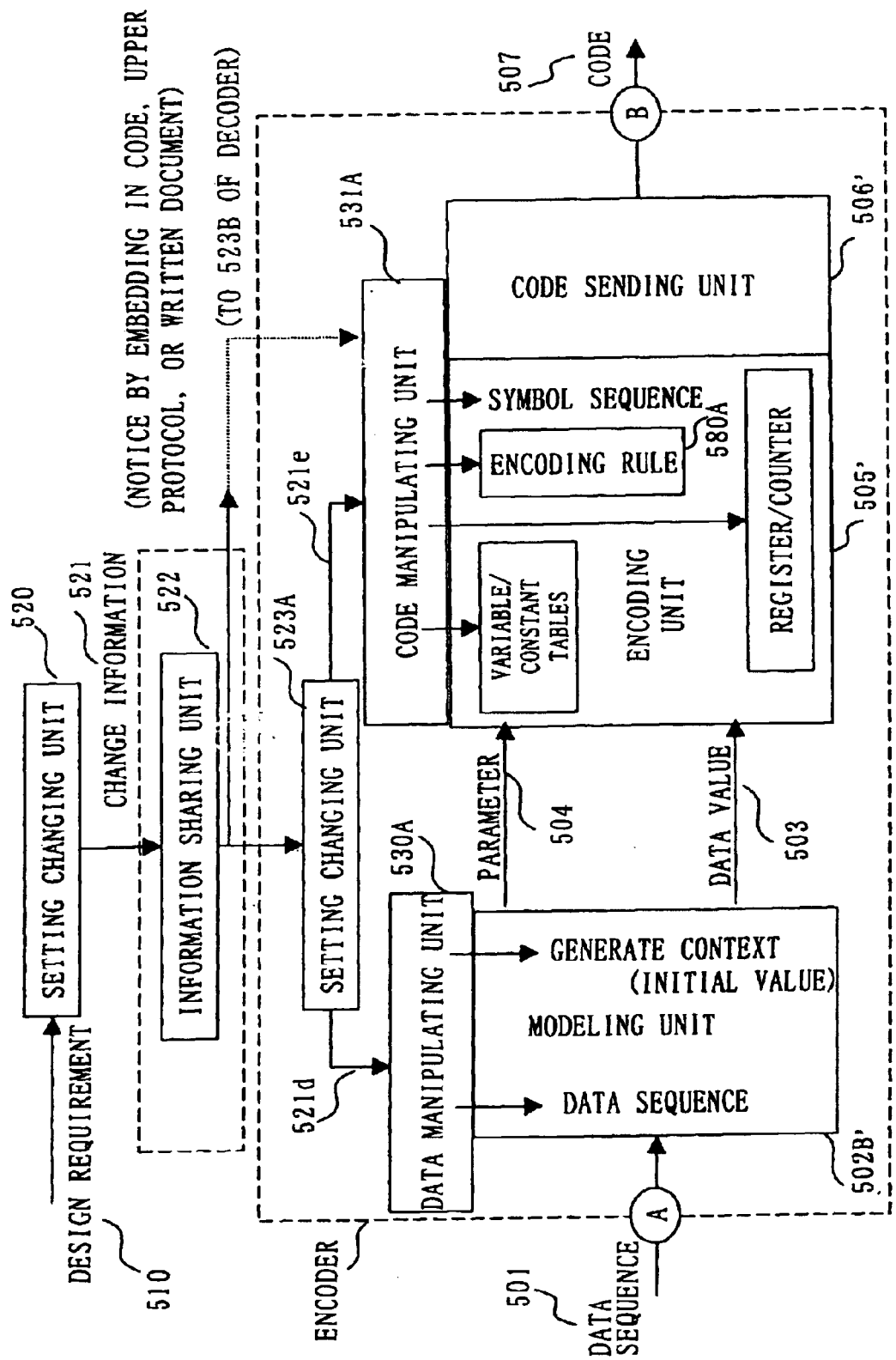
FIG. 2 shows a configuration of another encoder according to the first embodiment.

In the encoder of FIGS. 1 and 2, a change information designing unit 520 outputs change information 521 as an encryption key so as to satisfy desired design requirement 510. The change information 521 is shared between an encoder and a decoder by an information sharing unit 522, however, the change information can be embedded in a code, it can be transferred separately from the code using upper level protocol, or it can be distributed using a written document or a recording medium. Further, encryption can be implemented to the change information 521 by a different system. A setting changing unit 523A, which is also a new element, transfers change information 521$a$, 521$b$, 521$c$, 521$d$, and 621$e$ to a modeling unit 502A', an encoding unit 505', a code sending unit 506', and a data manipulating unit 530A and a code manipulating unit 531A, which will be described later. Namely, at least one of the above change information is set.

Figure 3:
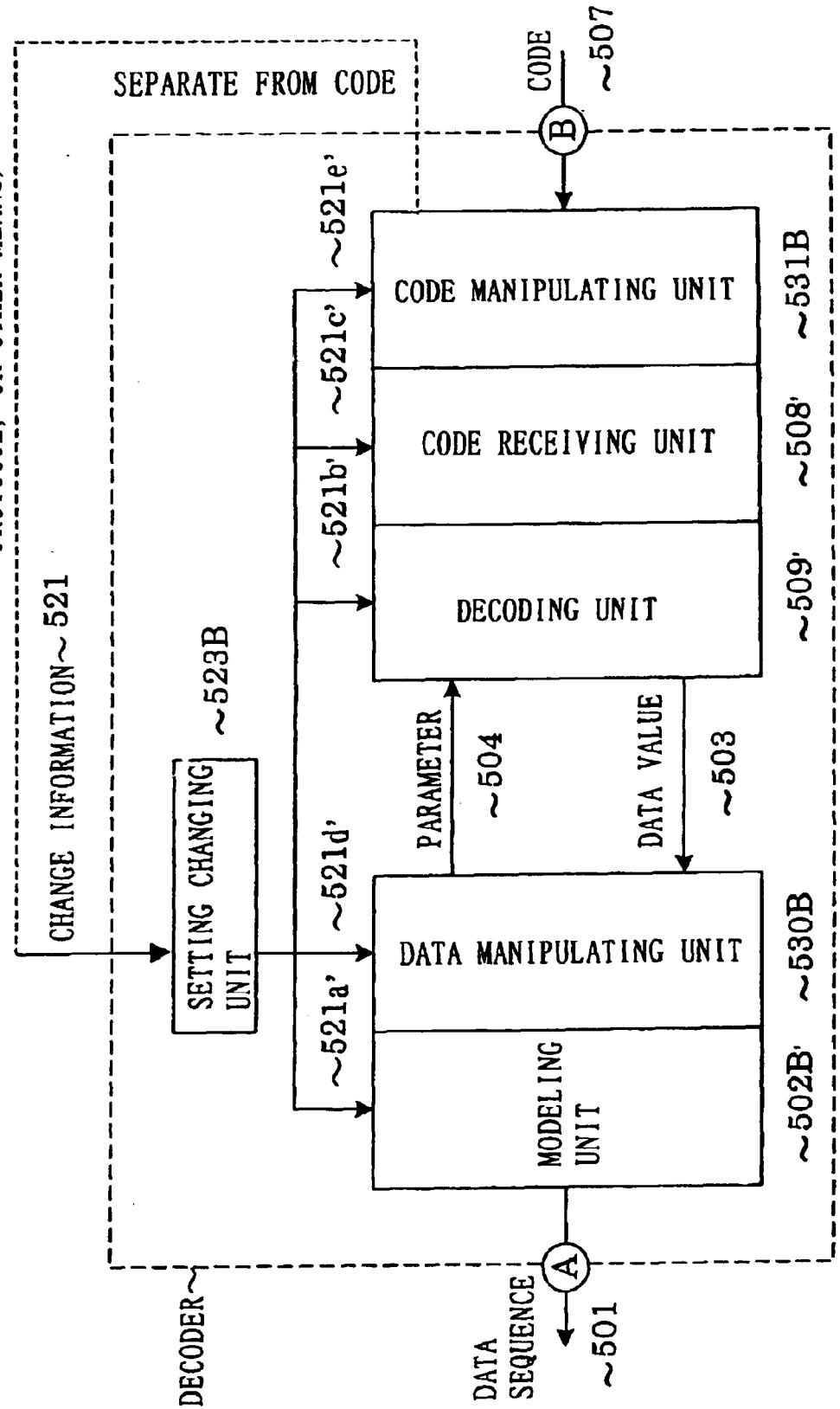
FIG. 3 shows a configuration of a decoder according to the first embodiment of the present invention.
Figure 4:
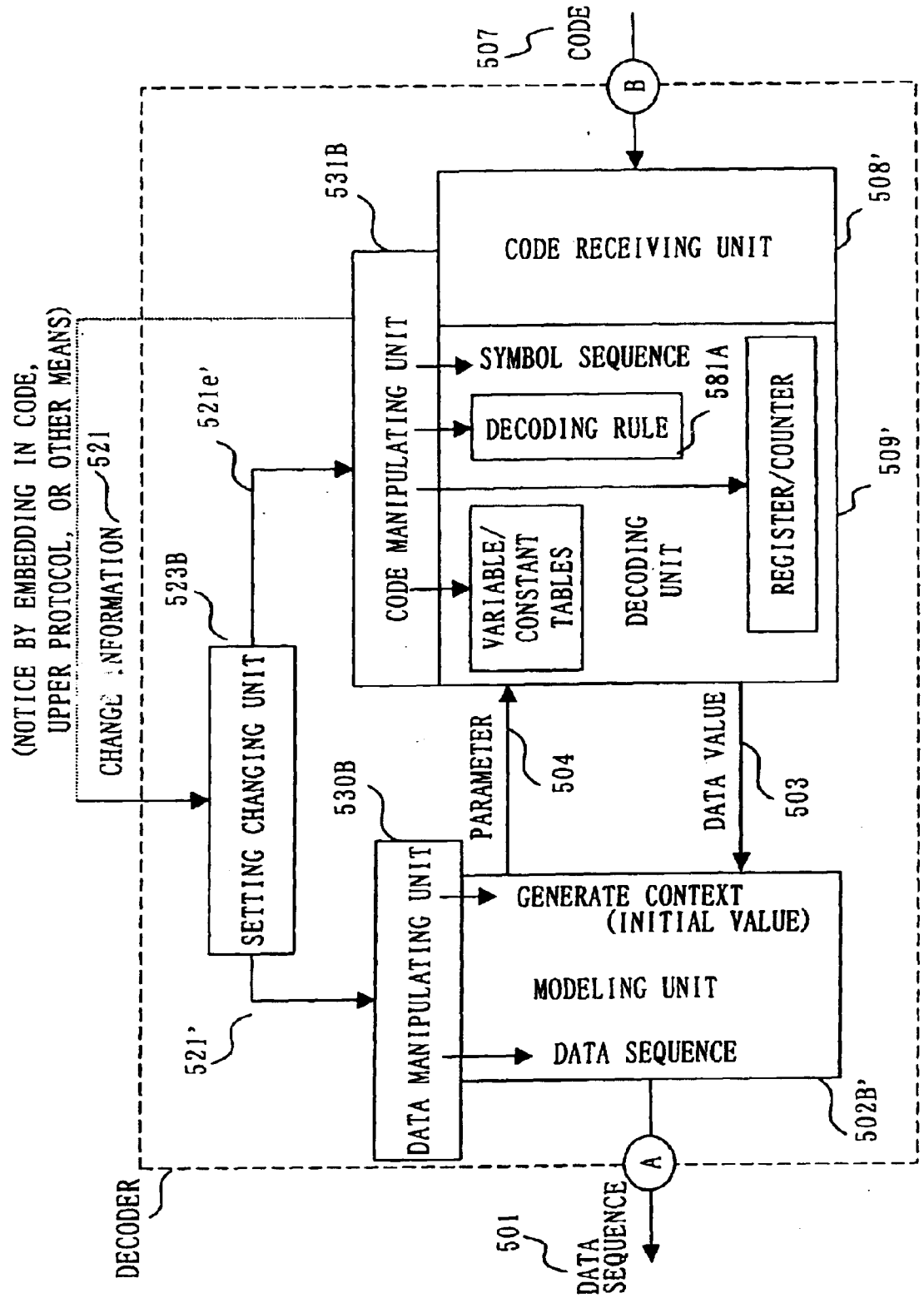
FIG. 4 shows a configuration of another decoder according to the first embodiment.

In the decoder of FIGS. 3 and 4, a setting changing unit 523B transfers change information 521$a'$, 521$b'$, 521$c'$, 521$d'$, and 521$e'$ to a modeling unit 502B', an decoding unit 509', a code receiving unit 508', and a data manipulating unit 530B and a code manipulating unit 531B, which will be described later. The setting changing units 523A and 523B interpret the change information 521 and instruct the change information in a form applicable to the encoder and decoder. The modeling unit 502A', the encoding unit 505', the code sending unit 506' shown in FIGS. 1 and 2, the modeling unit 502B', the decoding unit 509', the code receiving unit 508' shown in FIGS. 3 and 4 are made enable to set the change information using similar elements in the conventional encoder and decoder. A basic operation of other elements is the same as the ones of conventional method.

The modeling units 502' and 502B' change a parameter 504 used for data value 503 by an instruction based on the change information 521$a$ and 521$a'$ from the data manipulating units 530A and 530B. The parameter 504 is, for example, context, which changes or increases/decreases reference data for extracting the characteristics of data sequence 501 through the modeling units 502A' and 502B'.

The data manipulating units 530A and 530B of new elements manipulate the data value 503 and its paired parameter 504, which the modeling unit 502A' and 502B' have sequentially from/for the data sequence 501, at the data value level as shown in FIGS. 1 and 3. That is, data manipulating units 530A and 530B manipulate one of the data 503 which is an output of the modeling unit and the parameter 504. For example, in the encoder, if the data manipulating unit 530A inserts and encodes a dummy data value 503 and a dummy parameter 504, in the decoder, the data manipulating unit 530B decodes the dummy data value 503 from the dummy parameter 504 and deletes the decoded dummy data value 503 from the true data sequence 501. Further, for example, if in the encoder, the data manipulating unit 530A deletes a certain data value 503, notifies of the deletion by the change information 521$d$ and encodes the data sequence 501, in the decoder, the data manipulating unit 530B obtains the deleted data value 503 from the change information 521$d'$ notified and adds the information of deletion so as to have the true data sequence 501. The data manipulating units 530A and 530B can be configured in another way as shown in FIGS. 2 and 4, in which the data manipulating units obtain the change information 521$d$ and 521$d'$ output from the setting changing units 523A and 523B and manipulate and set the data sequence or the generated context in the modeling units 502A and 502B based on the instruction of the change information.

The encoding unit 505' and the code sending unit 506' change static and dynamic reference values (the table values of constants and variables), and other holding values (the register value and the counter value), or corresponding rules of distribution or location based on the instruction of the change information 521$c'$ and 521$b'$, and the encoding unit 505' and the code sending unit 506' change the code 507 which may be required due to the above change inside the encoder and the decoder.

Figure 42:
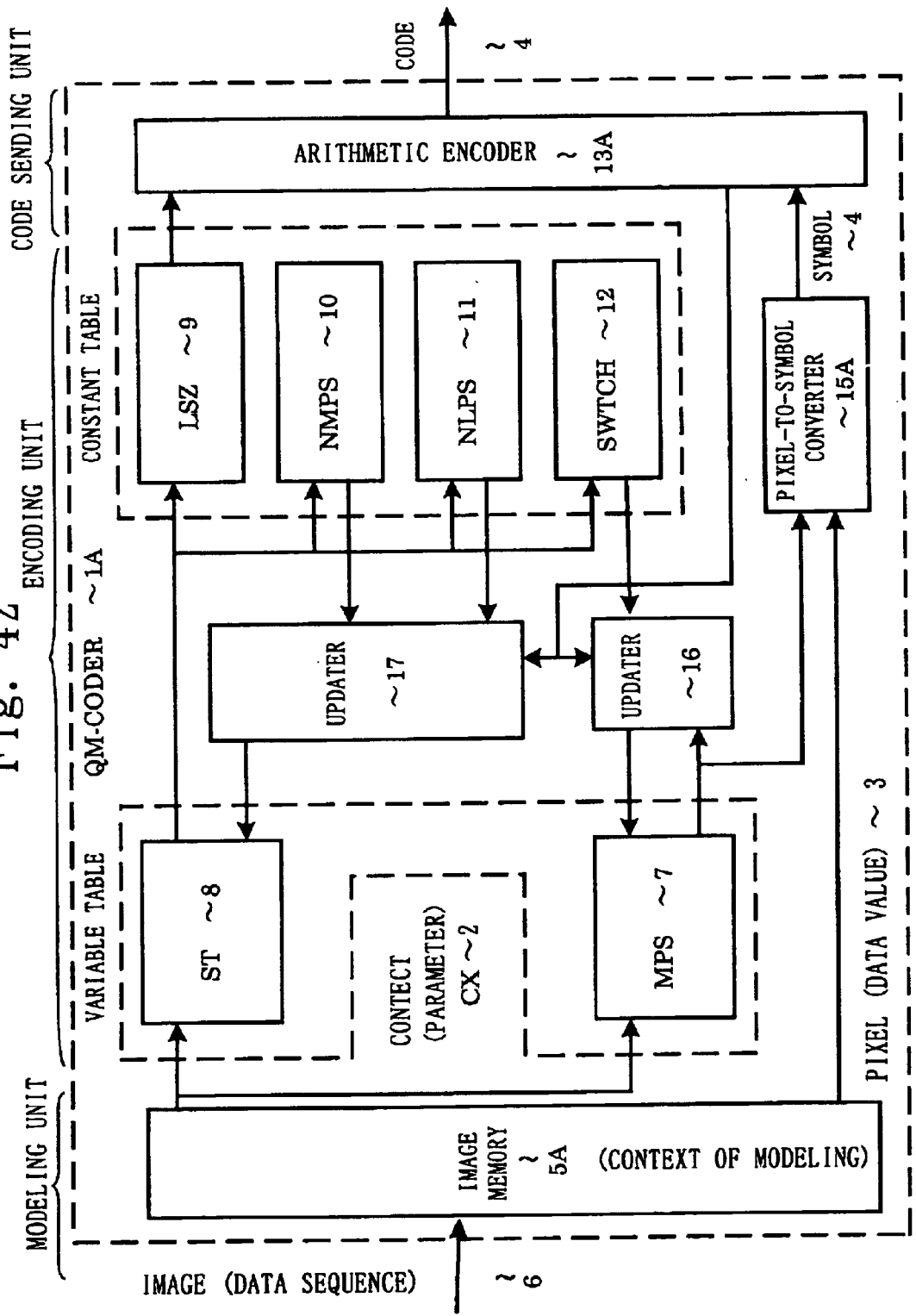
FIG. 42 is a block diagram showing a configuration of an encoder of QM-Coder.
Figure 43:
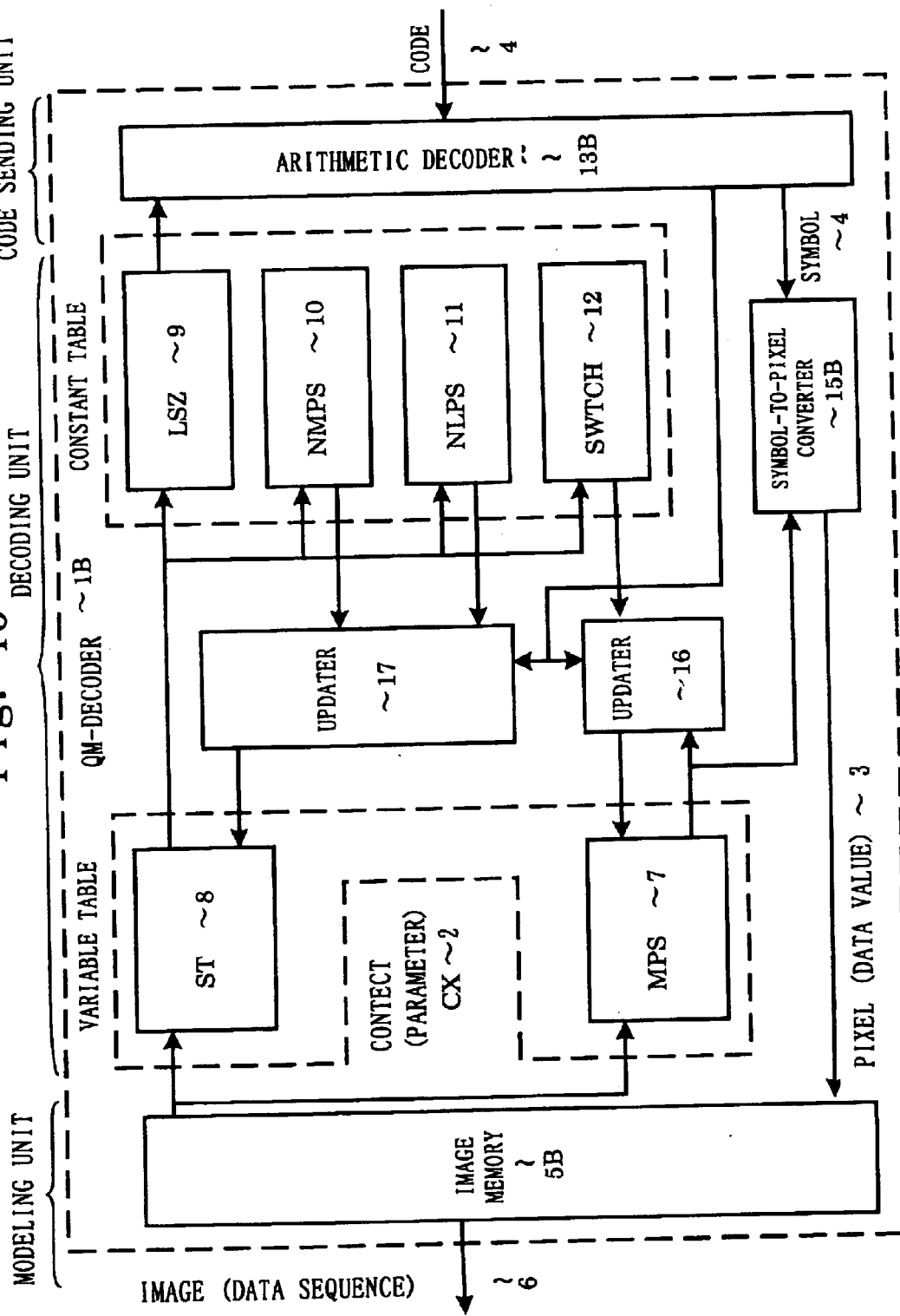
FIG. 43 is a block diagram showing a configuration of a decoder of QM-Coder.
Figure 44:
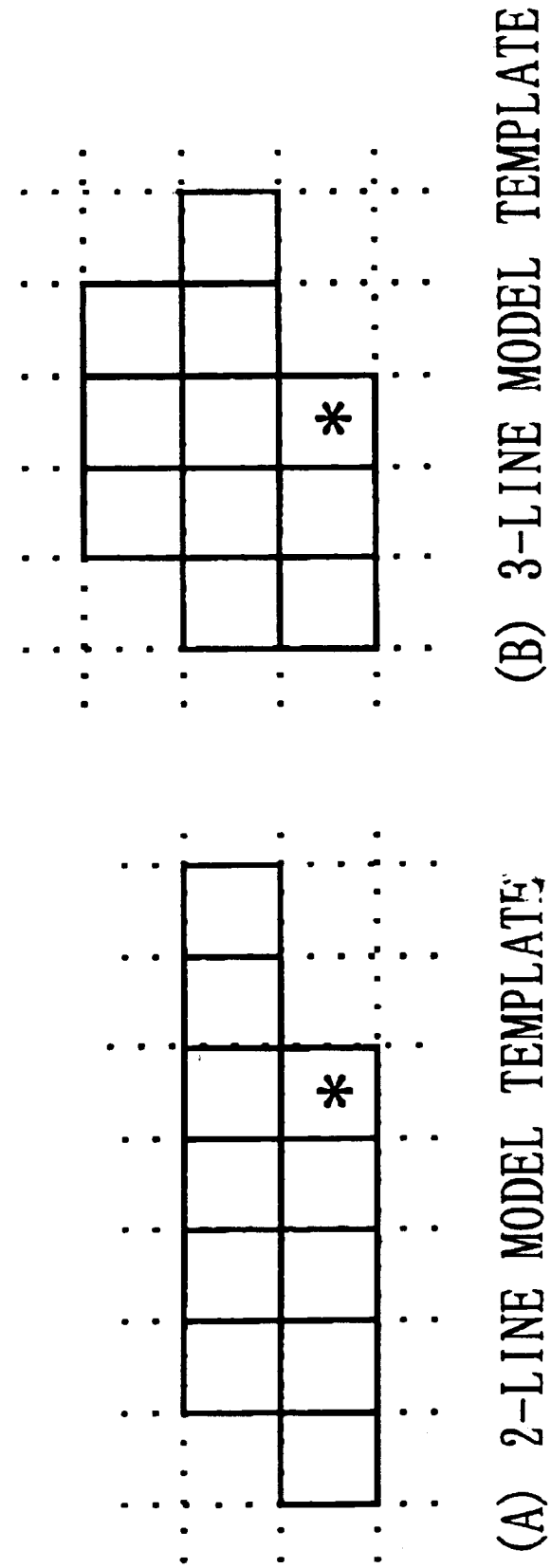
FIG. 44 explains a 2-line/3-line model template used for image processing.
Figure 47:
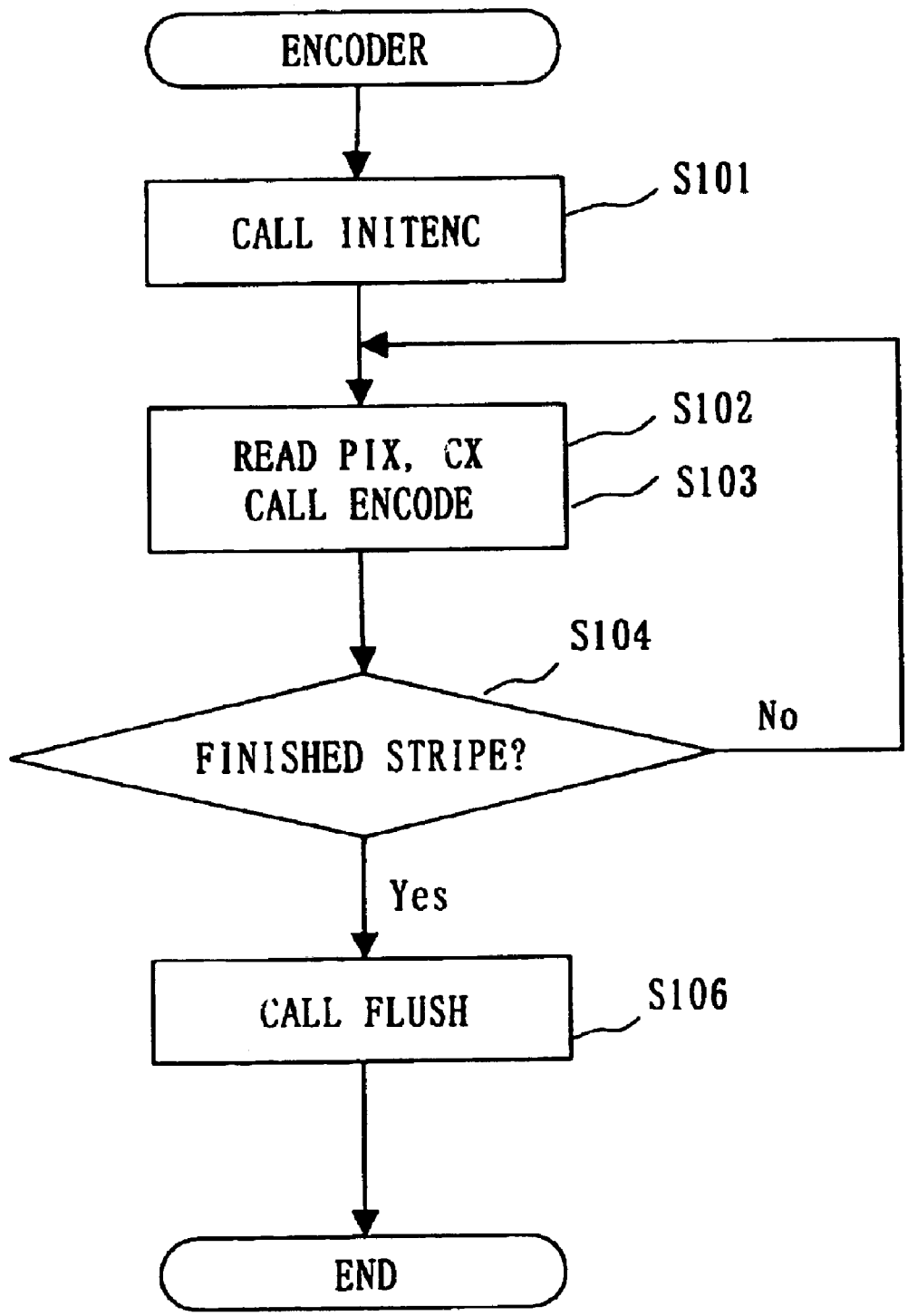
FIG. 47 is a flowchart explaining an ENCODER process of the related art.
Figure 48:
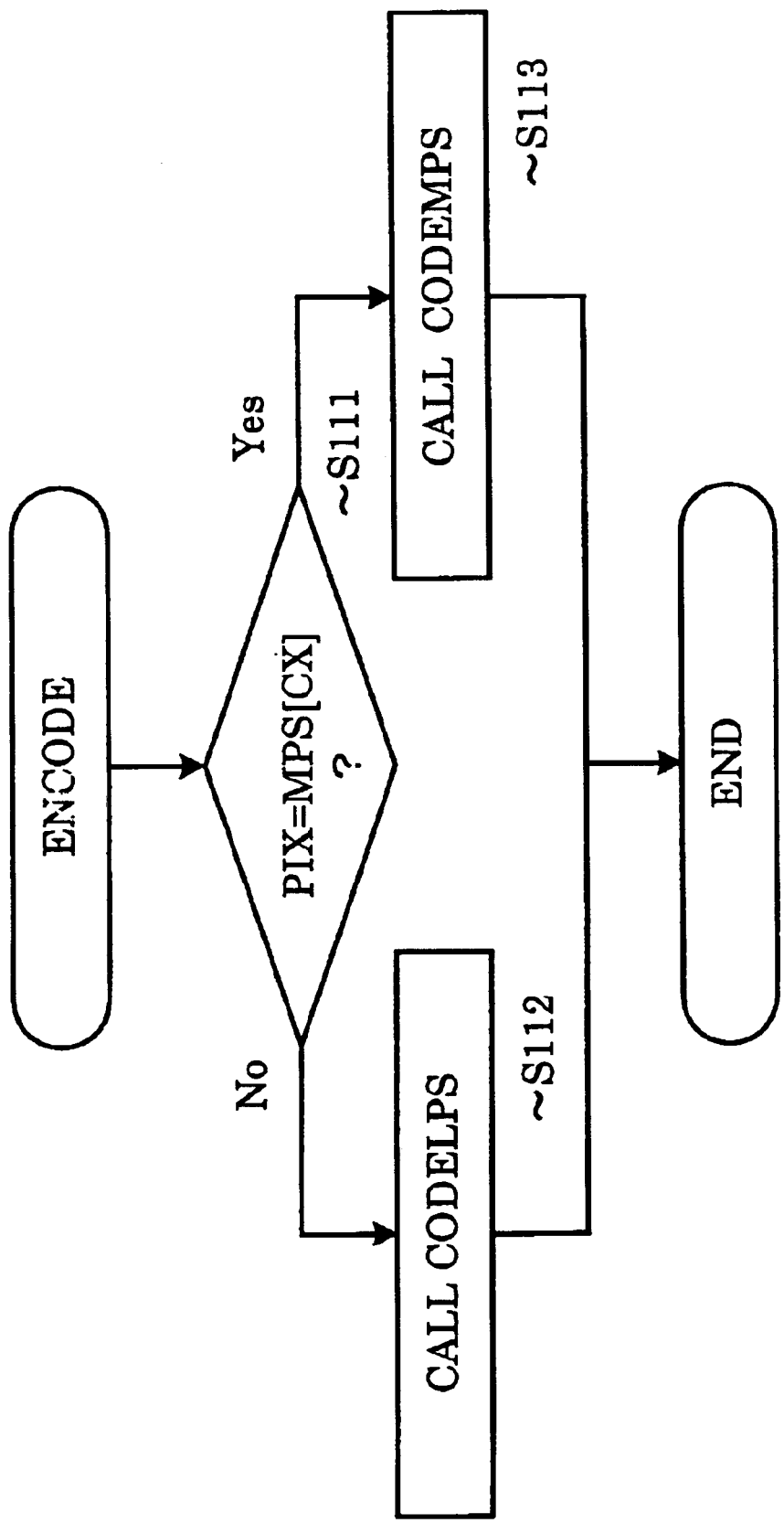
FIG. 48 is a flowchart explaining an ENCODE process of the related art.
Figure 49:
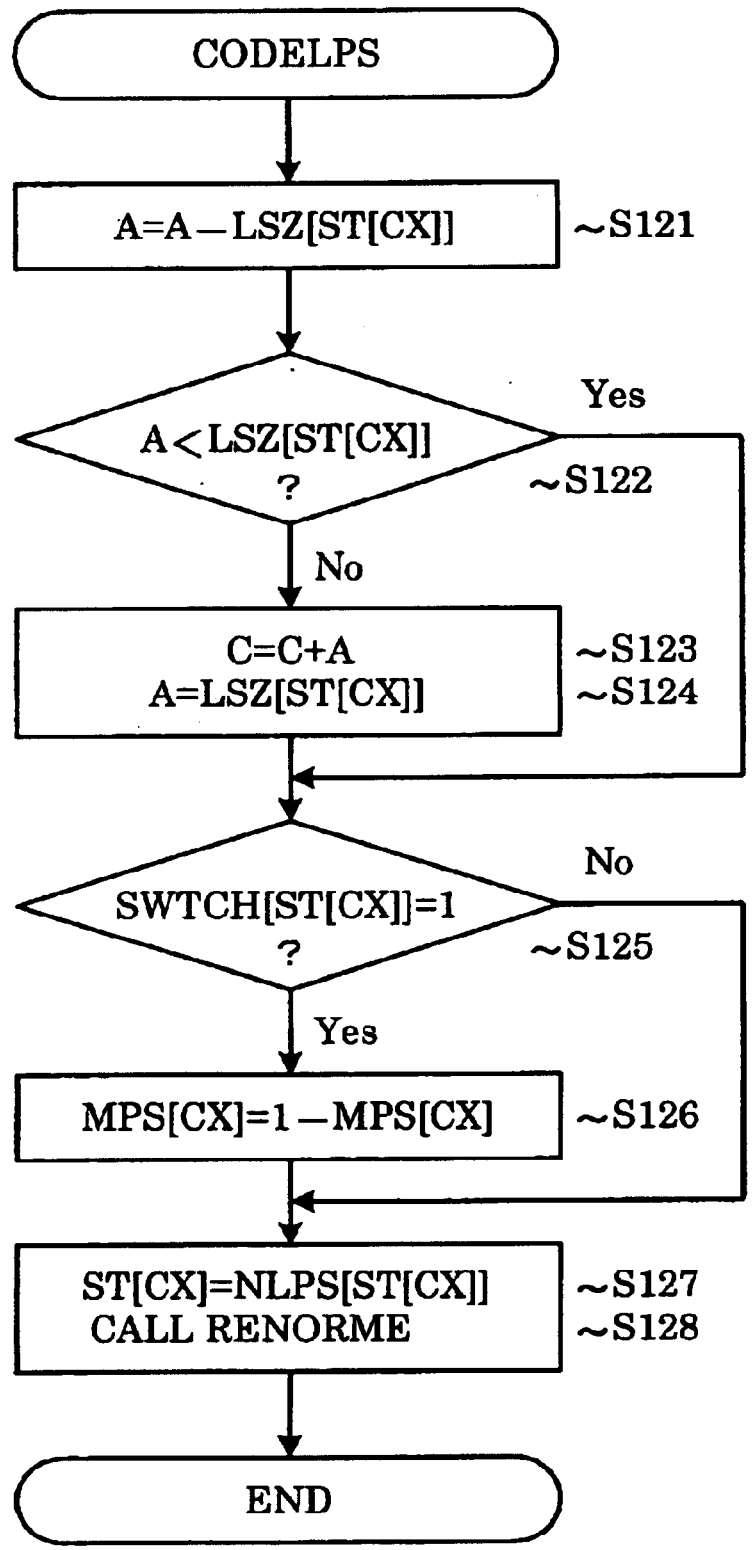
FIG. 49 is a flowchart explaining a CODELPS process of the related art.
Figure 50:
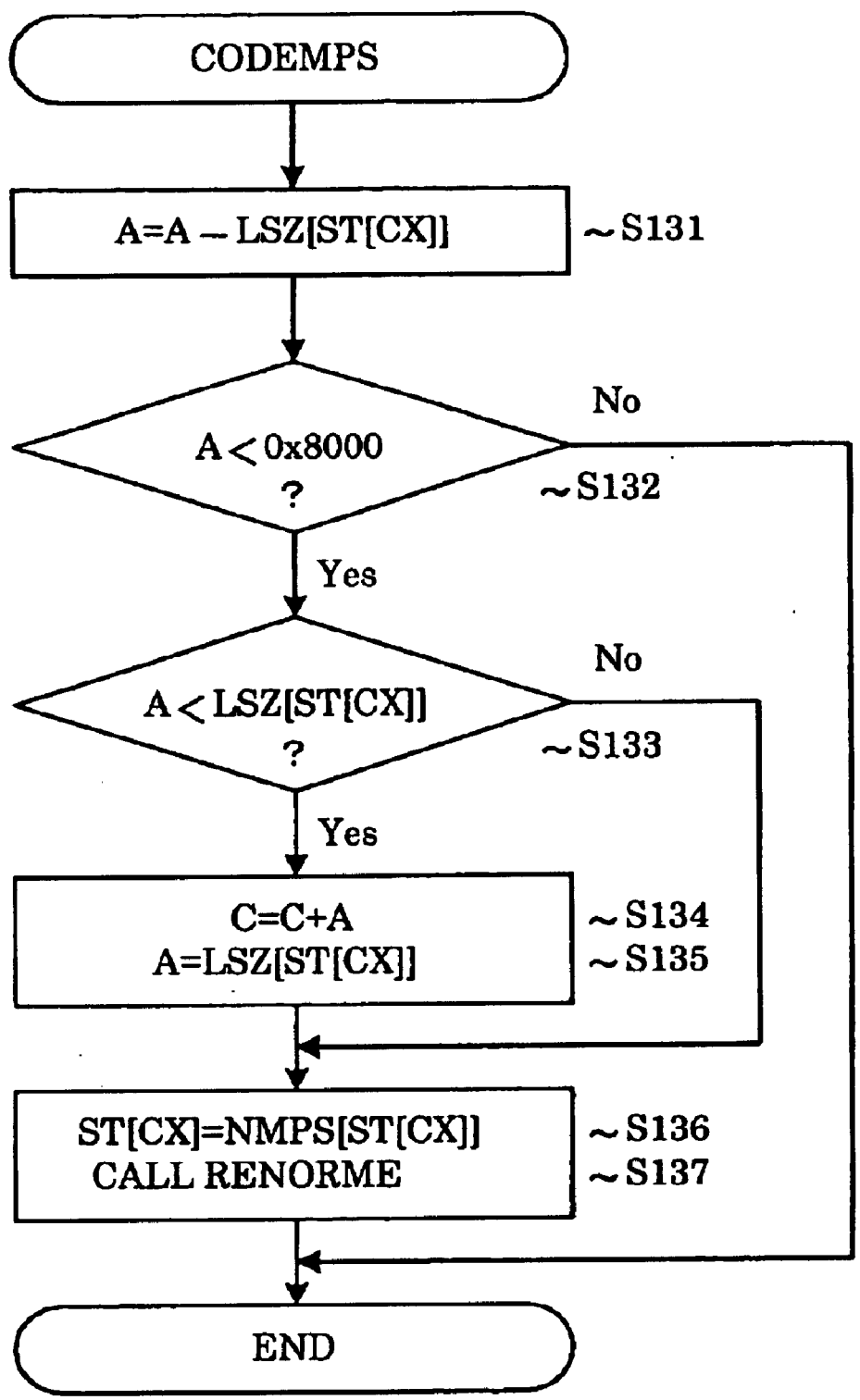
FIG. 50 is a flowchart explaining a CODEMPS process of the related art.
Figure 51:
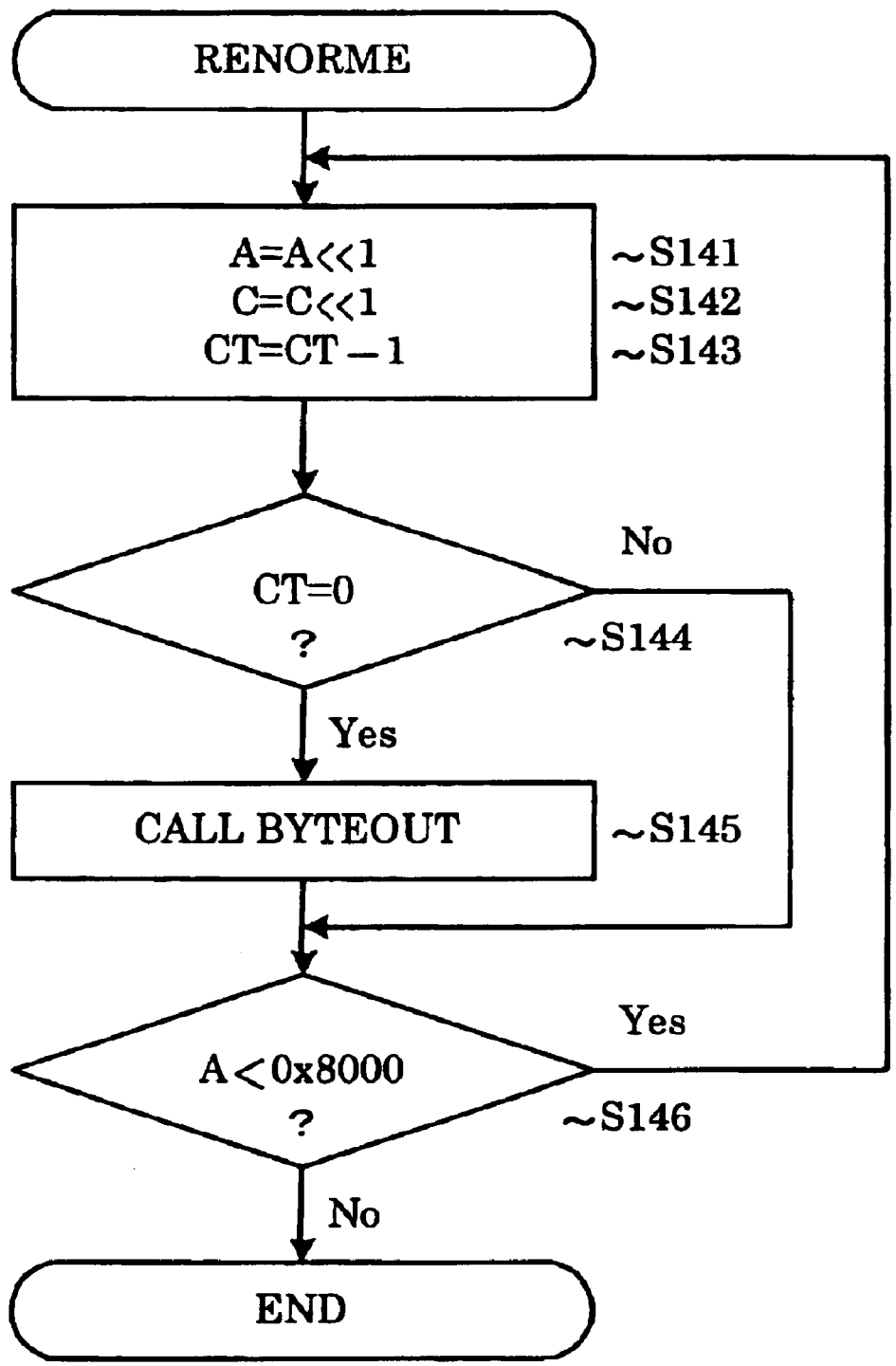
FIG. 51 is a flowchart explaining a RENORME process of the related art.

The code manipulating unit 531A and 531B of new elements directly manipulate the code 507 sent by the code sending unit 506' and the code 507 received by the code receiving unit 508' at the generated code level based on the instruction of the change information 521$e$ and 521$e'$ in the encoder. That is, in the encoder shown in FIG. 1, if the code manipulating unit 531A inserts a dummy code bit into the code 507 and sends the code 507, the code manipulating unit 531B deletes the dummy code bit in the decoder shown in FIG. 3. Further, in the encoder, if the code manipulating unit 531A deletes a certain code bit of the code 507, notifies the deletion by the change information 521d, and encodes the code, the code manipulating unit 531B obtains the deleted code bit from the notified change information 521d', inserts the code bit so as to have the true code 507. Further, the corresponding code bit can be inverted according to the previous agreement without adding or deleting the code bit. The code manipulating units 531A and 531B can be configured in another way, in which the code manipulating units 531A and 531B obtain the change information 521e and 521e' output from the setting changing units 523A and 523B and manipulate and set the values of the variable tables, the constant tables inside the encoding unit 505 and the decoding unit 509 as shown in FIGS. 42 and 43, the values of the arithmetic encoder 13A, the arithmetic decoder 13B, the register, and the counter in the encoding unit 505 and the decoding unit 509 based on the instruction of the change information and in reference to the encoding/decoding rule.

Here, it is not required to limit positions or numbers of the code bit if the data value 503, the code 507, or the code bit inverted within the code 507 inserted or deleted by the data manipulating unit 530A and the code manipulating unit 531A, and deleted and inserted by the data manipulating unit 530B and the code manipulating unit 531B can be notified by the change information 521.

Further, the reference value, the holding value, and the corresponding rule of the encoding unit 505', the code sending unit 506', the code receiving unit 508' and the decoding unit 509' can be changed at the initial stage and during the processing of the encoding/decoding as long as it is possible to notify the change by the change information.

As for one embodiment of sending/receiving the change information by embedding in the code, the code manipulating unit 531A embeds the change information 521 in the code 507 to be output from the code sending unit 506', and the code manipulating unit 531B at the receiving side separates the change information 521 embedded in the code 507 to be input to the code receiving unit 508' from the code 507 and notifies the change information 521 to the setting changing unit 523B. Further, the conventional encryption can be applied to the change information 521 for scrambling the information itself regardless of being embedded in the code 507 and including another embodiment in cases of notifying by another method of communication or data distribution.

When the data including errors is decoded by the conventional decoder without setting the change information, the reproduced data varies based on the design of the changed contents. Especially, in case of an accumulating type of device or an application such as the database which does not operate real-time communication and has no necessity of caring about the time, it is possible to encode the data so that the reproduced data has a desired value of SNR (signal noise ratio) or a bit rate by designing the changed context with consideration of the errors.

Figure 5:
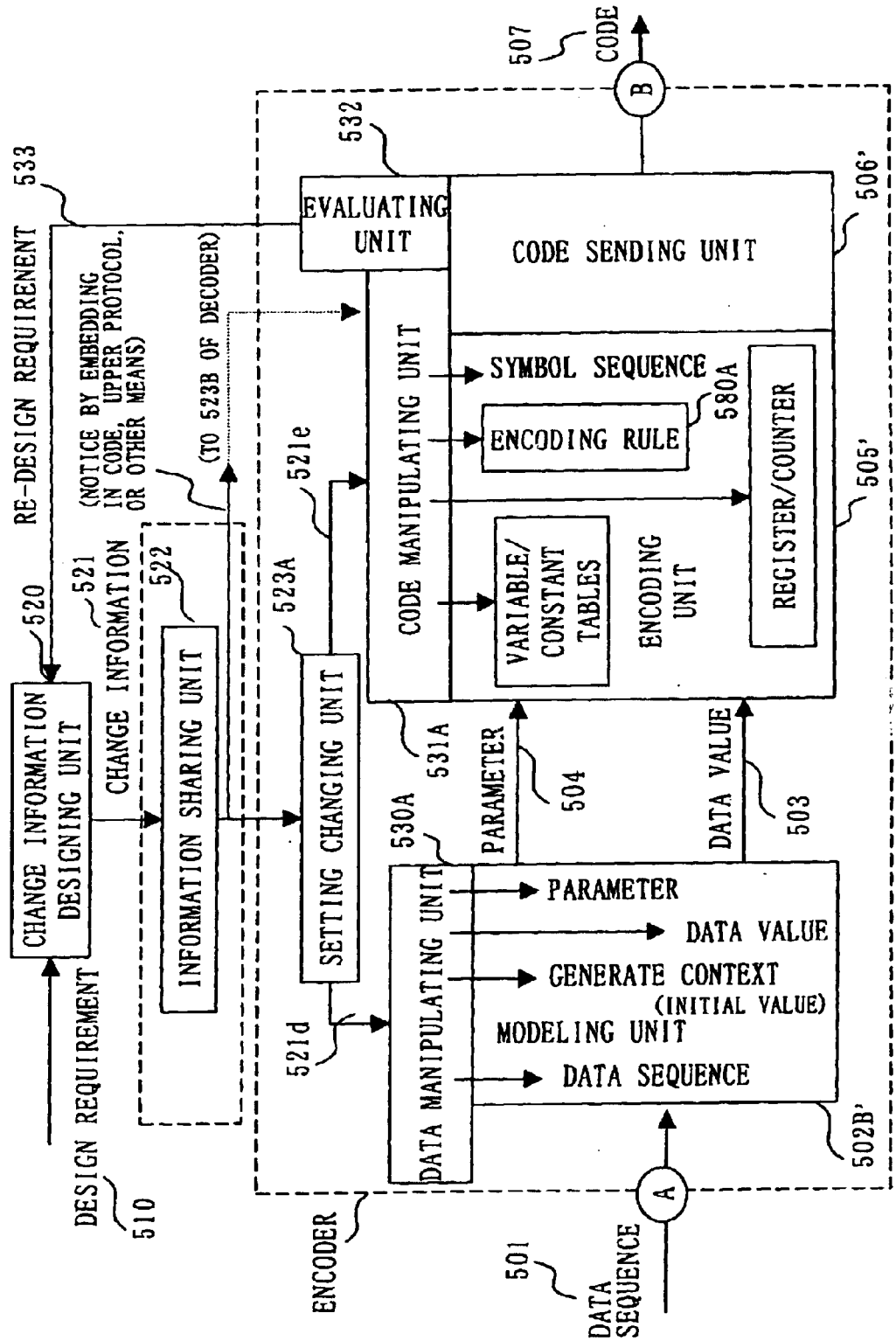
FIG. 5 shows a configuration of another encoder according to the first embodiment.

FIG. 5 is a configuration of the encoder setting the desired change information. In the figure, if it is necessary to set the code 507 precisely matched to the design requirement 510 corresponding to the data sequence 501, the change information 521 designed by the change information designing unit 520 is set and the data is encoded, the data is encoded by setting the change information 521 designed by the change information designing unit 520 shown in FIG. 1. An evaluation unit 532 previously evaluates the code 507 based on a desired evaluation standard such as the SNR or the bit rate before the code 507 is output to the decoder, and if the code 507 doesn't match the design requirement 510, the evaluation unit 532 outputs a re-design request 533 requesting re-design of the change information 521 to the change information designing unit 520. At this time, if the evaluation unit 532 cannot evaluate the code 507 based on only the length of the code 507 and it requires to compare the code 507 with the original data, the evaluation unit 532 previously reproduces and evaluates the decoded result of the standard decoder. Accordingly, after re-designing the change information 521, encoding is performed again, the change information 521 of the time when the code 507 matches the design requirement is shared with the decoder and the code 507 is output by the code sending unit 506'. As shown in FIG. 5, the evaluation unit 532 can perform the above evaluation based on the code 507 and output the code with rearranging the change information.

Figure 6:
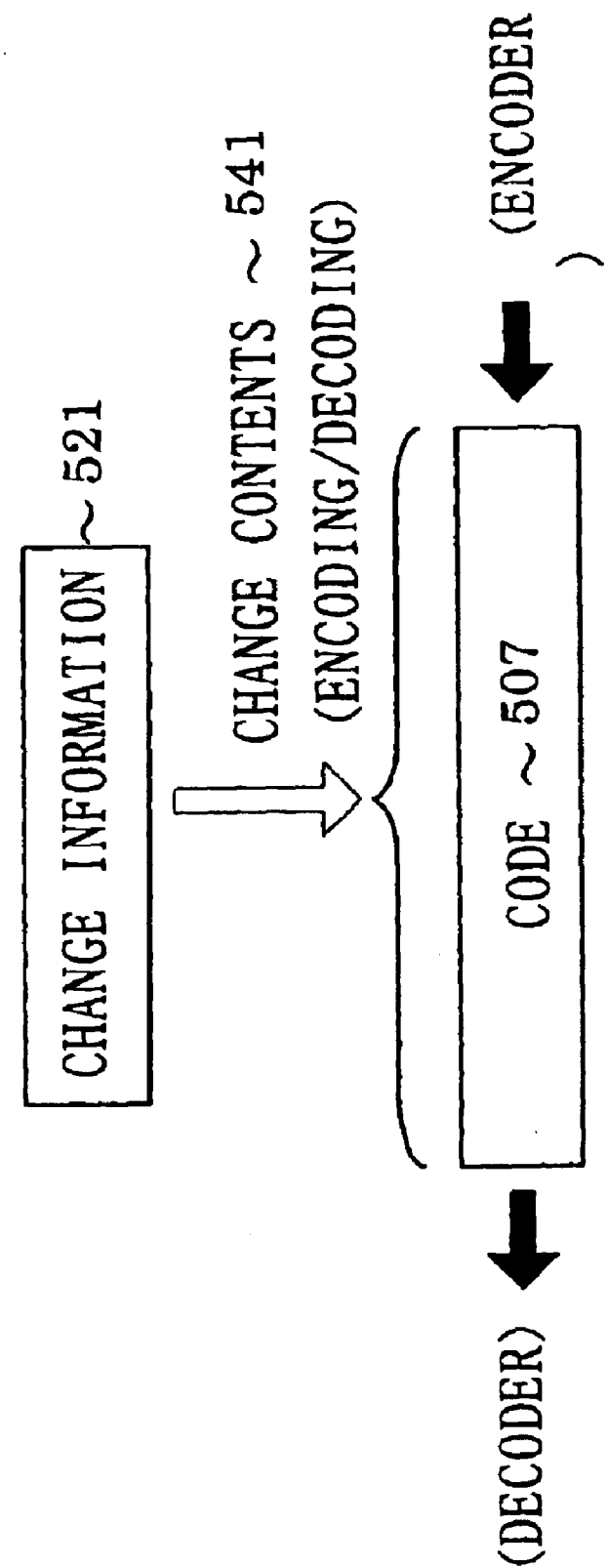
FIG. 6 shows change information and encoding method according to the first embodiment.
Figure 7:
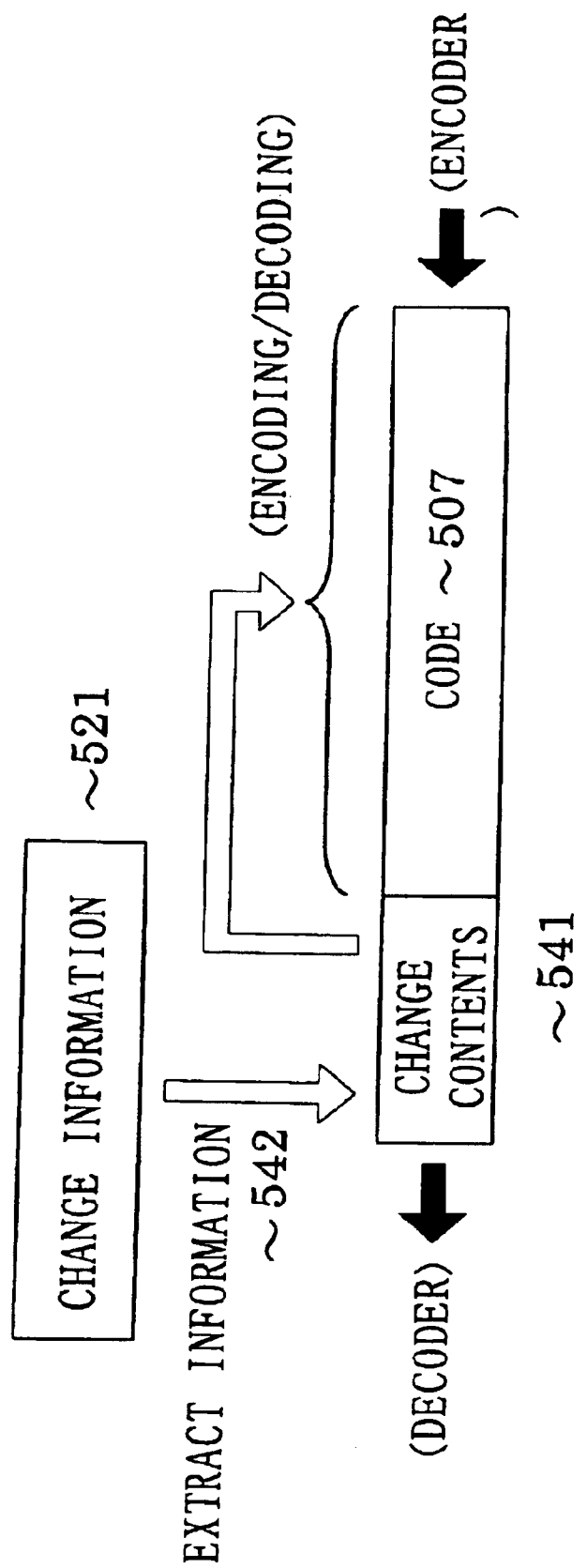
FIG. 7 shows another change information and encoding method according to the first embodiment.
Figure 8:
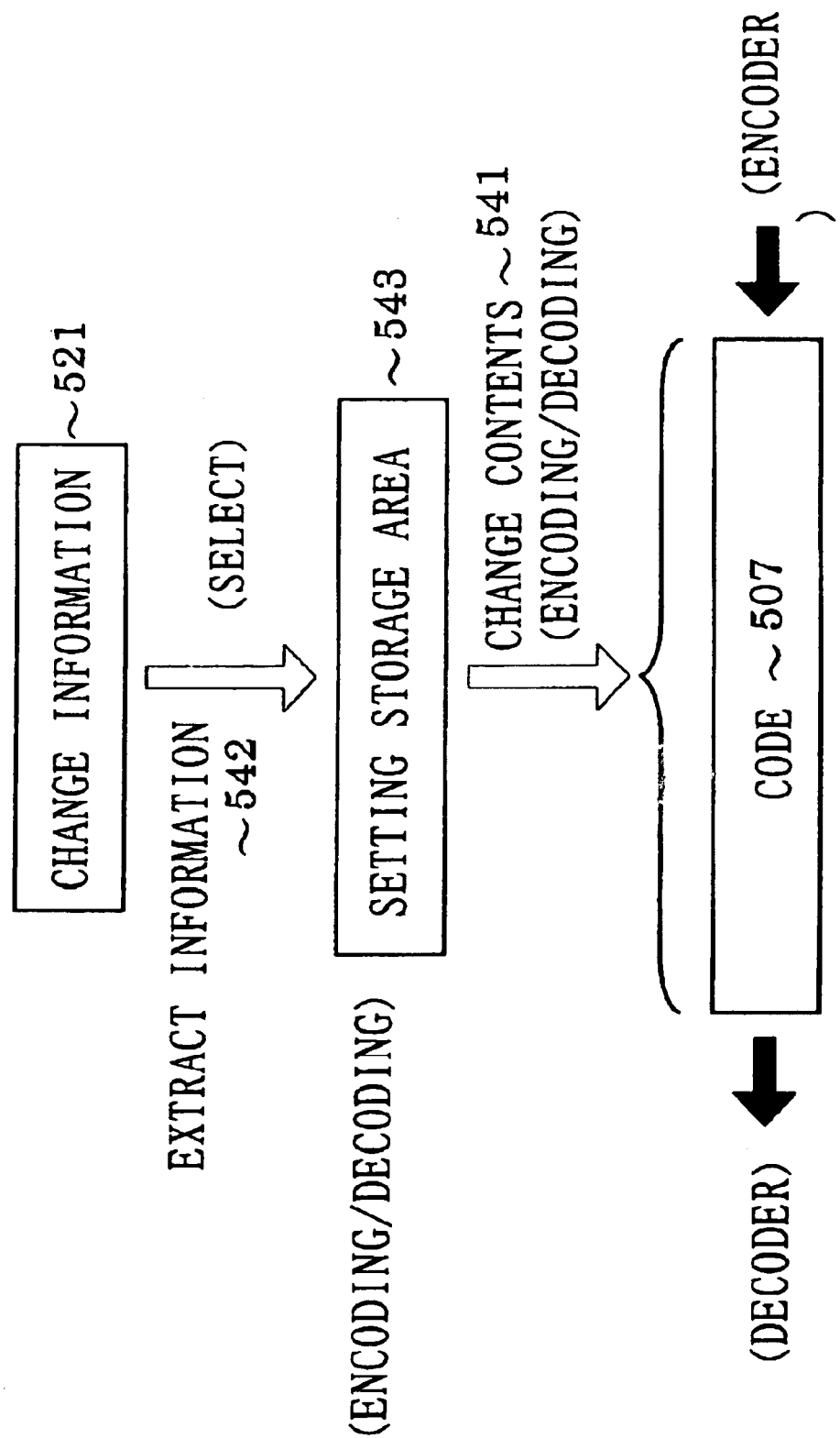
FIG. 8 shows another change information and encoding method according to the first embodiment.

The change information 521 set to be shared by the setting changing unit 523A and the setting changing unit 523B through the information sharing unit 522 can be changed itself as having change contents 541 as shown in FIG. 6. The change contents 541 is processed to each of the elements as the change information 521a, 521b, 521c, 521d, and 521e in the encoder in FIG. 1, and further the change information 521a', 521b', 521c', 521d', and 521e' in the decoder as shown in FIG. 3. Further, as shown in FIG. 7, only the extract information 542 which shows that the change information 521 is encrypted and added to the code 507 is shared. The extract information 542 is extracted indirectly from the code 507 and the code 507 is concretely indicated and operated to each of the elements similarly to the case of FIG. 6. In another way, the code 507 is selected from a setting storage area 543 installed in the encoder/decoder (a device or an application) using the extract information 542 as shown in FIG. 8, and the code 507 is operated to each of the elements by indicating the change contents 541 similarly to the case of FIG. 6. The configuration installing the setting storage area 543 can be an exclusive device for encoding/decoding or an exclusive application. As for the installation form for the setting storage area 543, an area prepared for accumulated change contents can be one or plural, and the value, which has been once set, can be changed.

The change contents 541 indicated as described above is set in the encoder/decoder and then the encoding/decoding process is performed. The change information 521 (the extract information 542) or the change contents 541 can be shared in the forms of status where they can be used directly or the status where the encoding/decoding has been applied before an actual referencing. Further, the change information 521 can be notified to the decoder when the encoder side sets and shares the change information 521, or the encoder applies the change information 521 specified by the decoder side to generate the code and sends the generated code to the decoder. In this way, the change information 521 specified by the decoder side can include the functional limitation of the decoder. When the encoder side sets the change information 521 specified by the decoder side to generate the code, the change information 521 does not need to be sent again to the decoder side from the encoder side.

As described above, in case of encryption using the arithmetic encoding, the change information which is shared as an encryption key is the information of actual changed contents or the information for extracting the changed contents set in the code or the storage area in the encoder/decoder. These change information or the extraction information can be individually encrypted or encoded as the encryption key when the information is notified from the encoder to the decoder, however, generally, the individual encryption is not necessary, and the correct information can be sent easily by sharing the change information and performing encoding/decoding.

Figure 9:
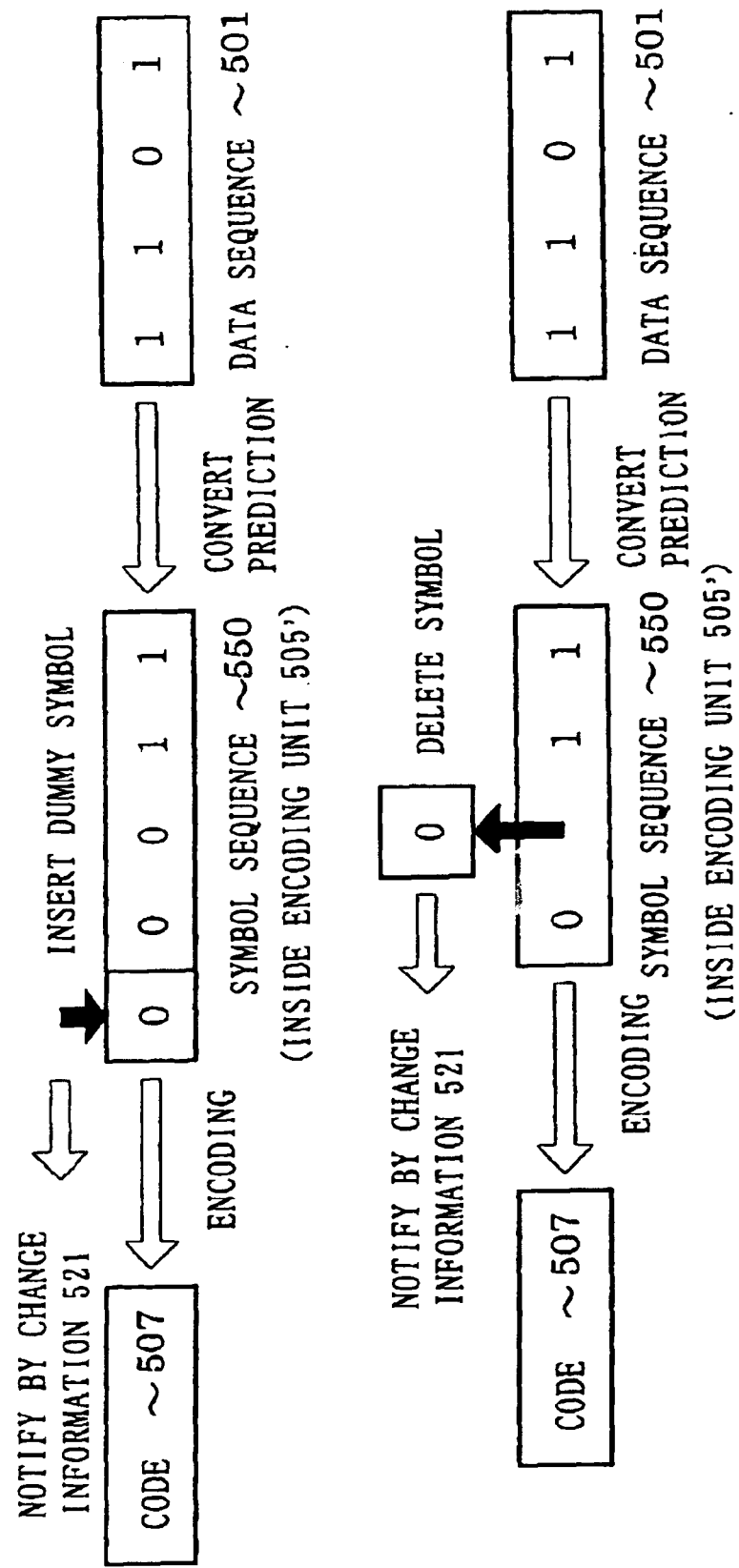
FIG. 9 explains a process using the change information according to the first embodiment.
Figure 10:
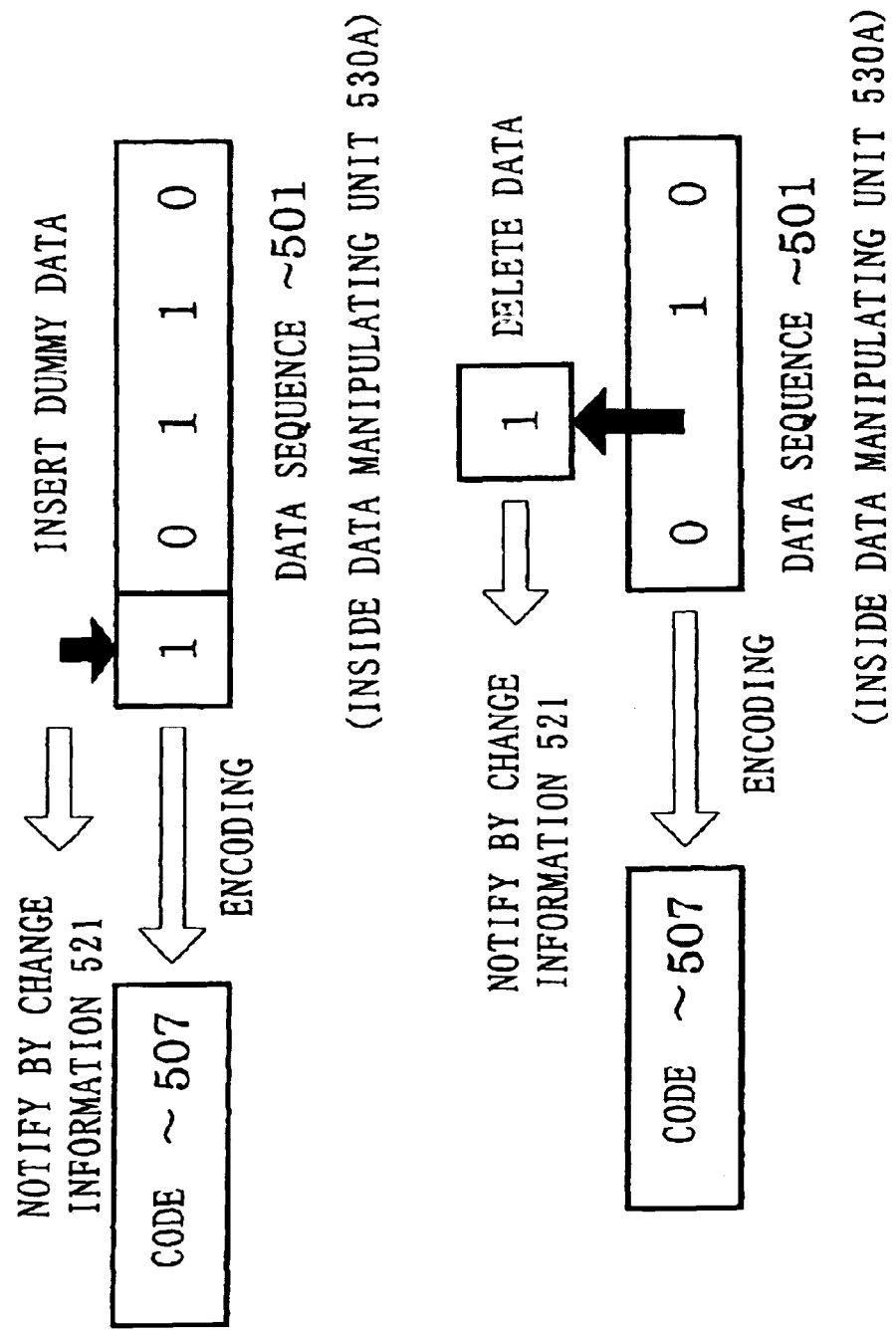
FIG. 10 explains another process using the change information according to the first embodiment.
Figure 11:
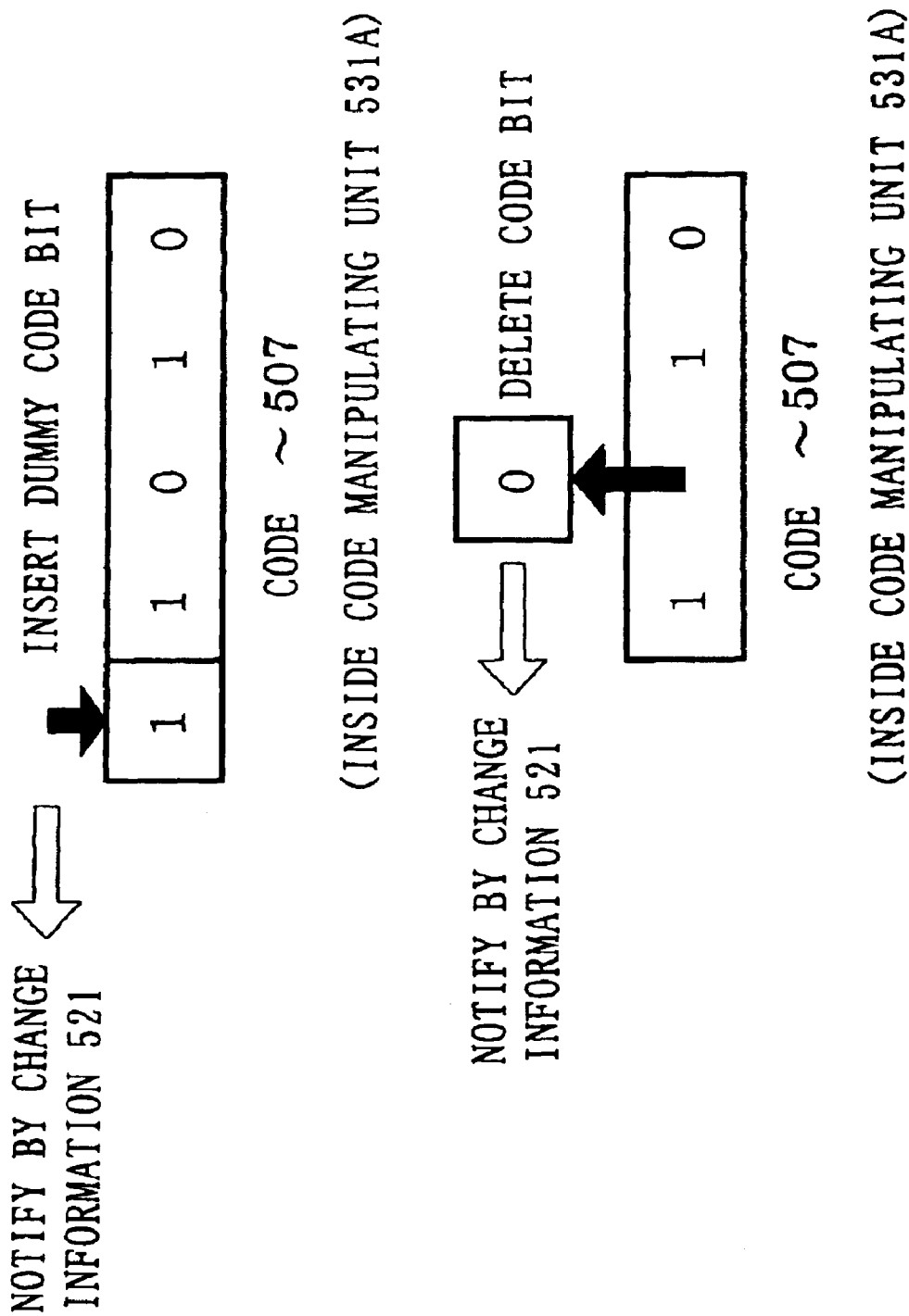
FIG. 11 explains another process using the change information according to the first embodiment.

FIG. 9 shows an operation of a symbol sequence 550 which is performed inside the encoding unit 505' and is converted into the symbol sequence 550 (the symbol 4 of FIG. 42) from the data value 501 to show match/mismatch of the prediction value. The encoder inserts a dummy symbol into the symbol sequence 550, which is a result of encoding by the code manipulating unit 531A of the encoding unit 505', deletes the symbol and notifies of the operation using the change information 521. The decoder deletes the inserted dummy symbol from the received code (the symbol 4 in FIG. 43) by the code manipulating unit 531B based on the notified change information 521 or returns the deleted symbol to reproduce the symbol sequence 550 (the symbol 4 in FIG. 43) inside the decoding unit 509'. Similarly, FIG. 10 shows an operation of the data manipulating unit 530A, in which the data manipulating unit 530A inserts dummy data into the data sequence 501 (the pixel 3 and the corresponding context 2 shown in FIGS. 42 and 43) and the data manipulating unit 530B of FIG. 4 deletes the corresponding dummy data and returns the data sequence 501 to its original status. FIG. 11 shows an operation of the code manipulating units 531A and 531B of FIG. 1 to the code 507 (the code 4 in FIGS. 42 and 43). These operations of insertions/deletions can be applied individually, simultaneously, consecutively, or dispersively. When the dummy code bit is inserted in the code or the code includes the code bit to be deleted, it should be carefully prevented a case in which a marker code defined by the encoding method or the communication method. In particular, in case of the arithmetic code, it is easier to overcome the above problems by performing operations by a byte unit of the code than a bit unit of the code because the application of the carry-over should be also controlled. The operation can be done by inverting or converting the values.

FIG. 12 shows an example of encoding/decoding using the arithmetic code to change the initial value of the context, which is performed by the data manipulating unit 530A of FIG. 2. In this case, the prediction value MPS(1) for the context 1 is also changed at the same time. As for the change of the initial value of the context, the data manipulating unit changes the initial value of the context of the modeling unit. As for the change of the prediction value, the code manipulating units 531A and 531B change the value of the prediction value table within the encoding unit 505' and the decoding unit 509'. In case of encoding the 4-bit data sequence '1101', when the first context (CX1) is 1, the initial value of the prediction value for the context 0 and the context 1 (MPS(0), MPS(1)) are 0 and 1, respectively, the data sequence is converted into the symbol sequence '0011' by transition of the center partition due to equally dividing the effective region repeatedly as well as the conventional example shown in FIG. 40, and the code '0.0011000' can be obtained as the lower limit value of the final effective region.

In case of decoding, the symbol sequence '0011' is correctly reproduced under the condition of equal division. The code can be normally decoded if the same value as the encoding process is given as the initial value of the context and the initial value of each prediction value. When different values are given as shown in the decoding process of the figure, the decoded data sequence becomes '0011', which does not match the same as the encoded data sequence '1101'. Similarly, when these codes are decoded using another combination of the initial values {CX1, MPS(0), MPS(1)}={0,0,1}, {0,1,0}, {0,1,1}, {1,0,0}, {1,1,0}, and {1,1,1}, the decoded data sequence become '0010, '1000', '1100', '0011', '0111', and '1100', respectively, which do not match the encoded data sequence.

On dividing the region, it was assumed to divide equally (=1 case) and that the previous one pixel is taken as the context to be an index for the prediction value table. Accordingly, under this assumption, there is only one case in which the same data can be decoded as the encoded data out of eight possible combinations of the initial values and when the same values are set as the encoding process. Even in this example, there is a possibility that the decoded symbol sequence matches the encoded data in cases that the decoded symbol sequences are {0,0,0} and {1,0,0}. This is because that: the data sequence is short; the region is simply equally divided; learning such as the inversion of the prediction value is not implemented; and so on. For example, in the QM-Coder, which has been explained in the description of the related art, there are 113 statuses to determine partial portions of the divided region. According to the standard template of the JBIG/JPEG encoding method, there are 1024 contexts by referring to 10 pixels. To scramble the information, which is an object of the invention, a number of cases can be obtained by independently changing the initial values. Further, the representative probability value, the next state of transition, the prediction value inverting flag can be changed and the number of states can be changed. The reference pixels and the reference position of the context can be changed. If the decoder cannot correspond to these operations, the decoder cannot map the data within the normal region, false detection of the symbol causes false learning of the decoded value and the parameter. Once the decoding is implemented improperly, the generation of the context for referring to the past decoded data value (pixel) and the extraction of its parameter are damaged by the improper decoding, which results in a fatal error.

In the following, for an example of applying the arithmetic code, a concrete example of changing the parameter values is explained, while implementing the encryption by sharing the change information regarding to the encoding unit 505' and the decoding unit 509' using the processing flow of the QM-Coder.

On encoding the data, to give the initial values to the region range A or the code C also scrambles the decoded result. Further, even if the decoding parameter can be the same with the encoding parameter, the decoded result cannot be obtained properly unless the decoder can perform the same modification to the data when the encoder intentionally changes the data except the parameter such as manipulation of bits, partial hiding of the data, insertion of the dummy data to make the code value different, and addition of the data value (or symbol) to the dummy data. The above manipulation of bits is implemented by inverting the bit or masking by an XOR. The partial hiding means to hide a part of data and to notify separately. The insertion of the dummy is, for example, to insert a dummy bit (or dummy byte) into the code. When the data value (or symbol) is added to the dummy in the encoder, the decoder has to decode using the same parameter as one used in the encoder and delete the added data value. Whether the dummy data, from which the added data value is deleted, is referenced at the further process such as generation of the context should be determined so that the encoder and the decoder treat the dummy data similarly.

First, an example case of changing the value of the operation register in the QM-Coder. For example, the initial values of the encoding register C30A and the region range register A 31 are set to A=0x0000 (S174) and C=0 (S175) in the INTENC processing flow of FIG. 53. These values correspond A=1.0 and C=0 shown in (a) of FIG. 13. From these two initial values, the final code values should be coordinates within the range of equal to or greater than 0.0 (=C) and less than 1.0 (=C+A).

When only the initial value of the A register 31 is changed and when A=0.9 as shown in (b) of FIG. 13, the final code value becomes equal to or greater than 0.0 and less than 0.9. When only the initial value of the C register 30A is changed and when C=0.1 as shown in (c) of FIG. 13, the final code value becomes equal to or greater than 0.1 and less than 1.1. A case when both initial values of A and C are changed is shown in (d) and (e) of FIG. 13.

Figure 53:
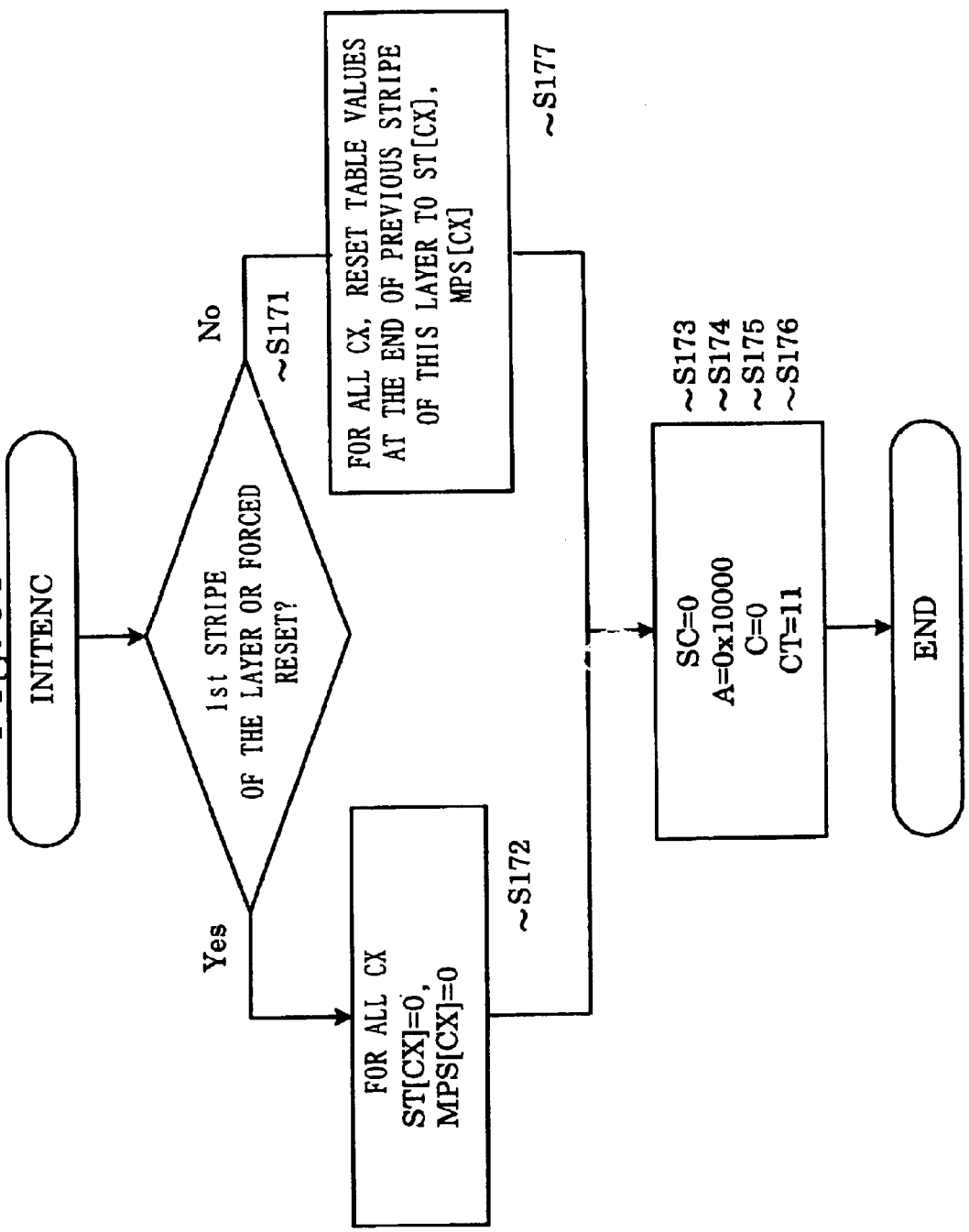
FIG. 53 is a flowchart explaining an INITENC process of the related art.
Figure 63:
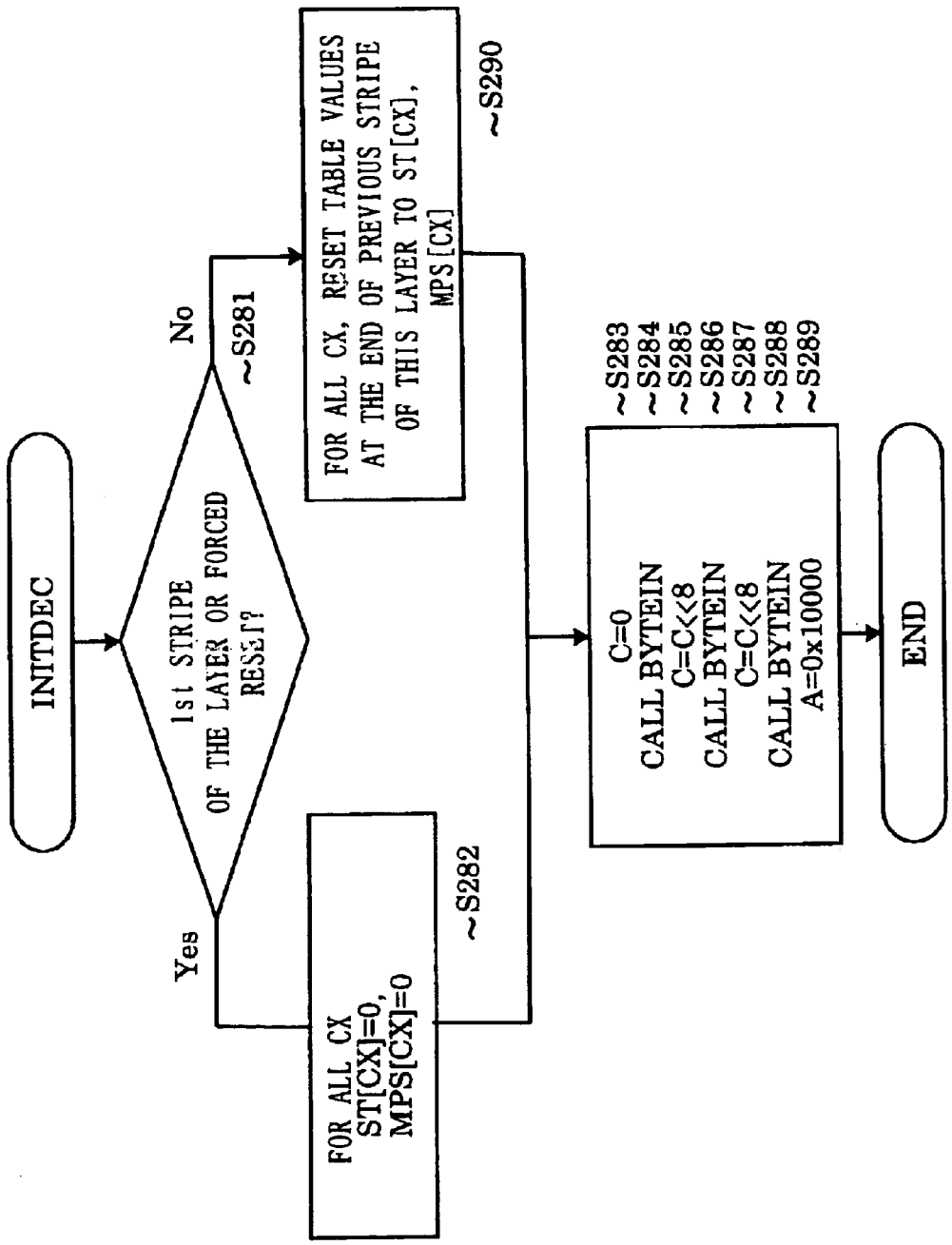
FIG. 63 is a flowchart explaining an INTDEC process of the related art.

When the initial value is changed in the INITENC processing flow of FIG. 53, the INITDEC processing flow of FIG. 63 has to be changed. When the initial value A (S174) is changed in the encoder, the same initial value is set in the decoder at step S289. Further, when the initial value C (S175) is changed, the initial value set at step S175 has to be subtracted from C, which has been already initialized by reading the code, before starting the decoding process, namely, at final step of the INITDEC processing flow of FIG. 63, the initialization processing flow, a new modification process is added for adjusting to the origin of the code.

Here, if the initial value of the A register 31 is set to less than ½ (=0x8000), the renormalization is needed before implementing encoding/decoding. Accordingly, at the final step of the above processing flow, it is checked if the value of the A register 31 is greater than '0x8000'or not. If the value of the A register 31 is less than '0x8000', the RENORMD processing flow is called.

As described above, the initial values of the C register 30A, 30B, A register 31 are changed from the foregoing related art. Only authorized user can share the changed values, which enables to obtain the properly decoded data. If the unauthorized user tries to access the data, only decoded data with decoding error is provided.

Figure 14:
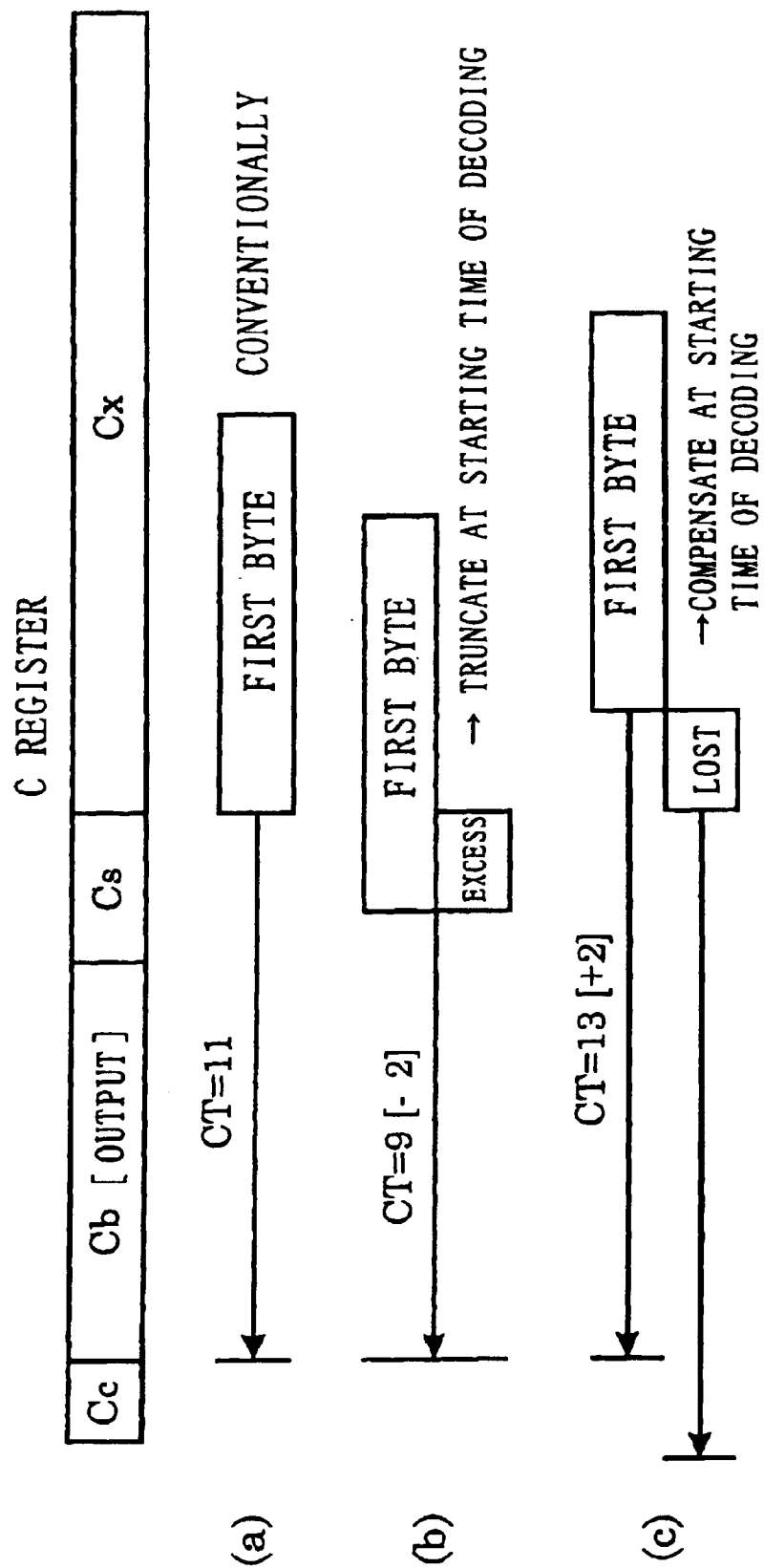
FIG. 14 explains changing operation of the value of the operation register according to the first embodiment.
Figure 52:
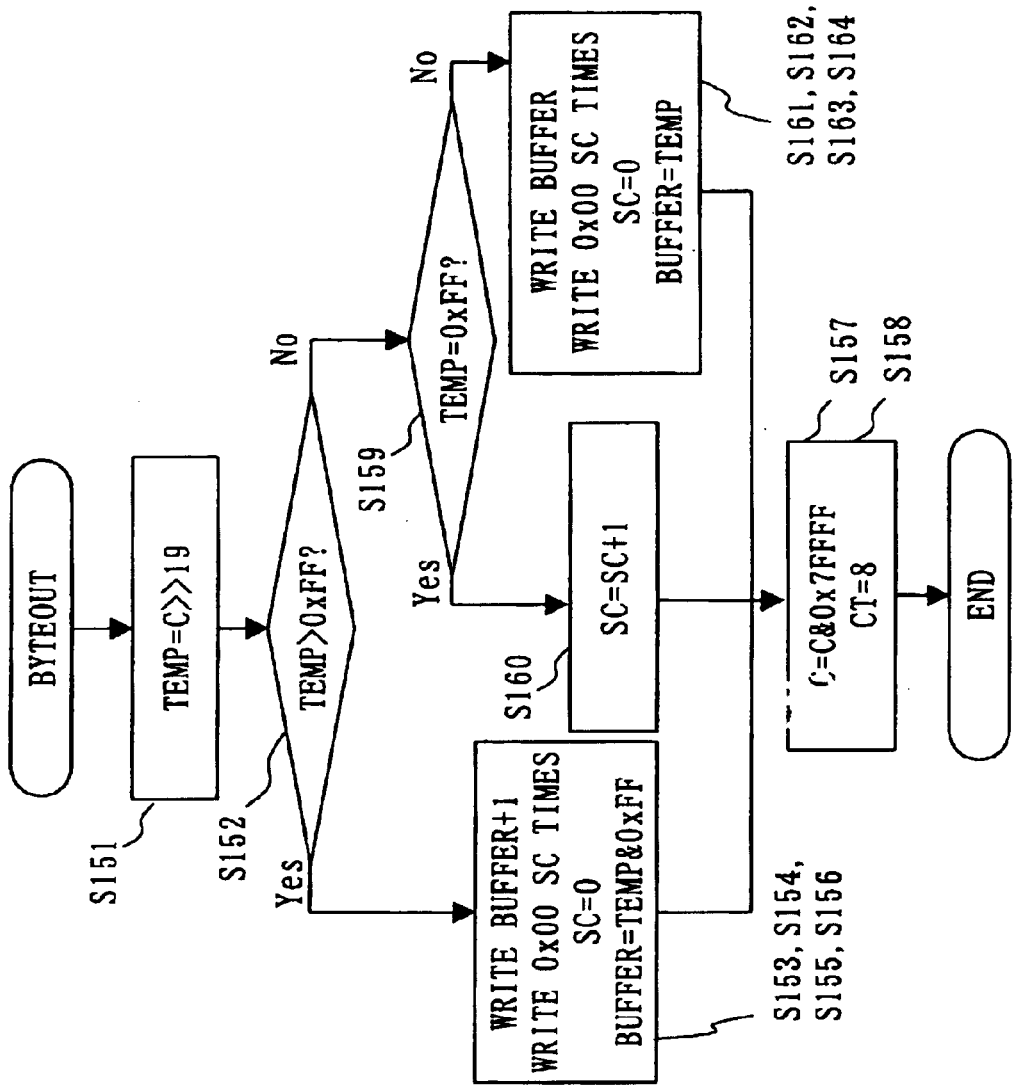
FIG. 52 is a flowchart explaining a BYTEOUT process of the related art.

A case will be explained, in which the bit counter value is changed for measuring input/output timing of the code byte in the QM-Coder. For example, the initial value of the CT counter 50 is set to 11 (=3+8) (S176), which corresponds the sum of the bit lengths of the Cs register 33 and the Cb register 34, in the INITENC processing flow shown in FIG. 53. (a) in FIG. 14 shows this status. Due to the renormalization, when the uppermost bit of the Cx register 32 at the starting time of encoding becomes the uppermost bit of the Cb register 34 by shifting with 11 bits (S176, the initializing unit), 8-bit data of the Cb register 34 is output as the code byte in the BYTEOUT processing flow in FIG. 52. Hereinafter, similarly, the Cb register 34 outputs the code byte as every 8-bit shift of the uppermost bit of the Cs register 33, which has not yet been output at this point, to the uppermost bit of the Cb register 34.

In FIG. 14, (b) shows a case in which the initial value CT is made less than 11. For example, if the step of S176 of the INITENC processing flow of FIG. 53 is changed to CT=9, two additional bits are output in the code. In this case, before decoding, namely, at the final step of the INITDEC processing flow of FIG. 63, a new modification process is added, which specifies to read two more bits and discard the upper two bits of the code. In this case, two bits pushed out from the uppermost bit of the CHIGH register 38 after shifting are discarded.

In FIG. 14, (c) shows a case in which the initial value CT is made greater than 11. For example, if the step of S176 of the INITENC processing flow of FIG. 53 is changed to CT=13, two bits are lost from the code at outputting time. In this case, a new modification process is added, which specifies that after compensating the upper two bits of the code to the initial value of the C register 30B set at the initial step of the INITDEC processing flow of FIG. 63, to shift by 8 bits. Then, the code data is started to read. The compensated 2-bit data should be the two bits lost in the encoder. The compensation of the code bit can be applied to a case in which the code range becomes extended to the integer part by providing the initial value to the C register 30A.

In either case, the initialization of the C register 30B terminates at the time that 16 bits of the CHIGH register 38 have been filled with the normal code bits.

In another way, regardless to the value of the CT counter 50, the same effect can be obtained by appending additional dummy data to the code. The decoder can never decode the code correctly unless the decoder could remove the additional dummy data. The additional dummy data can be inserted at the top, the middle, or anywhere as long as the dummy data can be removed correctly. The additional dummy data can have meaningful contents, or it cannot have any meaning. Information related to the embodiment of the present invention may be added as the additional dummy data. It is easier to handle the additional dummy data by byte unit, because the operation of the counter 50 is not required. In case of the additional dummy data is added by bit unit, the operations of the CT counter 50 and the manipulation of an arbitrary bit of the code are needed.

As described above, the initial value of the CT counter 50 is changed from the foregoing related art. Only authorized user can share the changed values, which enables to obtain the properly decoded data. If the unauthorized user tries to access the data, only decoded data with decoding error is provided. This can be said in case of inserting the dummy data in the code.

Next, a case will be explained, in which the value of the stack counter for storing the number of bytes '0xFF' subsequent to the BUFFER, which is not byte of '0xFF', during the encoding process. For example, the initial value of the SC counter 52 is 0 in the INITENC processing flow of FIG. 53, and the code sequence is output as shown by (a) in FIG. 15. The first byte is removed at step S183 in the FLUSH processing flow of FIG. 54. In the INITENC processing flow of FIG. 53, the initial value of the SC counter 52 is set to an integer which is greater than 0, the additional code byte SC byte is appended to the first byte as shown by (b) of FIG. 15. This appended additional byte has to be removed at the starting time of decoding in the INITDEC processing flow of FIG. 63.

In another way, the code byte to be inserted can be exchanged, meaningful information is embedded in the code regardless of the shared information, and the code is sent. In this case, the meaningful information can be in either form of that the information can be used as it is, or that the information is encoded or encrypted.

An example case in which the initial values of the C registers 30A, 30B, the A register 31, the CT counter 50, the SC counter 52 are changed will be shown in the following, referring to the INITENC processing flow of FIG. 16, the FLUSH processing flow of FIG. 17, and the INITDEC processing flow of FIG. 18. The explanation will be mainly done with respect to operations different from the related art.

Figure 16:
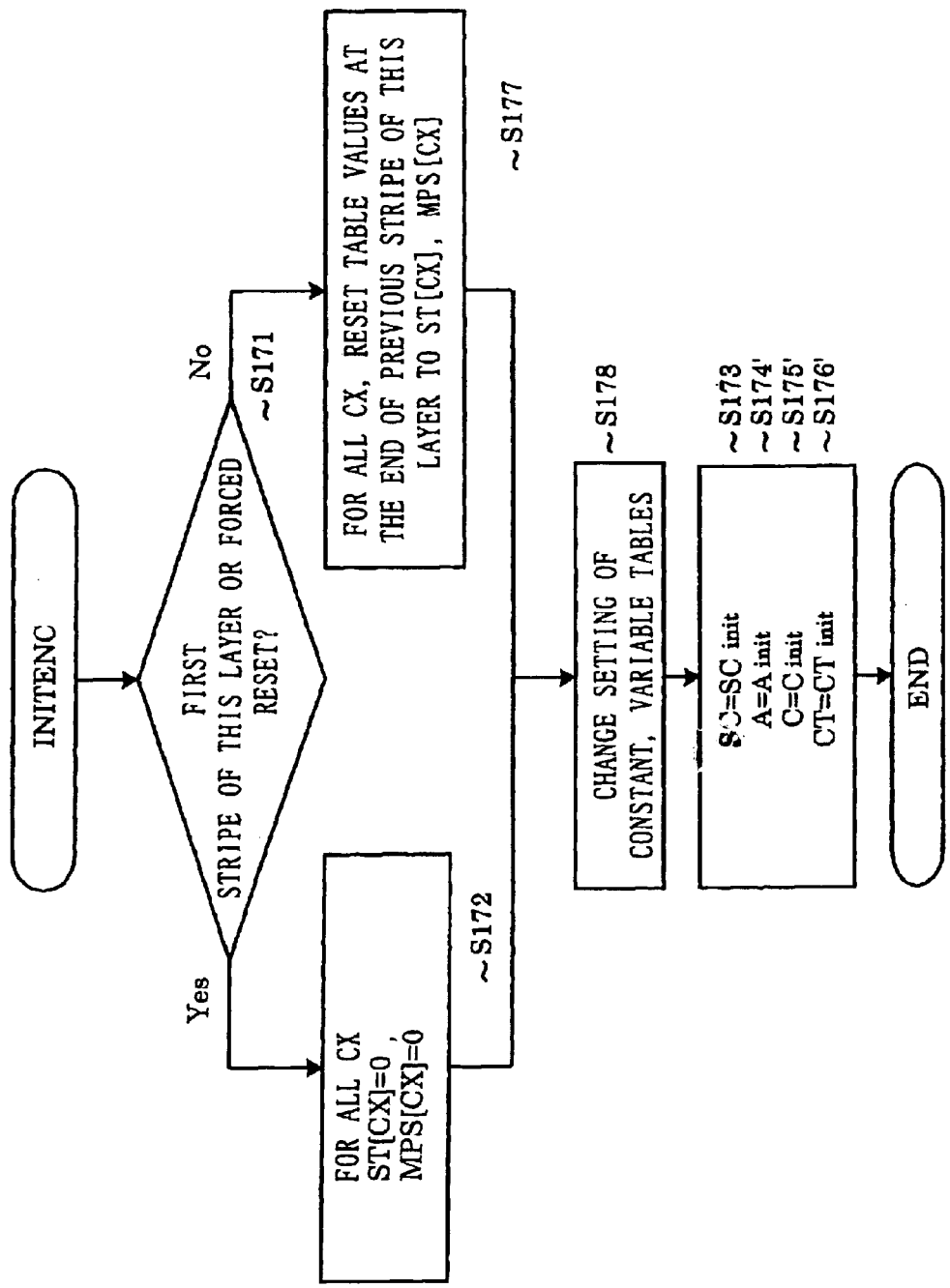
FIG. 16 shows a flowchart of an INITENC process according to the first embodiment.

In the INITENC processing flow of FIG. 16, S178 is to change the values of variable table and constant table, of which explanation will be done afterward. The values can be changed after the initialization implemented at step S178, if it is needed. Each of the initial values after change is SCinit, Ainit, Cinit, and Ctinit for each of the SC counter 52 at step S173', the A register 31 at step S174', the C register 30A at step S 175', and the CT counter 50 at step S176'. The code manipulating unit 531A shown in FIG. 2 manipulates the setting value of each register, counter, or table within the encoding unit 505.

Figure 17:
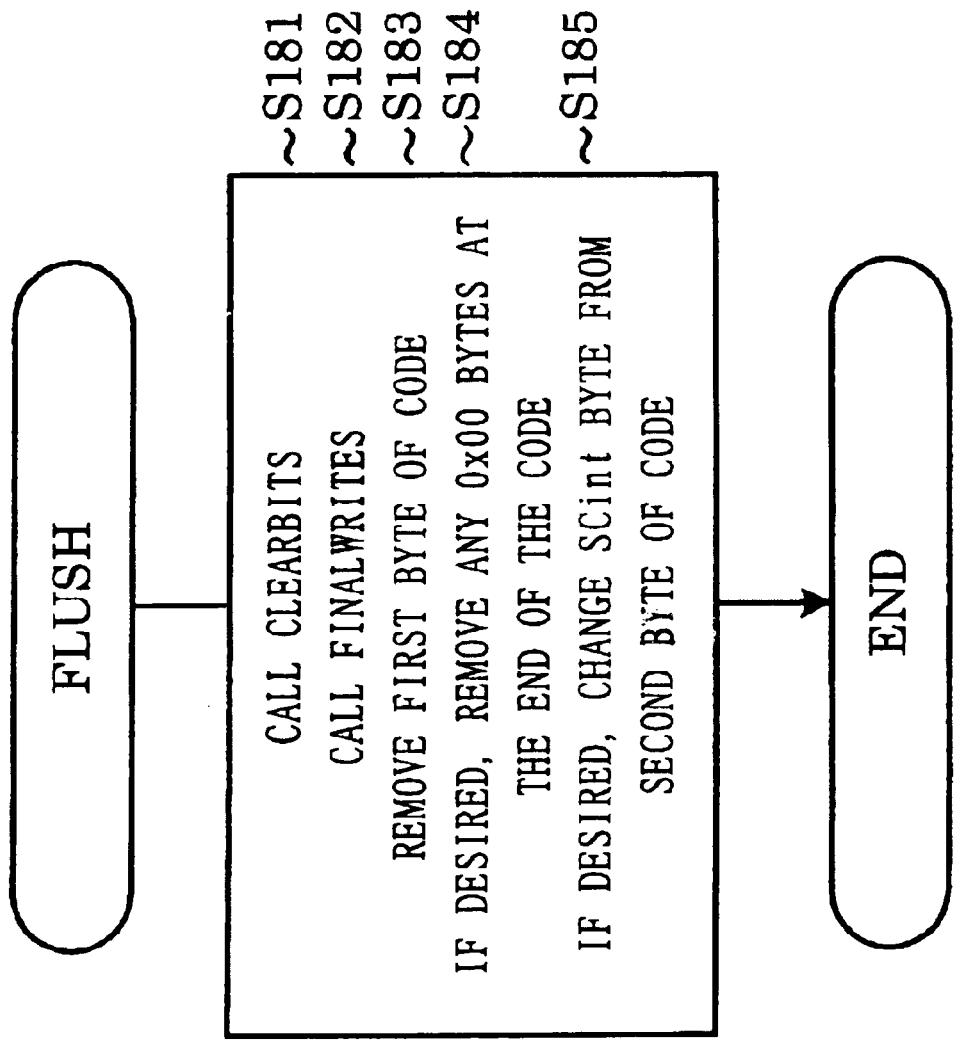
FIG. 17 shows a flowchart of a FLUSH process according to the first embodiment.

In the FLUSH processing flow of FIG. 17, the code byte to be additionally inserted can be exchanged at step S185 by changing the initial value (SC70) of the SC counter 52, if necessary. If not exchanged, the code byte becomes SC number of bytes 0xFF, and an insertion of the transmission control byte 0x000 is not considered.

Figure 15:
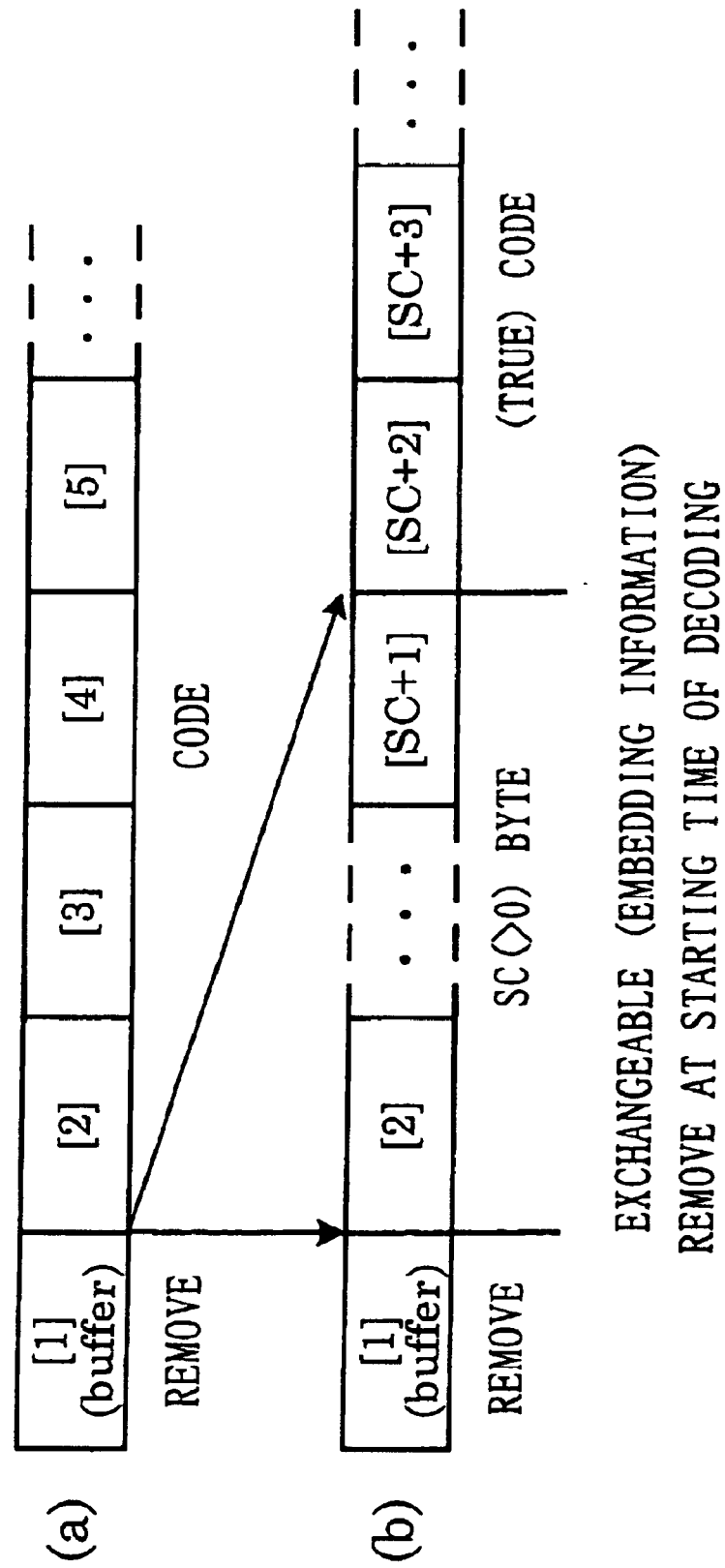
FIG. 15 explains a processing flow of an INITENC process according to the first embodiment.
Figure 18:
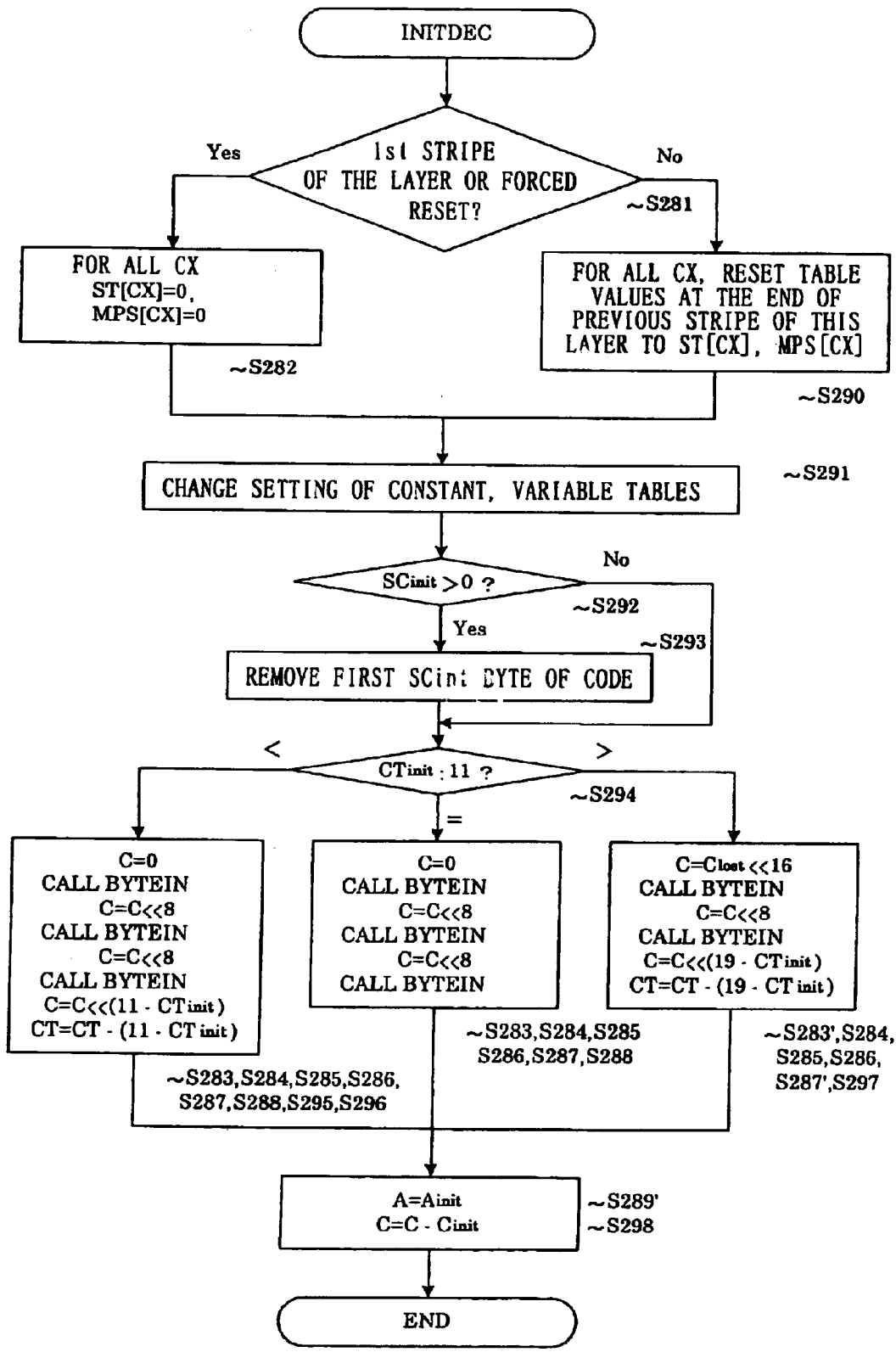
FIG. 18 shows a flowchart of an INITDEC process according to the first embodiment.

In the INITDEC processing flow of FIG. 18, S291 performs the same operation of change as performed at step S178 of the INITENC processing flow of FIG. 15. Hereinafter, in a new processing flow, the code manipulating unit 531B manipulates the setting values of each register, counter, or table within the decoding unit 509'. If SCinit, the initial value of the SC counter 52 is changed at step S292, the first byte SCinit of the received code is removed at step S293. When the meaningful information is included in the removed data, the information can be used separately. When the CTinit, the initial value of the CT counter 50 of the encoder side is changed at step S294, if the initial value is 11, the conventional processes from S283 through S288 are implemented. If the initial value is smaller than 11, after implementing the conventional processes from S283 through S288, the shift process is performed at step S295, the high order bits (11-CTinit) Clost is removed from the code, and the removed code is notified as shared information of setting. Upon implementation, if there is another register subsequently located at higher than the CHIGH register, only values of the CHIGH register 38 and the CLOW register 36 are masked. Then, at step S296, the number of shifted bits are subtracted from the CT counter 50. If the initial value is greater than 11, the code bit Clost, which is lost at sending time, is extracted from the shared information and compensated in the C register 30B at step S297, and the processes of S284 through S287' are implemented until the CHIGH register 38 is filled with the normal code bits.

At step S287', the number of shifted bits becomes less than 8 bits due to the compensated code bit, and at step S297, the value of the CT counter 50 is updated to the number of code bits remained in the CLOW register 36. Accordingly, at this point, the process of reading the code byte conventionally implemented at step S288 is not generated. After reading the code into the C register 30B, the initial value Ainit is set in the A register 31 at step S289'. Further, the number of bits of the initial value Cinit is subtracted from the CHIGH register 38.

The above processing flow of initial value has been explained by assuming Ainit+Cinit≦0x10000. When the sum of Ainit and Cinit exceeds '0x10000, the code bit of the integer part (the part of the register, which is located at higher than the initial value of the Cs register 33) to be lost should be compensated separately by some means as well as the compensation of the Cinit and the relation with the Ctinit. Further, it is also assumed that the range of the CTinit is 11±7. If the value of the CTinit exceeds the range, the number of reading code bytes of the C register 30B in the INIDEC processing flow of FIG. 18 should be changed by some means.

It can be considered that the total code length may be changed by encoding with changing the values set in the conventional encoder. This is obvious because the encoding is not implemented under the same encoding condition, and as a result, different code is generated.

Figure 54:
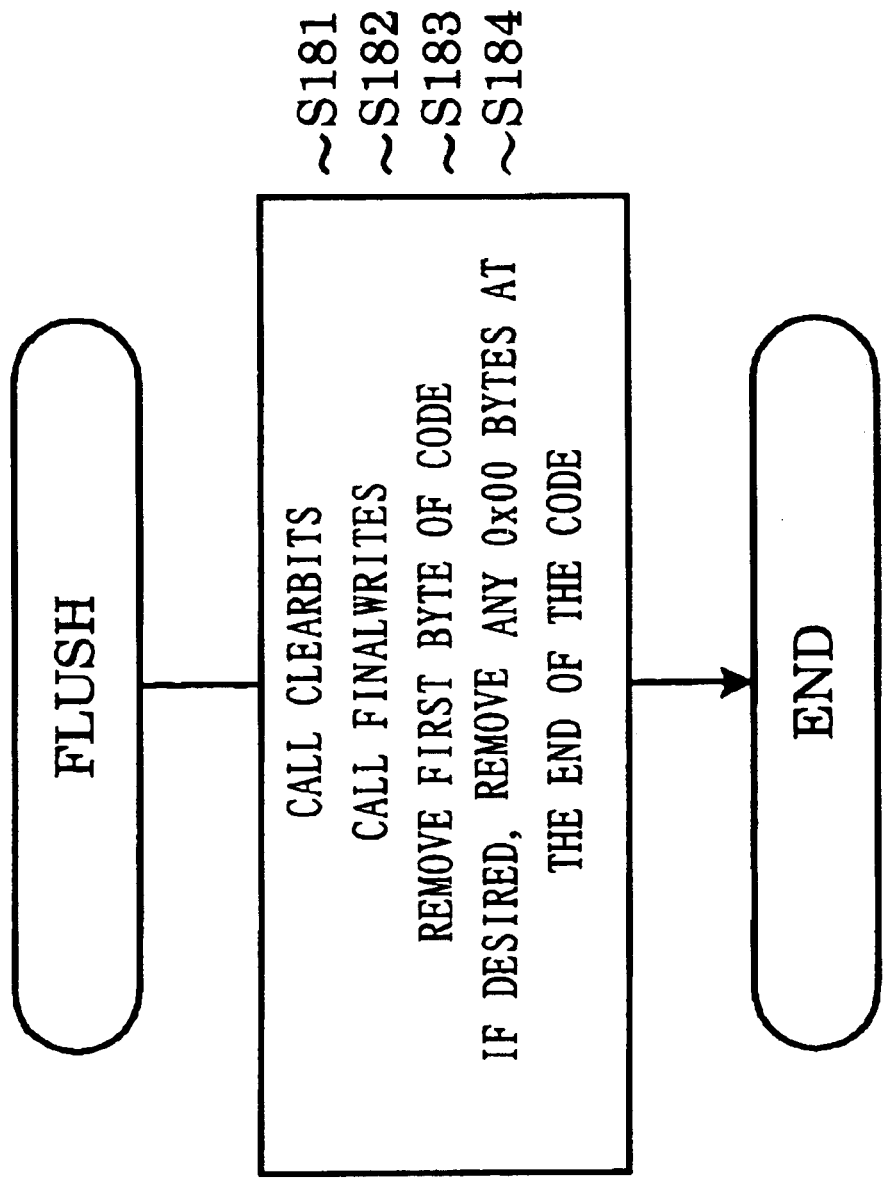
FIG. 54 is a flowchart explaining a FLUSH process of the related art.
Figure 55:
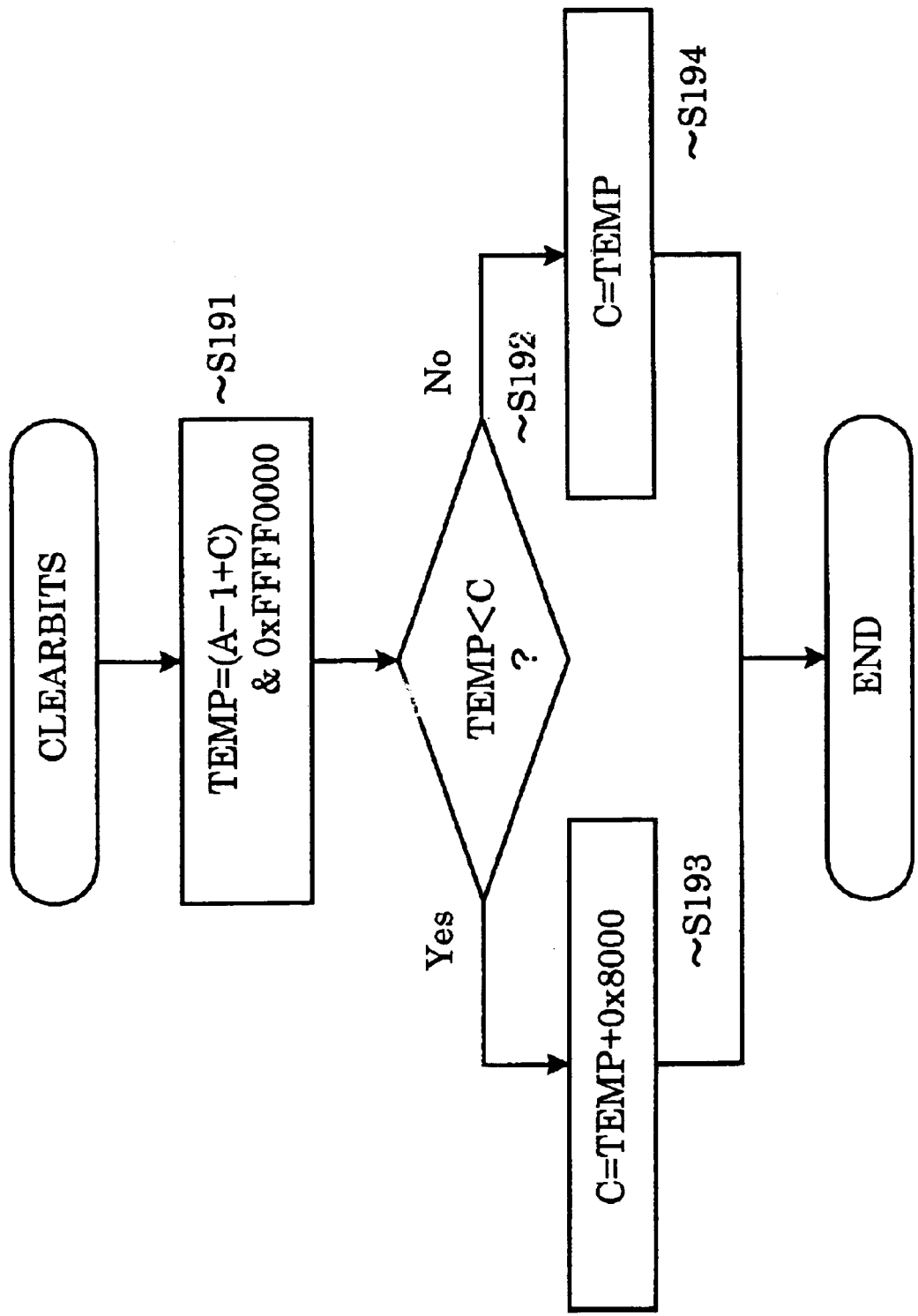
FIG. 55 is a flowchart explaining a CLEARBITS process of the related art.
Figure 56:
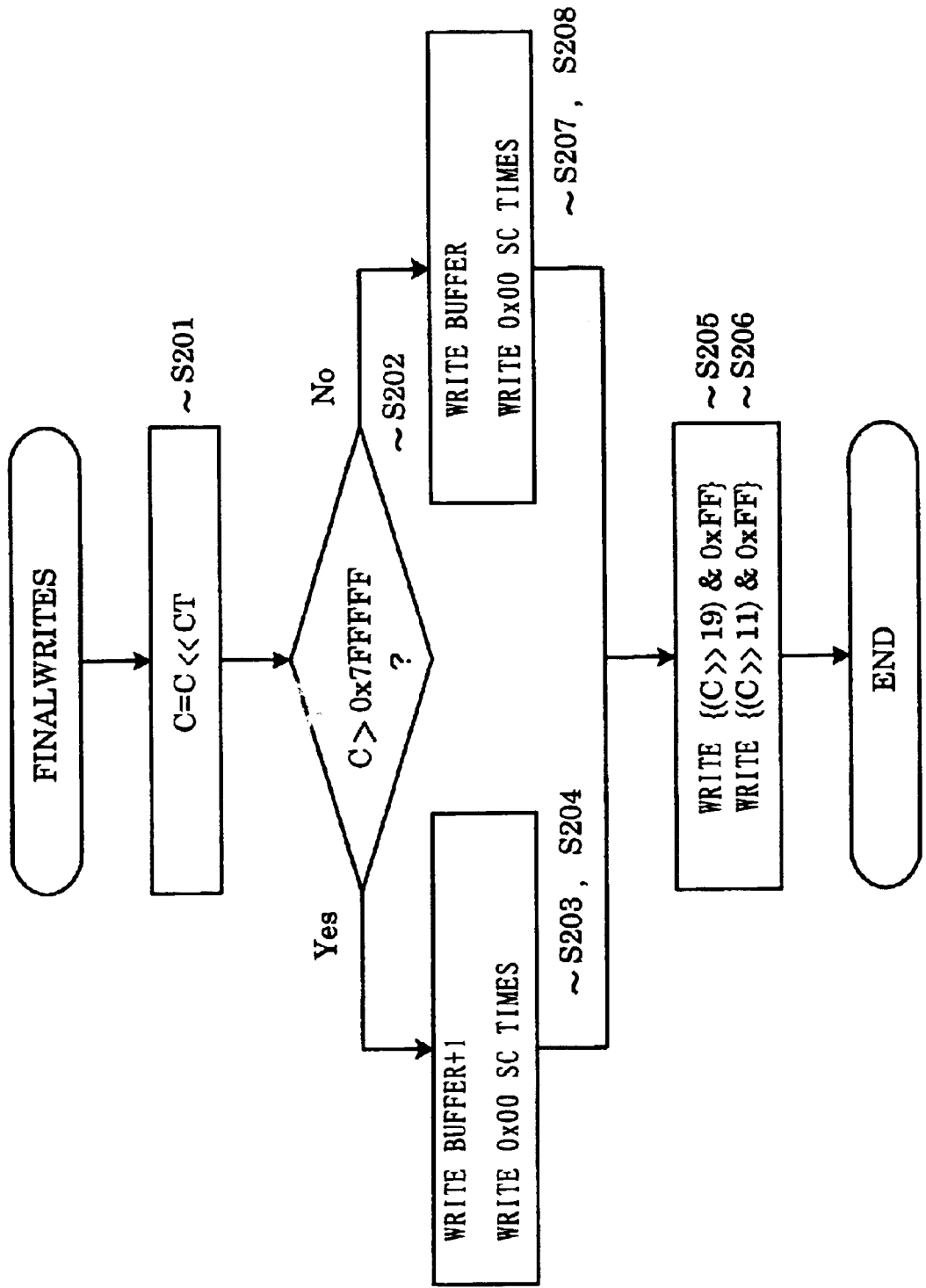
FIG. 56 is a flowchart explaining a FINALWRITES process of the related art.
Figure 57:
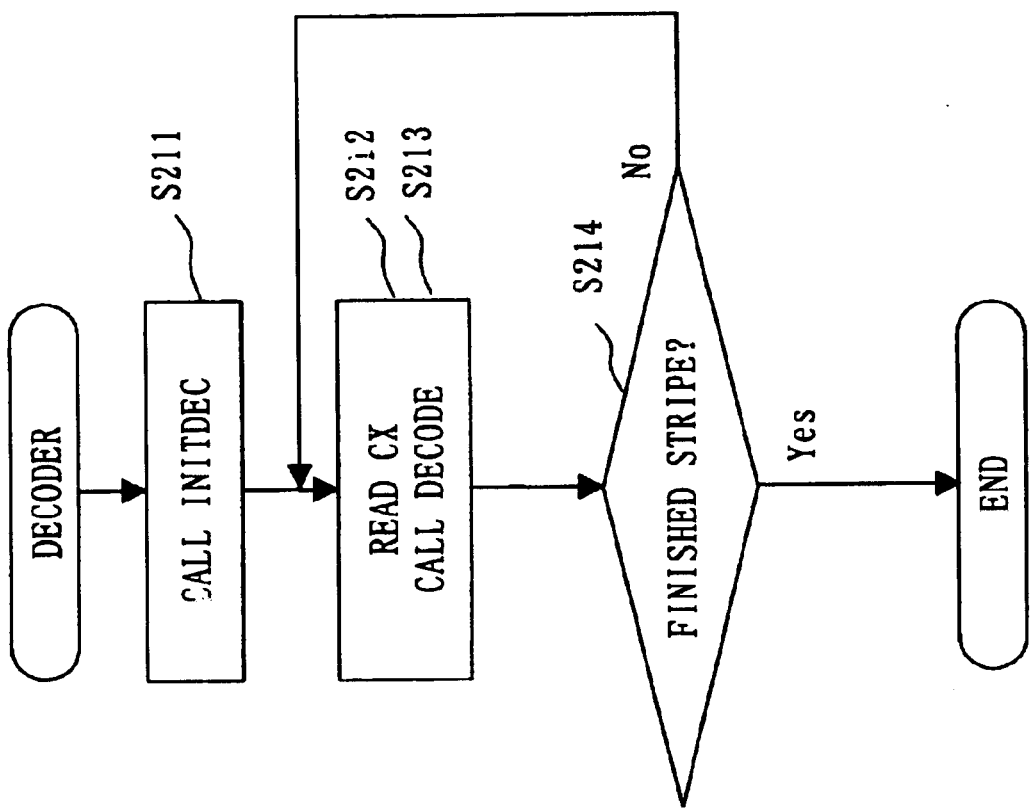
FIG. 57 is a flowchart explaining a DECODER process of the related art.
Figure 58:
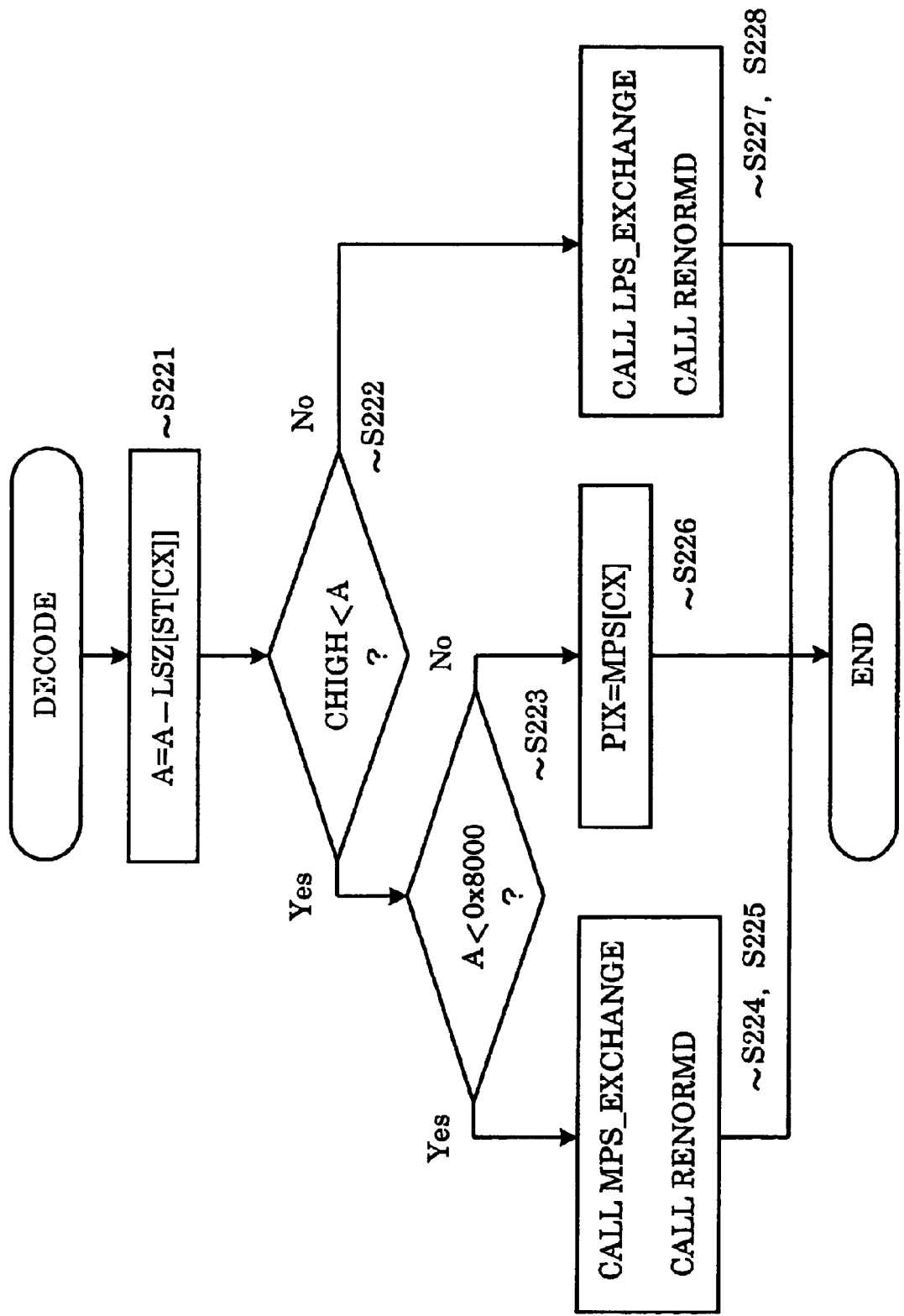
FIG. 58 is a flowchart explaining a DECODE process of the related art.
Figure 59:
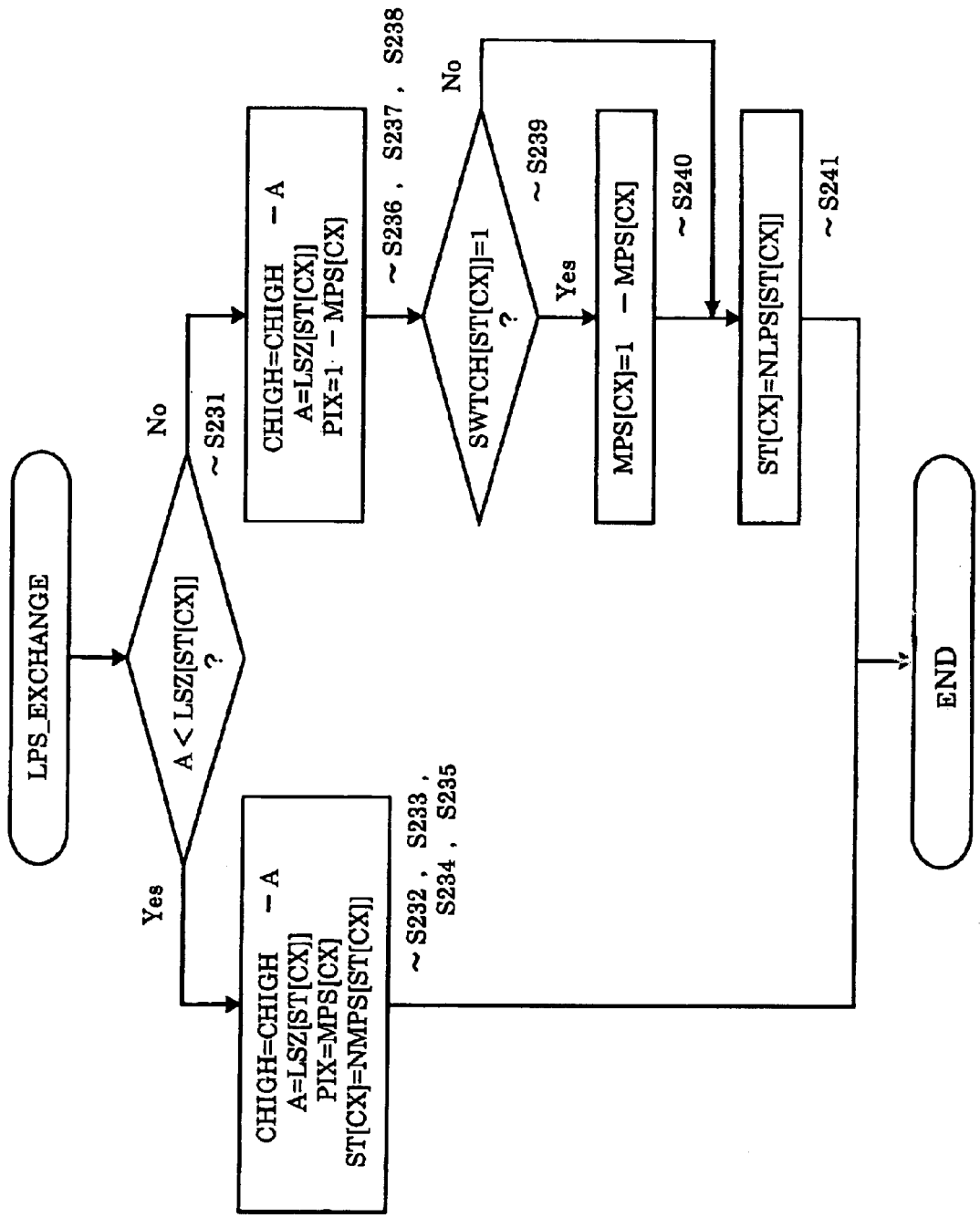
FIG. 59 is a flowchart explaining an LPS_EXCHANGE process of the related art.
Figure 60:
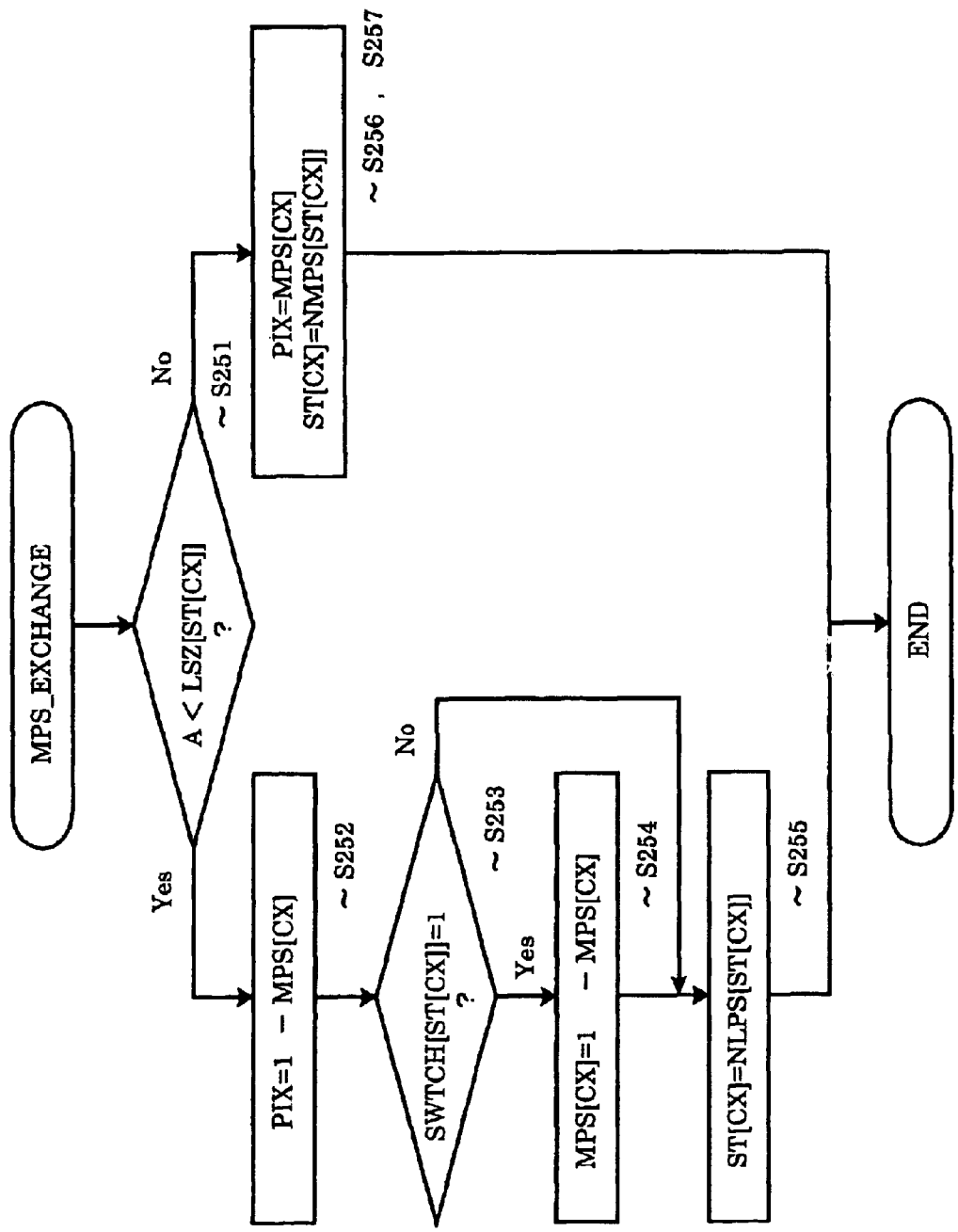
FIG. 60 is a flowchart explaining an MPS_EXCHANGE process of the related art.
Figure 61:
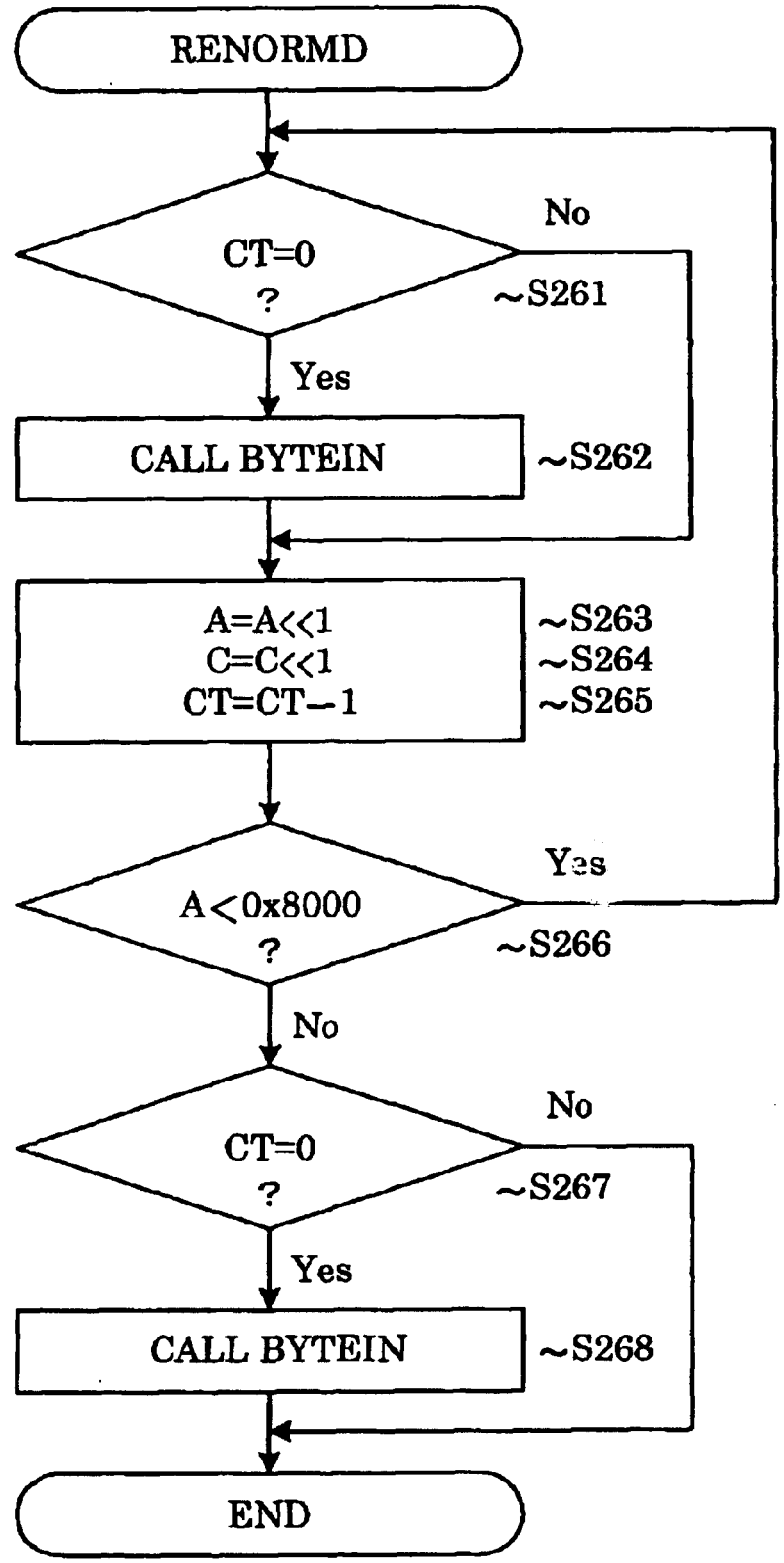
FIG. 61 is a flowchart explaining an MPS_EXCHANGE process of the related art.
Figure 62:
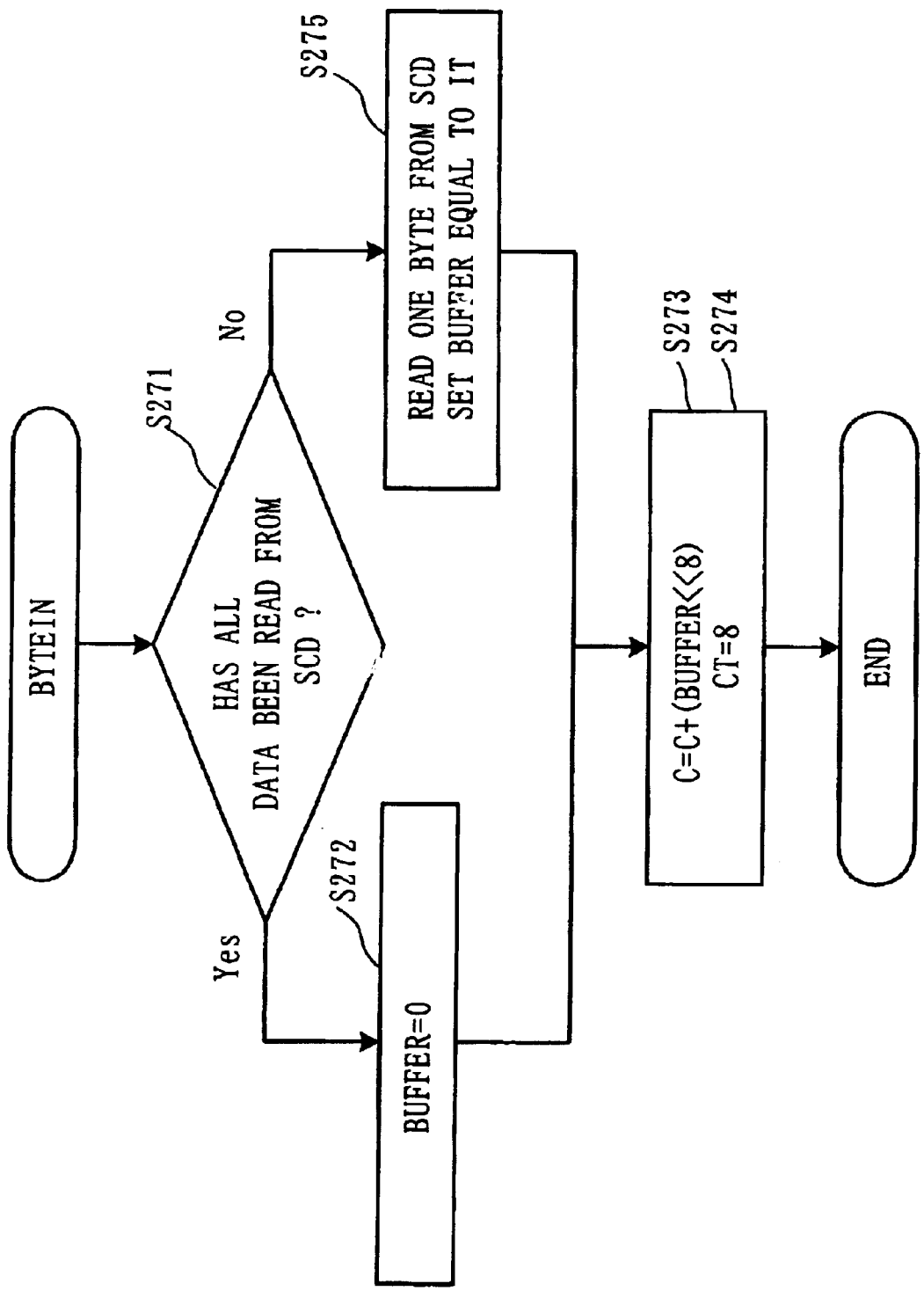
FIG. 62 is a flowchart explaining a RENORMD process of the related art.

In the QM-Coder, which has been explained as the related art, it is specified that '0x00' which succeeds the code is removed at step S184 of the FLUSH processing flow of FIG. 54, and '0x00' is added to the code when the number of codes is not enough at step S272 of the BYTEIN processing flow of FIG. 62. However, nothing is specified for a case in which the number of codes is more than needed. If the number of codes more than needed, a new process can be considered in which the code byte to the end of the code of the decoded image is skipped to read and is not referred to. However, the case in which the number of codes is more than needed is not specified even for a standard compliant decoder, which means the encoding/decoding process may be suspended/terminated in case of a certain installation form. Accordingly, it is desirable to add '0x00' to the code when the code encoded by the encoding method of the embodiment of the present invention is decoded by the conventional decoder. "The number of codes is not enough" means not only the code encoded by changing the setting becomes shorter than the code generated without changing the setting, but the number of bytes to be read becomes different. Accordingly, it is primarily desirable to obtain the data without remaining any of the code when the code is encoded by changing the setting and the code is decoded without changing the setting. Secondarily, it is also desirable to obtain the decoded data having the code length shorter than the code length of the decoded code by the conventional way without changing the setting.

In case of applying the embodiment to one of the encryption method for preventing the data from being reproduced improperly, it is not always necessary to avoid suspending/terminating of the conventional decoder due to the existence of an excess code. However, it should be noted that the arithmetic decoder itself does not have an error detecting function.

In the present embodiment, an example case in which the variable table has an initial value.

In the INITENC process of FIG. 42 and the INITDEC process of FIG. 62, at step S172 and S282, an initial value 0 is set in the variable tables for the status ST and for the prediction value MPS for all context. As encoding/decoding proceeds, the data becomes concentrated to the status or the prediction value adaptive to the occurrence status (occurrence probability) of the data by learning. The above initial value is set, assuming both of the binary data 0 and 1 may occur at the occurrence probability of ½. Accordingly, it takes a certain amount of time until the data is concentrated to the status and the prediction value of the occurrence probability by learning. Thus, when the registers are set to the values except the above initial values, the time required for concentration becomes shorter if the given value is closer to the value to be concentrated, and the time becomes longer if the given value is remoter. By giving an appropriate initial value based on the status and the prediction value, not only the time required for concentration, but also an error of the estimation probability becomes smaller. Accordingly, an encoding efficiency is increased and the shorter code can be obtained.

The above method of encoding is disclosed in, for example, the Japanese Registered Patent No. 2,891,818 "Encoding Apparatus", in which the efficiency of the encoding is increased by encoding with setting data to the initial value such as the above. According to this prior art, the data to be encoded is prescanned, and the same context is generated as the encoding process. The distribution of the values of data occurrence is acquired and processed statistically, and the data value whose occurrence probability is high is made an initial value of the prediction value. The encoding thereafter is performed using an initial value of the state obtained from the calculated occurrence probability. The encoding efficiency is thus increased. Further, according to the above prior art, when initial values of the state and the prediction value cannot be obtained from the prescanned data to be encoded, it is possible to obtain substitute data for the initial value from the accumulated data which is similar to the data to be encoded. Using this method, the data to be encoded can be shared previously without being notified by the transmission, which enables to increase the encoding efficiency.

In another way, when an initial value cannot be calculated based on the accumulated data, it is possible to encode by setting data which is result (values of the state table and the prediction table) obtained by learning with applying the data to be encoded or similar data to the encoding process which has been explained as a prior art, as an initial value.

At this time, such an initial value can be generated by repeating at plural times accumulating and learning a piece of data to be encoded or similar data, or an initial value can also be generated on average by accumulating/learning plural pieces of similar data.

In case of variable tables which are different from ones of the prior art, initial values can be supplied to all context or a part of the context as long as setting information can be shared between the encoder and the decoder. Or these values can be set by dynamically changing set values in the encoding/decoding process synchronously without setting as initial values.

obtain the data for the initial value for achieving the above effect, the occurrence probability can be precisely calculated from the data and set. It is easier to set the value resulted from prescanned data and learned once as the initial value. If it is difficult to prescan the data, the learned result of image data which has similar tendency can be replaced by previously sharing. At this time, the data for the initial value can be generated by repeatedly learning of one image plural times, or generated by learning of plural images on average.

The initial value which is different from the conventional method can be given for all the contexts as long as the setting information can be shared between the encoder and the decoder. In another way, if the load due to notifying becomes too large, the initial values can be supplied to only a part of the contexts. Further, to change the value is not limited to setting the initial values, but it can be during the encoding/decoding process by synchronized setting the values for encoding/decoding process.

In another way, the context, which is an index for the variable table, is changed by switching the reference pixel for the model template of FIG. 42. By increasing the number of the reference pixels in appropriate part of the variable table as long as the scale of the table permits, the encoding effect can be improved. As for selecting the reference pixel, the pixel which has high correlation should be selected such as the pixel departed by Dither cycle such as Dither image.

The QM-Coder has an adaptive template function for changing one particular reference pixel, but the standard template is applied to the data unless the change information is notified using a predetermined marker. Then some notification indicating the predetermined marker, the proper template is notified by the shared information according to the embodiment of the invention, and further, the pixel which cannot be changed by this conventional method can be changed, or the position of plural reference pixels can be changed according to the embodiment of the invention.

The template of FIG. 42 is optimized for the binary image encoding, and another context is generated based on another rule for encoding other data. In such a case, the pixels can be changed by shared information.

The following explains a case in which the value of the constant table is changed in the QM-Coder. The total code length may be changed by changing the value of the conventional encoder. For example, in FIG. 43, if a certain LSZ is made small, the occurrence probability of the LPS is estimated small. However, an actual LPS occurs more frequently than the estimated occurrence probability, so that a larger amount of renormalization (estimated value of the extended shifting bit) becomes necessary. If the LSZ is made large, the estimated probability is estimated large. The actual MPS occurrence probability is estimated small, so that the effective region becomes soon smaller, which frequently requires renormalization process. In particular, as the estimated value becomes different from the actual value, the number of shifting bits increases and accordingly the code length becomes long.

Further, the same effect can be obtained by changing the values of the NMPS, NLPS tables, which specify the designation of the transition to the next state synchronously implemented with the renormalization, because this change can be assumed as an indirect change of the LSZ value.

The conventional table values are basically optimized, so that changing values may not decrease the encoding efficiency largely unless changing values by a great amount. To generate a decoding error in the conventional decoder, which is an improper receiver, it is sufficient to change the LSZ value by a small amount, and it can be expected to cover the decreased encoding efficiency by combining the changing method of the variable tables. All of the LSZ values need not be changed at the same time, and it is sufficient to change a part of the LSZ values. Further, as for other constant tables, the decoding possibility is guaranteed as long as the encoder and the decoder implement the same setting change, and if the decoding is performed by the conventional decoder, the decoding error occurs.

Changing the setting can be implemented not only at the starting time of the encoding/decoding process, but the values can be changed synchronously in the encoder and the decoder during the process.

Further, another case can be considered, in which the changing the setting is implemented by increasing or decreasing the number of states. In this case, the constant tables NMPS, NLPS are set so that the data should transit to the added status or from the added status to another status. Further, the constant tables NMPS, NLPS are set so that the data should not transit to the deleted status. As for this information of transition, the next status is selected to transit to the lower status if the estimation probability is LPS, and selected to transit to the upper status if the estimation probability is MPS. It is also possible to select one of plural sets of constant tables to which the conventional constant table is added.

In another way, a part of constant values is changed by computing the values at referencing to the initial constant value, the variable register value, the counter value and other constant table value. For example, LSZ can be set to N times ($N \leq \frac{1}{2}$) of the region range register A 31 at that time. Further, plural LSZ are provided, and the LSZ is selected and used according to the approximate size of the region range register A 31.

In the QM-Coder, LSZ, which is assigned by a fixed range referenced from the constant table, is the upper region, however, it can be assigned to the lower region. In this case, although the code value may change, the effective region range is not changed basically during the process. Therefore, the representative precision is the same, and the code length should be the same except the control signal on the transmission channel.

The following explains the processing flow.

Figure 19:
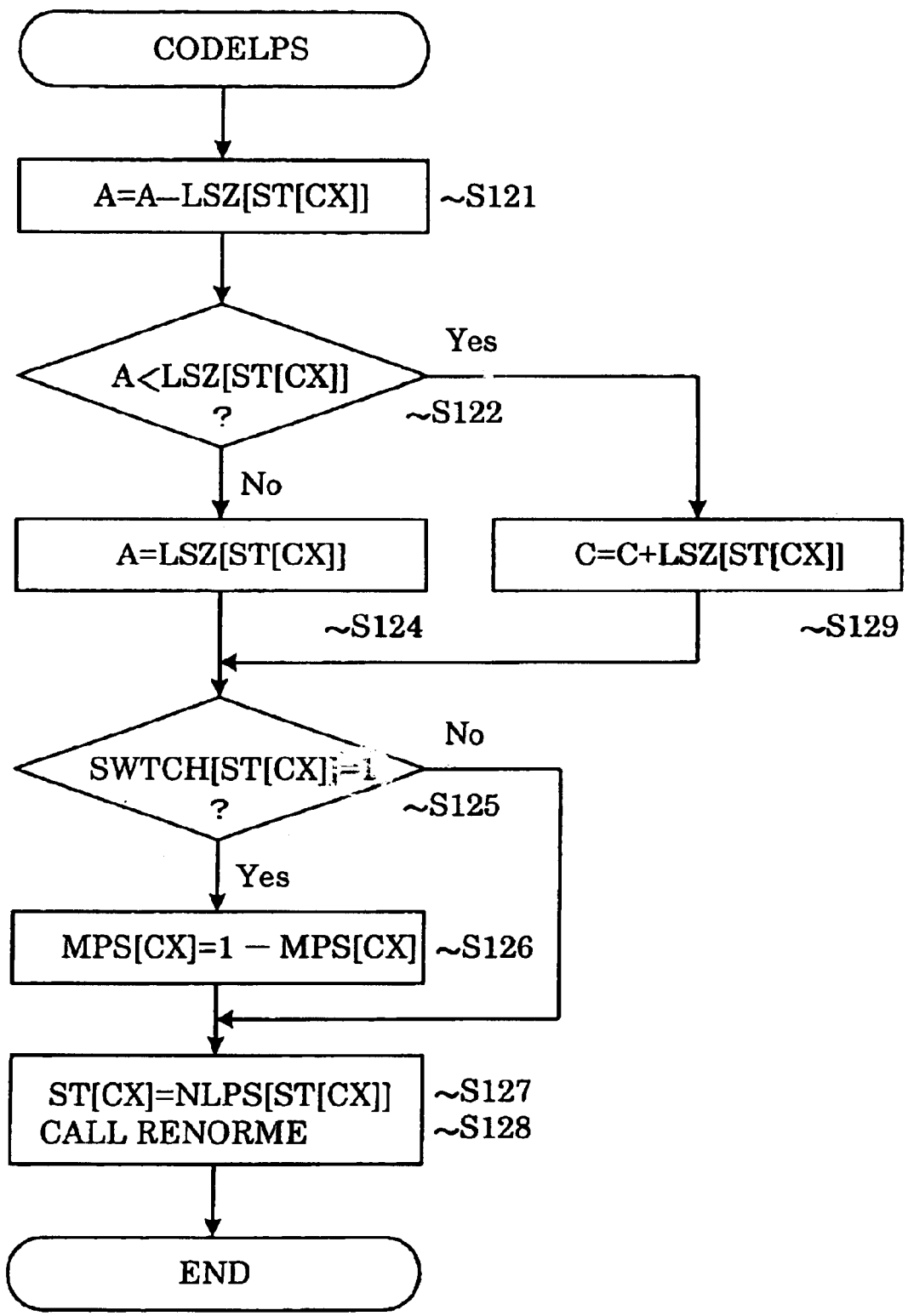
FIG. 19 shows a flowchart of a CODELPS process according to the first embodiment.

FIG. 19 is a flowchart showing CODELPS processing flow. The CODELPS is called for encoding LPS, namely, the mismatch is detected between the encoding pixel value 3 and the prediction value 7. In the present embodiment, the encoding rule 580A within the encoding unit 505' is modified as shown in the processing flow of FIG. 19, in which a step of S129 is added to the operation of the code manipulating unit 531A. That is, at step S121, the value of the A register 31 is temporarily updated to the upper partial region range. At step S122, if the lower partial region LSZ is not larger (No), at step S 124, the A register 30A is made to LSZ. If the LSZ is larger (Yes), the lower limit value of the information region is updated by adding the LSZ to the C register 30A at step S129. When the constant SWTCH value 12 equals "1" at step S125, the prediction value (MPS table) is inverted or updated at step S126. In LPS encoding, the state transition referring to the NLPS table 11 is performed at step S127. At step S128, the renormalization is implemented by calling RENORME.

Figure 20:
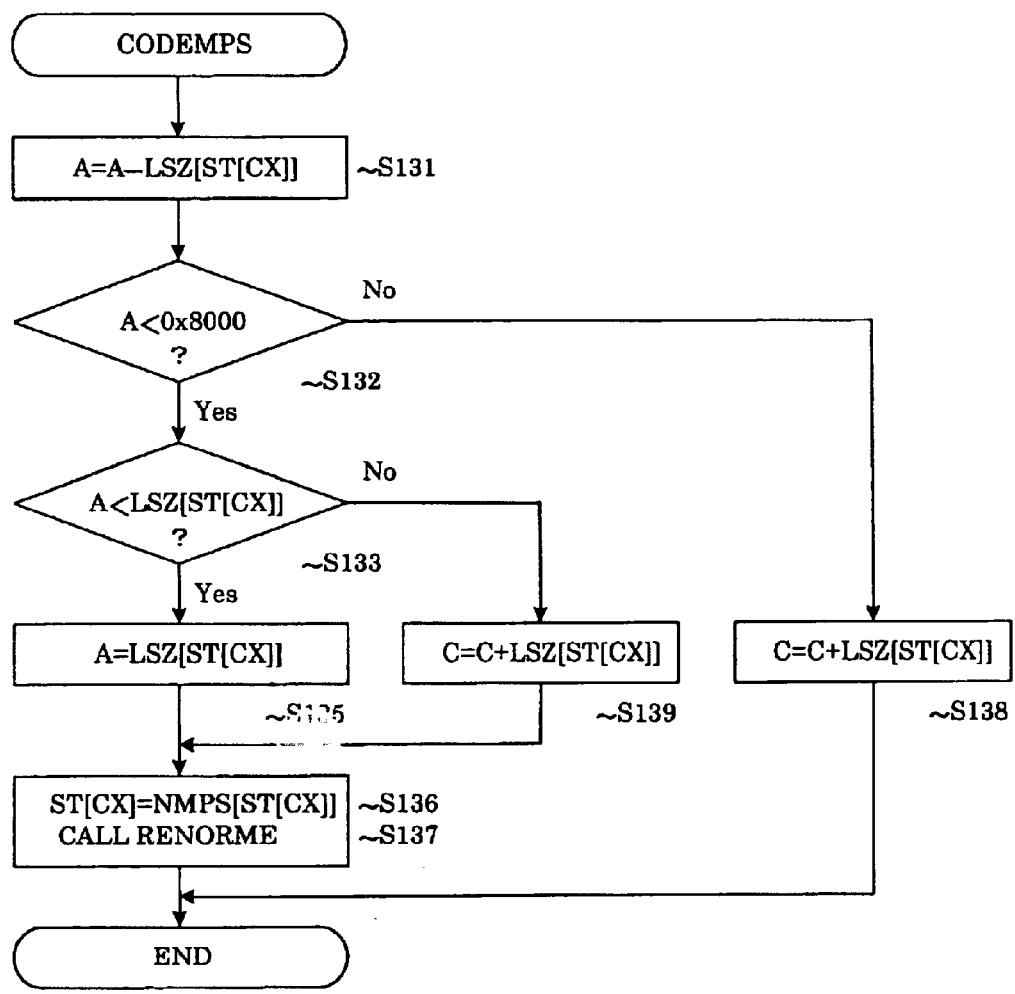
FIG. 20 shows a flowchart of another CODELPS process according to the first embodiment.

FIG. 20 is a flowchart showing CODEMPS processing flow. The CODEMPS is called for encoding MPS, that is, the encoding pixel value 3 matches to the prediction value 7. In the present embodiment, the encoding rule 580A within the encoding unit 505' is modified as shown in the processing flow of FIG. 20, in which steps of S138 and S139 are added to the operation of the code manipulating unit 531A. That is, first, at step S131, the value of the A register 31 is temporarily updated to the upper partial region range. If step S132 results in "No", at S132 the LSZ is added to the C register 30 A, the lower limit value of the information region is updated by the added result, and the CODEMPS process terminates with this step. If step S132 results in "Yes", the state transition is always implemented referring to the NMPS table 10 at step S136. And at step S137, the renormalization is implemented by calling RENORME. Before steps S136 and 137, at step S133, the lower partial region LSZ is larger (Yes), the A register 31 is made LSZ. If the LSZ is not larger (No),the LSZ is added to the C register 30A, and the lower limit value of the information region is updated by the added result.

Figure 21:
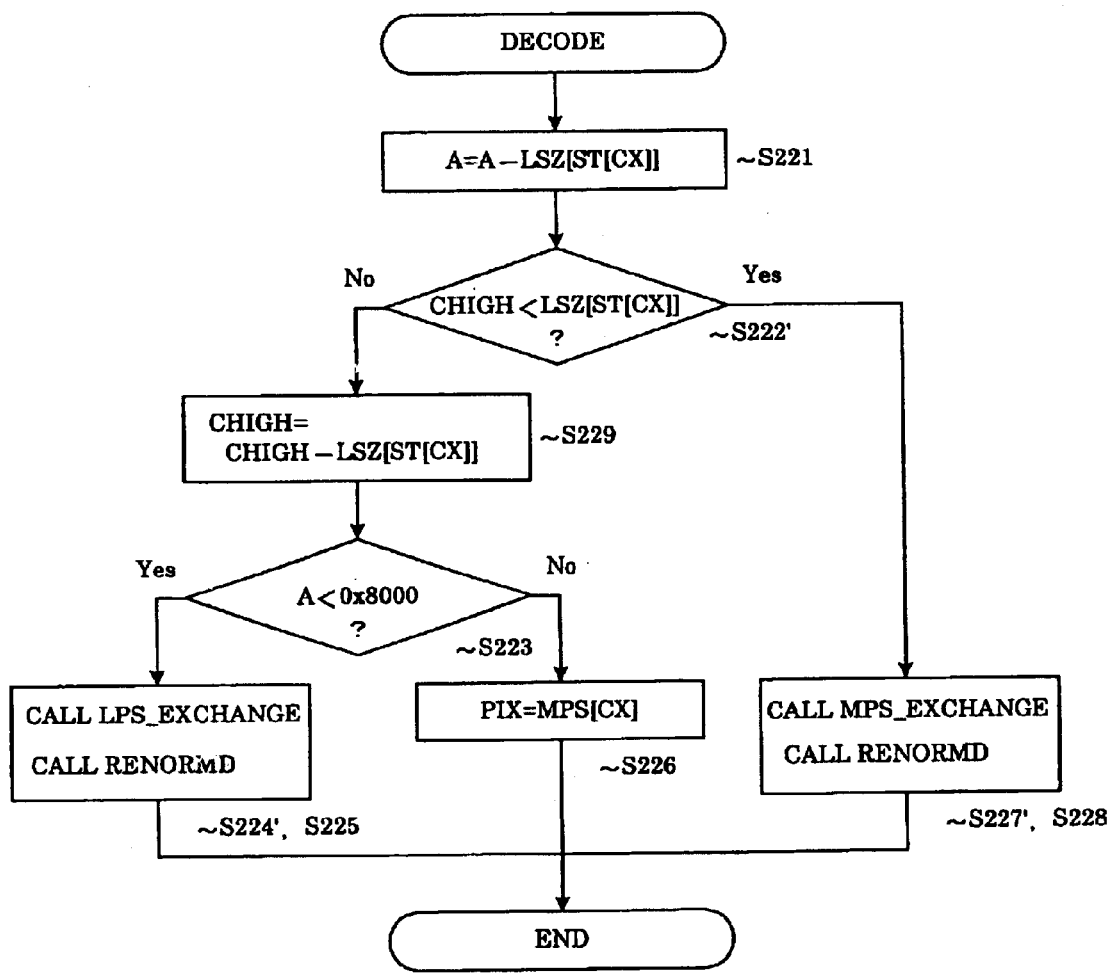
FIG. 21 shows a flowchart of a DECODE process according to the first embodiment.

FIG. 21 shows DECODE processing flow for decoding the decoding pixel. In the present embodiment, the decoding rule 581A within the encoding unit 509' is modified for the operation of the code manipulating unit 531B as shown in the processing flow of FIG. 21. That is, first, at step S221, the value of the A register 31 is temporarily updated by the upper partial region range. If step S222' results in "No", the upper partial region is decoded. First, at step S229, the range of the lower partial region range is subtracted from the CHIGH register 38. If step S223 results in "Yes", LPS_EXCHANGE is called at step S224' and RENORMD is called at step S225 to implement the renormalization. If step S223 results in "No", the MPS is decoded without implementing the renormalization, and the prediction value 7 is taken as the pixel value 3. If step S222 results in "Yes", the lower partial region is decoded. MPS_EXCHANGE is called at step S227' and RENORMD is called at step S228 to implement the renormalization. In the path for calling LPs_EXCHANGE and MPS_EXCHANGE, even if the decoding region is determined, it is impossible to know which should be decoded between MPS and LPS without detecting which region is larger, MPS or LPS. Accordingly, each pixel value 3 is determined by the called processing flow.

Figure 22:
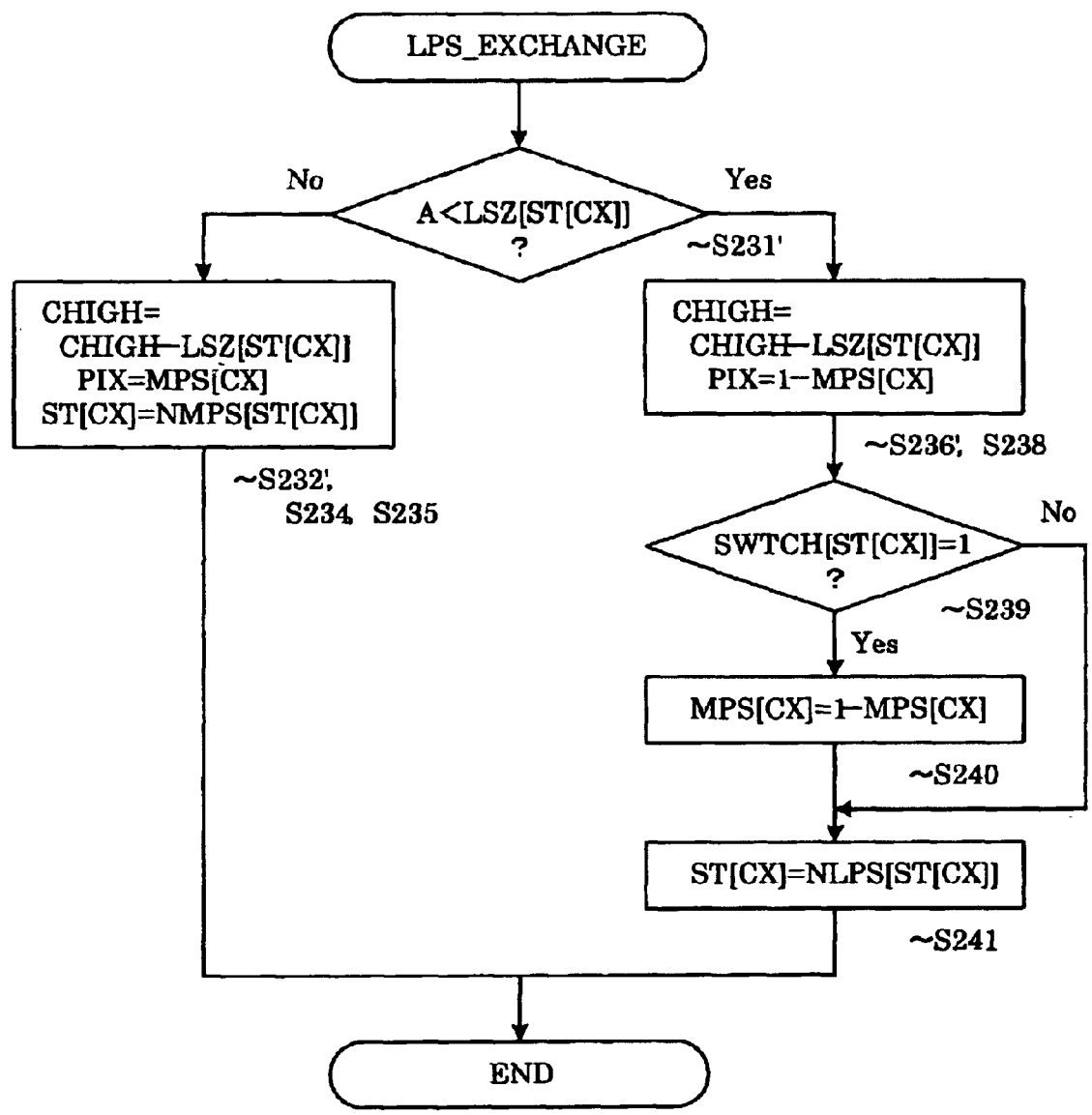
FIG. 22 shows a flowchart of an LPS_EXCHANGE process according to the first embodiment.

FIG. 22 shows LPS_EXCHANGE processing flow for decoding the upper partial region. In the present embodiment, the decoding rule 581A within the decoding unit 509' is modified for the operation of the code manipulating unit 531B as shown in the processing flow of FIG. 22. If step S231' results in "No", the MPS is decoded. At step S232', the range of the lower partial region is subtracted from the CHIGH register 38, and at step S234, the prediction value 7 is determined as the pixel value 3 without any change. At step S235, a state is moved to a next state by referring to the NMPS table 10. If step S231' results in "Yes", the LPS is decoded. At step S236', the range of the lower partial region is subtracted from the CHIGH register 38, and at step S238, non-prediction value "1−prediction value" is determined as the pixel value 3. If step S239 results in "Yes", the prediction value (MPS table) 7 is inverted or updated at step S240. At step S241, a state is moved to a next state by referring to the NLPS table 11.

Figure 23:
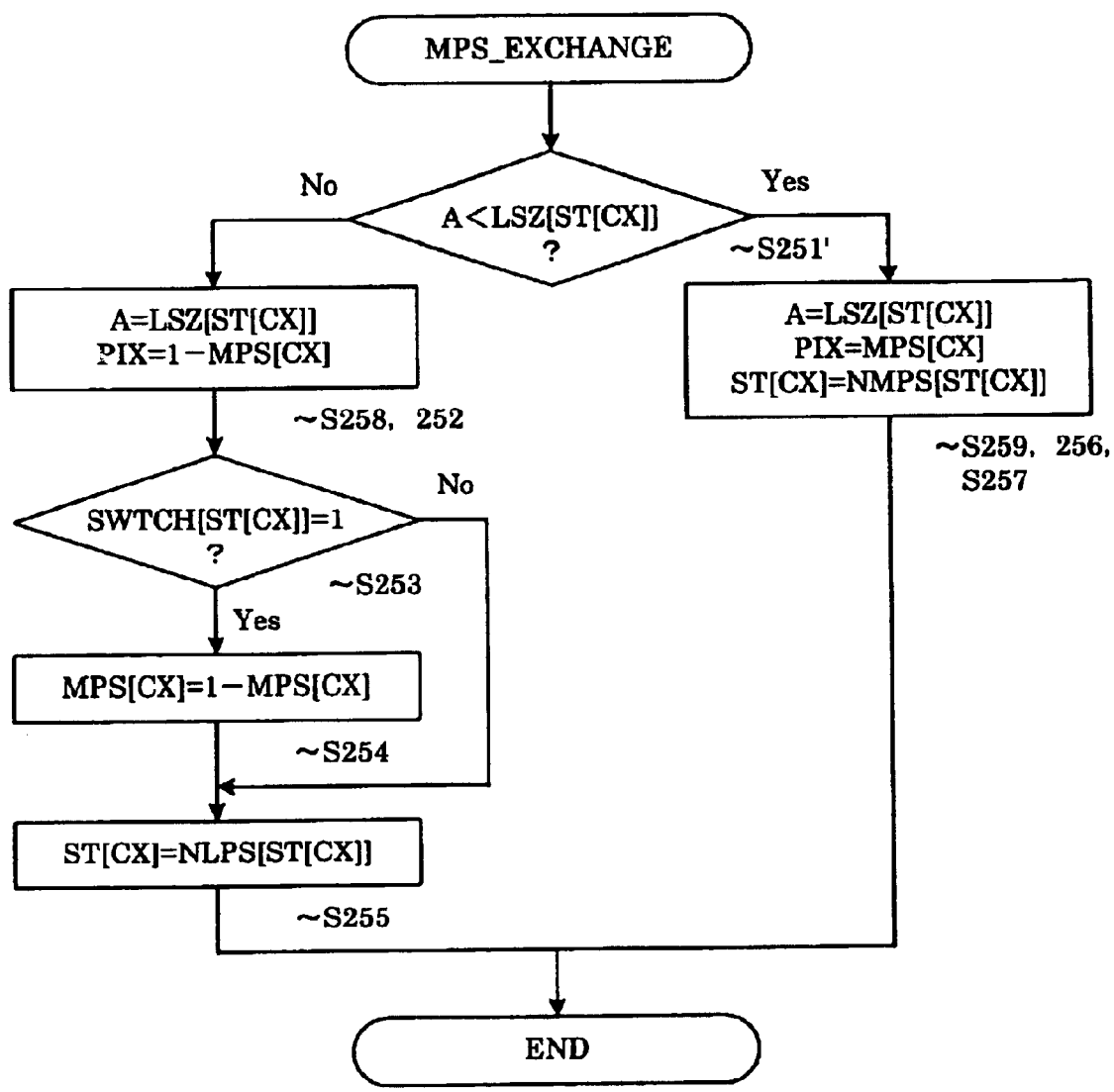
FIG. 23 shows a flowchart of an MPS_EXCHANGE process according to the first embodiment.

FIG. 23 shows MPS_EXCHANGE processing flow for decoding the lower partial region. Within the code manipulating unit 531B, the operation of MPS_EXCHANGE is also modified as shown in the processing flow of FIG. 23. If step S251' results in "No", the LPS is decoded. At step S258, the A register 31 value is updated by the lower partial region range LSZ, and at step S252, non-prediction value is determined as the pixel value 3. If step S253 results in "Yes", the prediction value (MPS table)7 is inverted or updated at step S254. At step S255, a state is moved to a next state by referring to the NLPS table 11. If step S251' results in "No", the LPS is decoded. At step S259, the A register 31 value is updated by the range of the lower partial region LSZ, and at step S256, the prediction value 7 is determined as the pixel value 3 without any change. At step S257, a state is moved to a next state by referring to the NMPS table 10.

The above encoding performed by switching the upper and lower partial regions of the LSZ of fixed size, and the conventional encoding can be switched at an appropriate timing. For example, in case of encoding the image data, the location can be switched at every N lines, or one is switched by N lines and the other is switched by M lines. Further, these switching can be operated by pixel unit instead of line unit. If the encoder and the decoder can share the change information, the operation can be switched more randomly.

ITU-T Recommendation T.82, which specifies JBIG method, also describes a typical prediction (TP) and a deterministic prediction (DP). These methods help to improve the compression ratio by eliminating the number of pixels to be encoded without encoding the pixels which satisfy the following conditions.

The typical prediction is that in case of hierarchical encoding, when corresponding pixel of lower layer and corresponding pixel of upper layer fill all particular requirements on the present encoding line, or in case of single encoding, when the present encoding line is the same with the previous line, a check symbol is encoded and a group of pixels to be encoded is not encoded. Here, another method can be considered that whether the typical prediction is applied is not defined in a header, but header notification and an inverse application is implemented by shared setting information.

The deterministic prediction is that in case of hierarchical encoding, when corresponding pixel value of the lower layer having lower resolution is determined by corresponding pixel value of the upper layer having high resolution, the encoder does not encode a target pixel, and the decoder does not decode and takes the determined value as the pixel value. Another method can be considered that whether the deterministic prediction is applied or not is not defined in the header, but the header notification and the inverse application is implemented by the shared setting information. Further, another method can be considered that even if whether the deterministic prediction is applied or not is notified by the predetermined header, in the check table (constant) of the deterministic prediction, the pixel, from which encoding is determined unnecessary, is changed not to be determined. Yet another method can be considered that without changing the check table, the deterministic prediction is not applied to a line or a pixel which fills a certain requirement.

The above check symbol encoding employed in the typical prediction is considered as one example of inserting/deleting the symbol, and the change of the check table employed in the deterministic prediction is considered as one example of the change of values of the constant table.

In the above, a method for implementing the quality control of the reproduction of the data and encryption by sharing the confidential setting information has been described. The application of the encoding method is not limited to the arithmetic encoding. The encoding and decoding described in this embodiment can be applied to not only the image, but various kinds of data such as sound or text.

The shared setting information can be the change information itself, or only information of confidentially added to the code is shared and the concrete setting of change can be specified indirectly by the information extracted from the code. Further, the change information can be shared in the status capable to be directly used, or in the status being applied to the encoding or encrypting. In the encoder and decoder of the embodiment, the change information is not notified at sending/receiving time of the code, but it is possible to use the predetermined change information. To set the change information can be made at the starting time of or during the process of the encoder or decoder as long as the operations of the encoder and the decoder can be synchronized. In another way, a priority is set based on the importance of the data construction unit, it is determined whether to implement the change or not, and sending sequence of the code is controlled.

The above operations have been explained using the configurational elements shown in FIGS. 1 through 5, and further, the same function can be obtained by constructing a computer program for general purpose with the equivalent steps to these configurational elements.

Embodiment 2

In the first embodiment, a simple encryption has been explained, in which the complete reproduction of the data can be implemented by sharing the change information. On the contrary, if the decoder which does not share the change information, the reproduction quality of the decoded result cannot be guaranteed.

On the contrary, the present embodiment guarantees complete reproduction to a partner which shares all the change information by confidentially changing a part of or all of the setting contents such as an encoding/decoding parameter for a general encoding method. Further, by partially sharing the change information, or encoding without changing partially, it is controlled so as to receive, reproduce, and obtain a part of or an outline of the data of which the reproduction quality is degraded even if the conventional decoder is used to decode without changing the setting. Yet further, it is possible to intentionally change the information so that the decoder cannot decode to understand even an outline of the data.

As for concrete operation, data to be encoded is divided into data construction unit, and the divided pieces of data are supplied to the first embodiment, the general encryption, and encoding without encryption. This makes an unauthorized decoder difficult to decode the data, and further, it makes possible to obtain various levels of reproduction quality when the data units are reconstructed by using various ratio of disclosure of the change information. The present embodiment provides various reproduction quality from one code by combining the disclosure ratio of the change information at sharing the change information with respect to various change for each data construction unit, and change of each data construction unit for plural data construction units.

The distribution of the data contents will be discussed.

If the copyright holder distributes data contents without encryption by collecting the royalty, an improper user may receive such data contents having the same reproduction quality without paying the royalty. This creates a necessity of protection of the copyright. However, if the data contents is distributed by applying a strong encryption technique to protect the copyright, only limited number of users can access the data. This creates another problem that may prevent the development of the data contents distribution business. Further, when the user wants to use such data contents, he cannot obtain enough information only by limited written document without seeing/hearing the actual product having detail. Accordingly, it becomes necessary to control the reproduction quality of the data, which is an object of the present embodiment.

Figure 24:
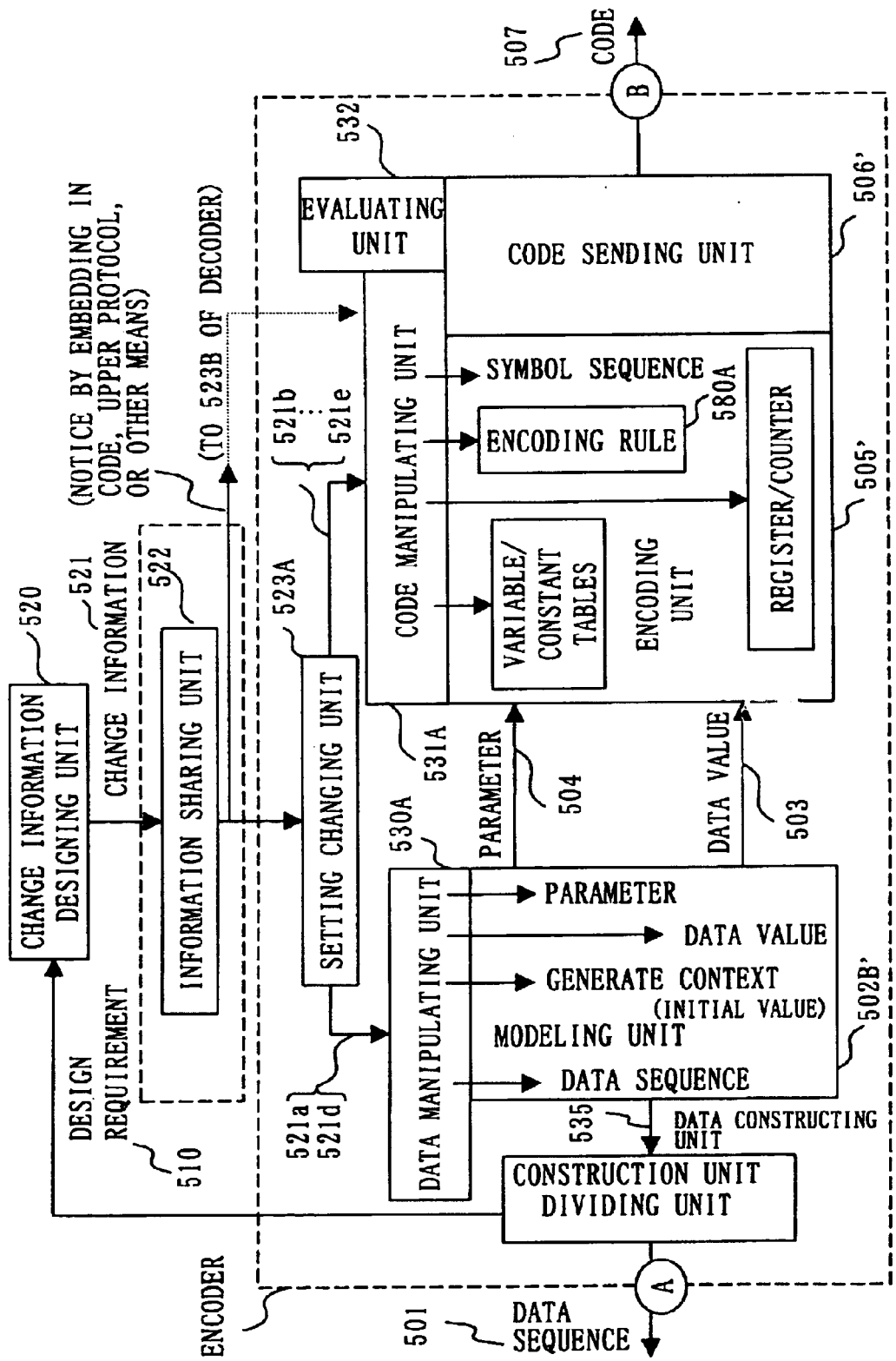
FIG. 24 shows a configuration of an encoder according to the second embodiment of the present invention.
Figure 25:
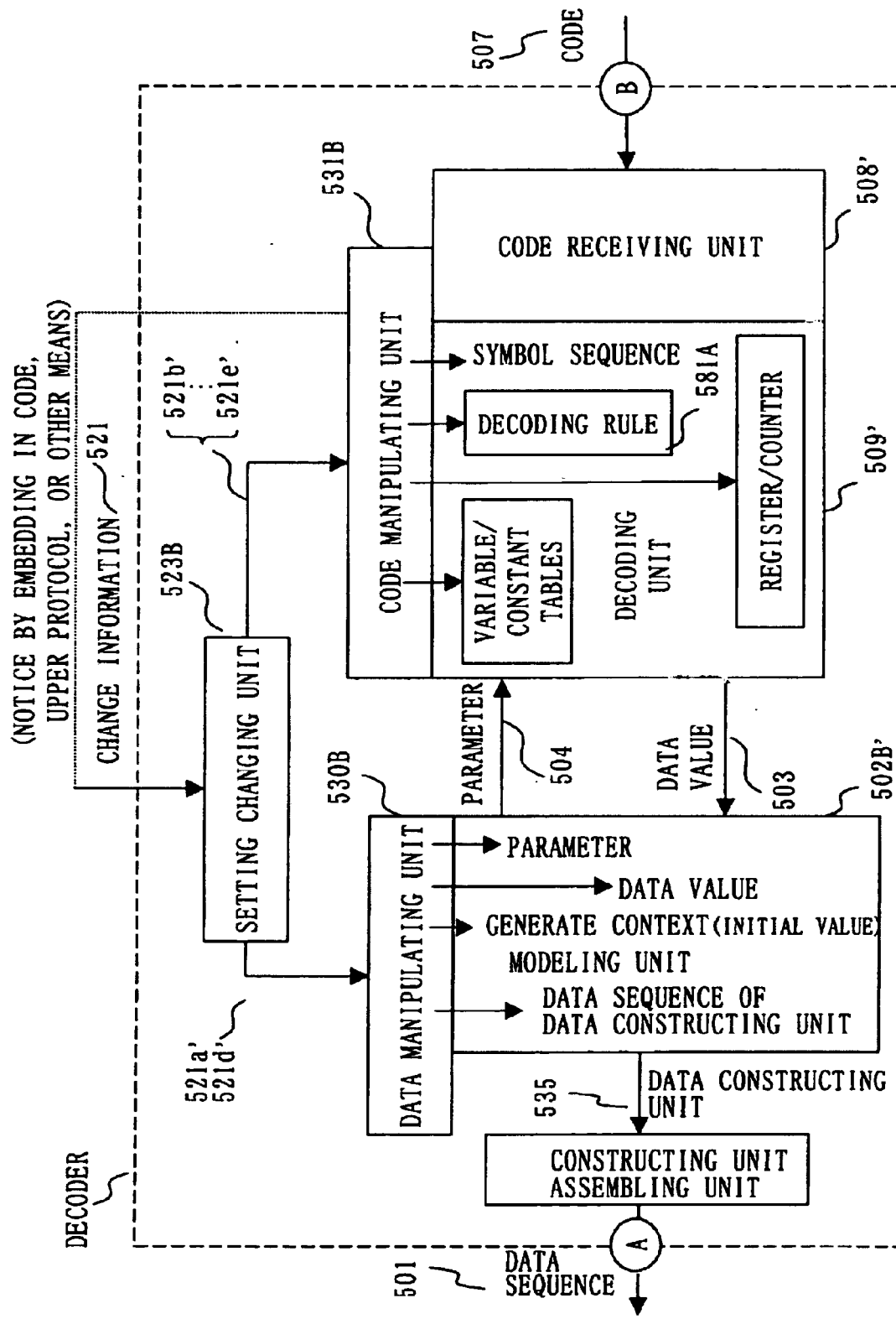
FIG. 25 shows a configuration of a decoder according to the second embodiment of the present invention.

FIGS. 24 and 25 are block diagrams respectively showing examples of the encoder and the decoder according to the embodiment. In this embodiment, a case in-which change information 521 is set for data construction unit 535, which is made by dividing the data into one or plural pieces, will be explained including a case in which the change information 521 is set to be shared by one encoder/decoder for whole amount of the data. The block diagrams of FIGS. 24 and 25 correspond to the configurations shown in the block diagrams of FIGS. 2 and 4 within the data manipulating unit and the code manipulating unit.

Figure 35:
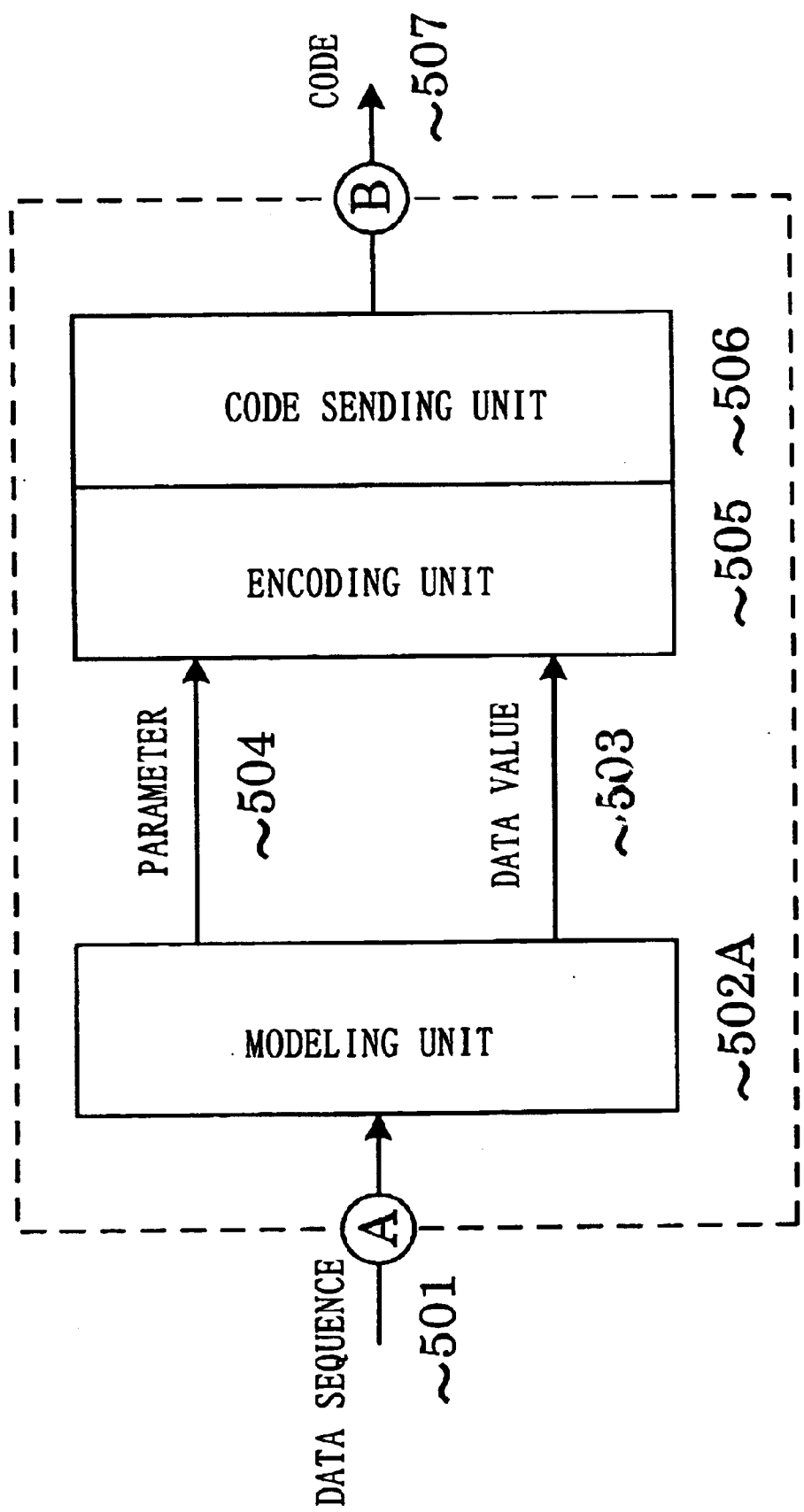
Figure 36:
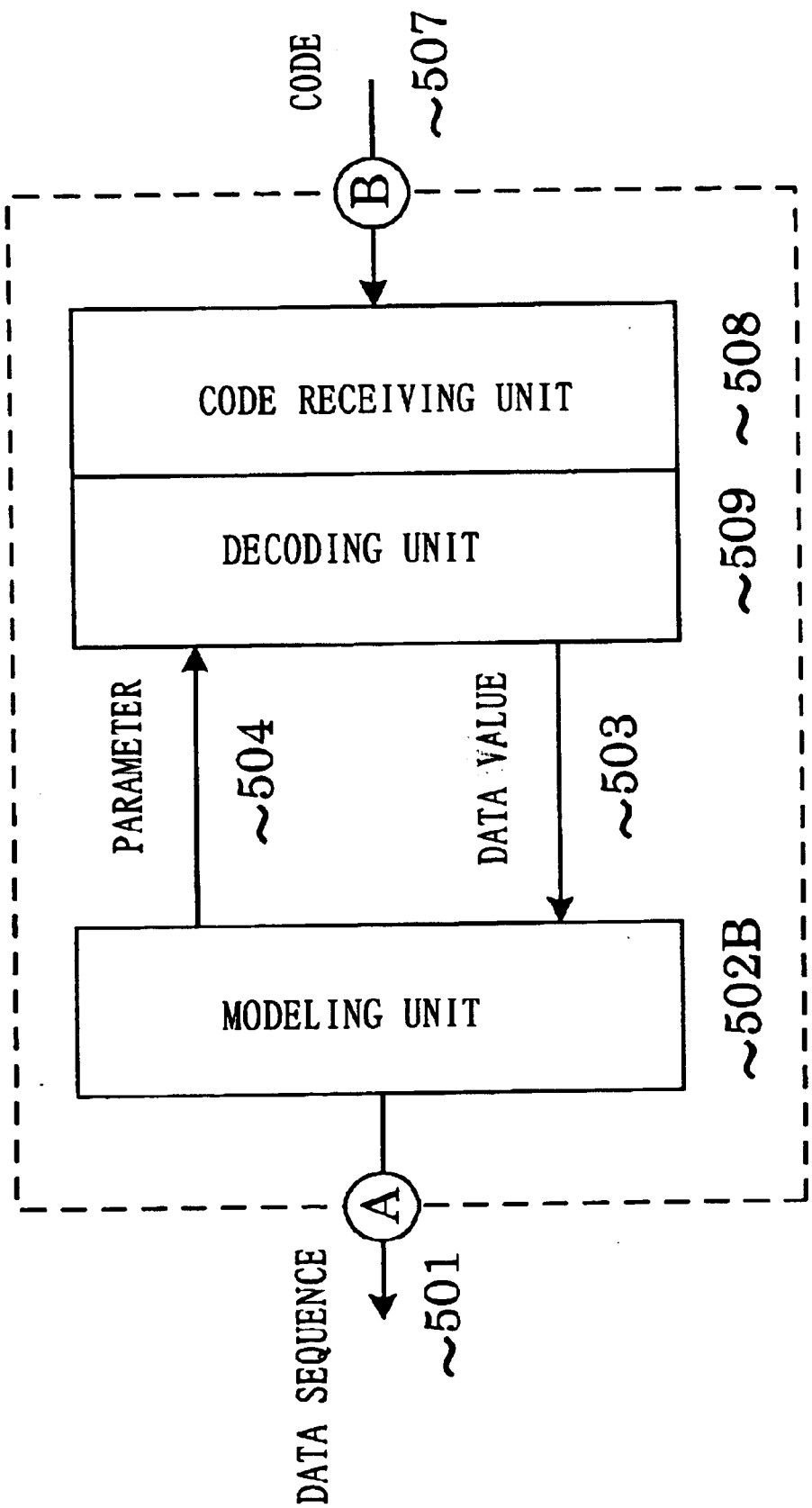
FIG. 36 shows a configuration of a conventional encoder.
Figure 37:
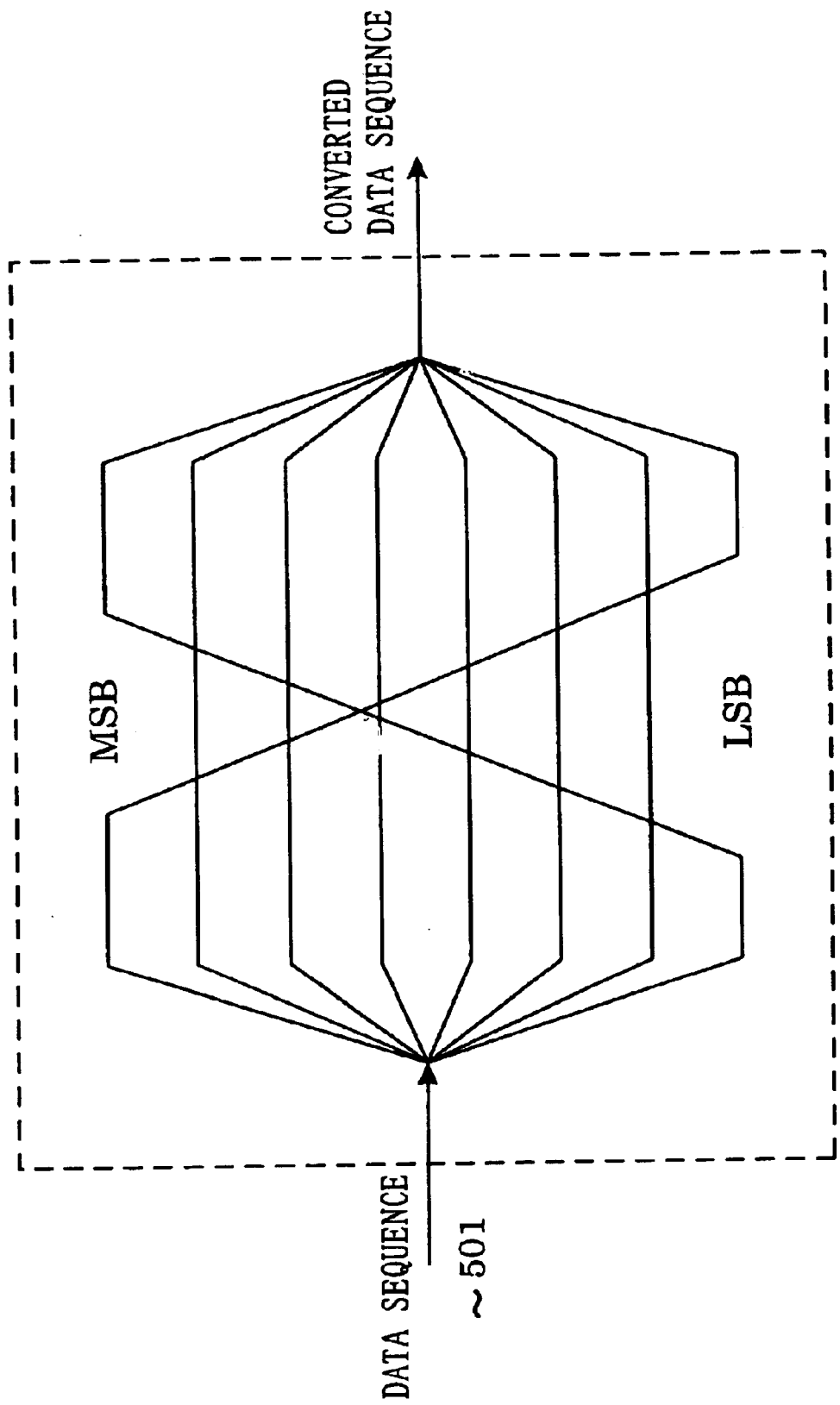
FIG. 37 explains an operation of a conventional data bit switch provided for encryption.
Figure 38:
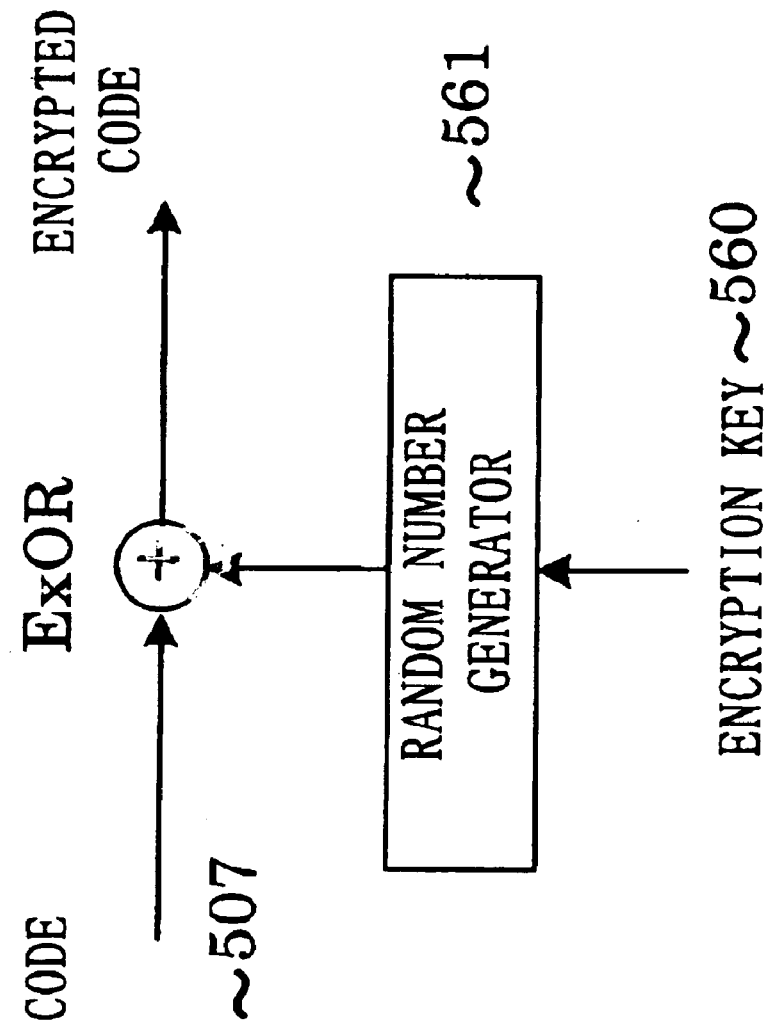
FIG. 38 shows an encryptor using a conventional logical operation.
Figure 39:
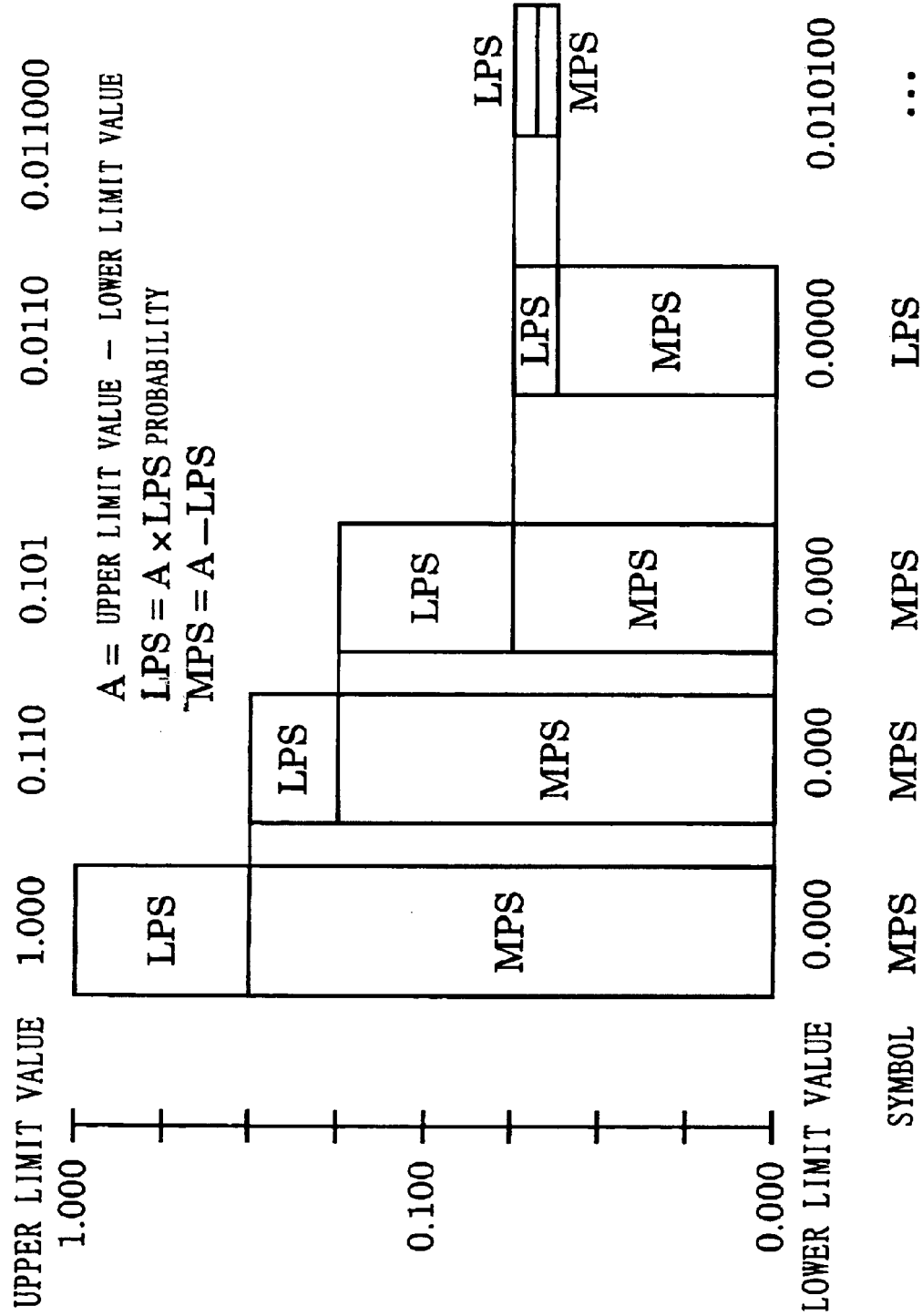
FIG. 39 explains operations of binary value arithmetic encoding and decoding.
Figure 41:
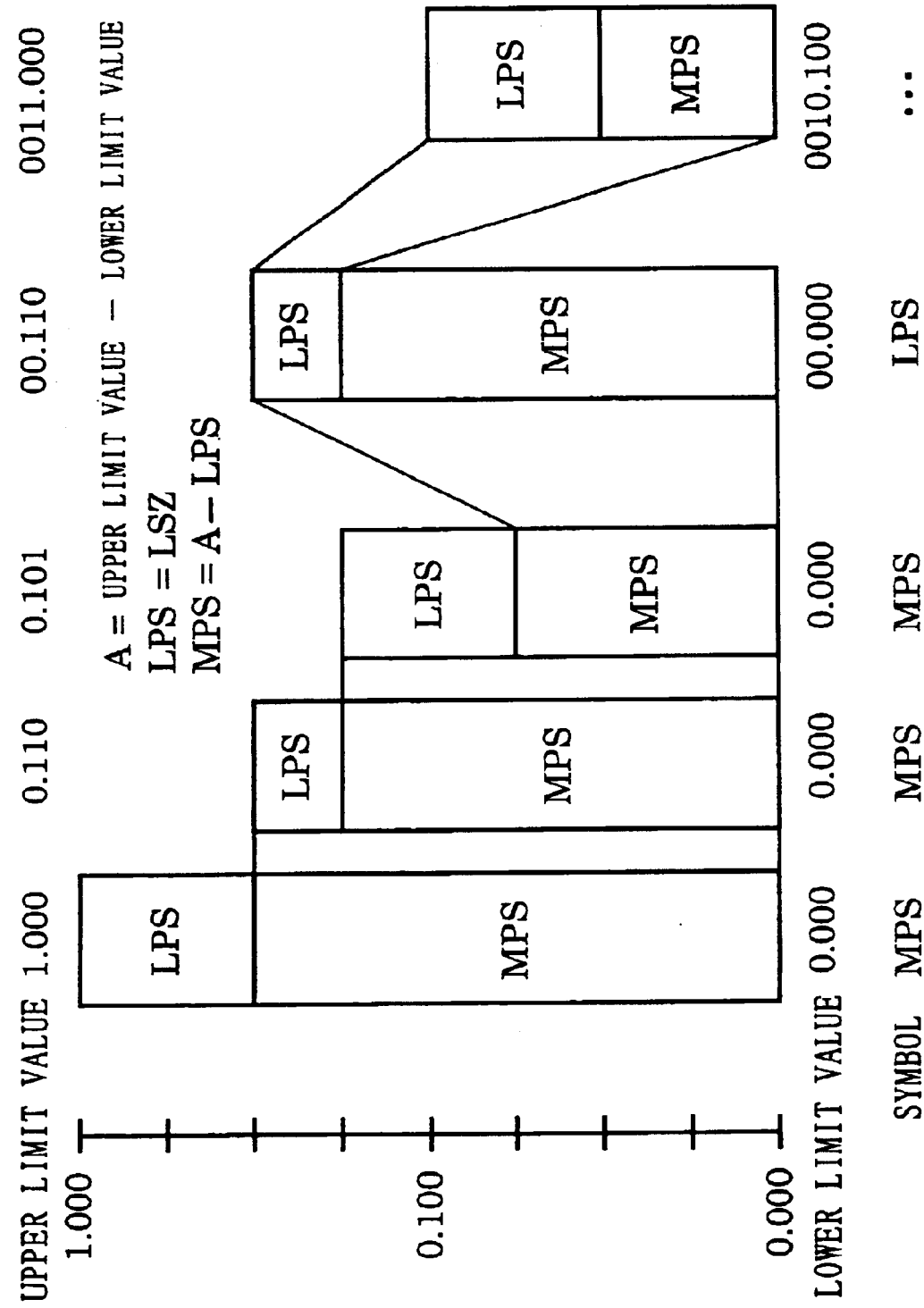
FIG. 41 shows a concept of subtraction type arithmetic encoding and renormalization.

To clarify an introduction of the data construction unit 535, a data construction unit dividing unit 534 and a data construction unit assembling unit 536 are added to the basic configuration of the related art of FIG. 35 (encoder) and of the related art of FIG. 36 (decoder). It is required for the data construction unit dividing unit 534 and the data construction unit assembling unit 536 to include a data buffer or a data memory having enough capacity for dividing into/assembling from the data. Further, the modeling unit 502A', 502B' are required to include a buffer or a memory having a capacity of the data construction unit, or to include a function capable to refer to the data buffer or the data memory included in the data construction unit dividing unit 534, the data construction unit assembling unit 536 if the decision of the parameter 504 requires a function to refer to the data construction unit. In case plugging the change information 521 in the code 507 for notifying the code manipulating unit 531A or the code transmitting unit 506 plugs the information, and the code manipulating unit 531B or the code receiving unit 508 separates the information.

In the encoder of FIG. 24, the data construction unit dividing unit 534 divides the data sequence 501 into the data construction unit 535, and the encoder treats each of the data construction unit 535 as the data sequence 501 of FIG. 35 to encode and encrypt the data construction unit 535 in a similar way to the method explained in the first embodiment. The change information designing unit 520 designs the change information 521 so as to meet the design requirement 510 for the data construction unit 535. Here, the design requirement 510 of the encoder is to output from the data construction unit dividing unit 534 when the change information 521 is designed, however, the standard of the design requirement 510 can be an independent condition set as the encoder, or can be a condition based on the design condition required from the decoder side.

The decoder of FIG. 25 decodes and decrypts the data construction unit 535, which corresponds to the data sequence 501 shown in FIG. 36, outputs the data construction unit 535 to the data construction unit assembling unit 536, the data construction unit assembling unit 536 assembles the data construction unit 535 to output the data sequence 501 encode and decode the data construction unit with confidentially determining the change information can be considered as a simple encryption. Assuming that the data consists of one construction unit, the data cannot show an outline of the contents, but the encoded data can be considered as encrypted.

According to the present embodiment, the encoder confidentially determines the information to be shared with the decoder, which is different from the setting of the conventional encoder for each data construction unit, changes the setting of the modeling unit 502A', the encoding unit 505', and the code sending unit 506' and implements encoding. The conventional decoder cannot reproduce the original data using the code generated in this way, because the generated code is different from the one of the conventional encoder. However, on looking at the data construction unit, the conventional decoder can normally decode only information included in the data construction unit, which is encoded without setting the shared information by the encoder.

According to the present embodiment, the decoder shares the setting information, which is different from the one of the conventional decoder for the data construction unit, changes the settings of the modeling unit 502B', the decoding unit 509', and the code receiving unit 508' to implement decoding, and reproduces the data by reconstructing the decoded data construction unit. The code generated by the conventional encoder can be decoded by the decoder of the embodiment without changing the settings because the conventional encoder does not have the information to be shared.

In case of using the encoder and the decoder according to the embodiment, when the encoder encodes the data with changing the setting for each data construction unit, if the encoder keeps a part of the setting information secret not to be shared with the decoder, the output data sequence from the decoder can be intentionally made different from the input data sequence to the encoder. Further, a part of or all of the shared information can be set previously between the encoder and the decoder, instead of notifying through the notifying unit.

According to the present embodiment, even if the decoder cannot obtain the shared setting information, and thus receives and reproduces the decoded data construction unit including the decoding error, the reproduction quality can be controlled. Namely, conventionally, during the preprocessing of the encoding, the data is changed by adding noise to the original data, and the data is implemented standard encoding and decoding. Accordingly, the decoded result is made from the changed data. Therefore, after obtaining the decoded data, an inverse operation of the preprocessing of the encoding should be implemented to obtain the original data. However, according to the embodiment, plural candidates of data construction units can be provided for the same code by giving a part of the shared setting information, by which the decoder can decode only the data including the decoding error. It is possible to provide plural reproduction qualities according to which of the plural candidates is used. For example, when the data is an image, the reproduction quality is "image", the encoder sets the change information, encodes and sends the data. The gradation/resolution is intentionally made degraded by setting the change information to encode the data, sending, and diffusing the data decoded directly from the encoded data as a noise. Further, it can be implemented to encrypt the data so as to give the effect such as the information scrambling for reproducing totally different image from the original image. Such an active application of the embodiment can be implemented not only for the image data, but also for other kinds of data. In case of speech data, the reproduction quality becomes "sound quality". For example, the divisional band of frequency is assumed as the data construction unit, and the sound quality can be controlled by setting the change information to intentionally generate the decoding error in the above described way. Consequently, it is possible to intentionally degrade the quality of the data which is received and decoded by the conventional decoder without sharing the change information.

Figure 26:
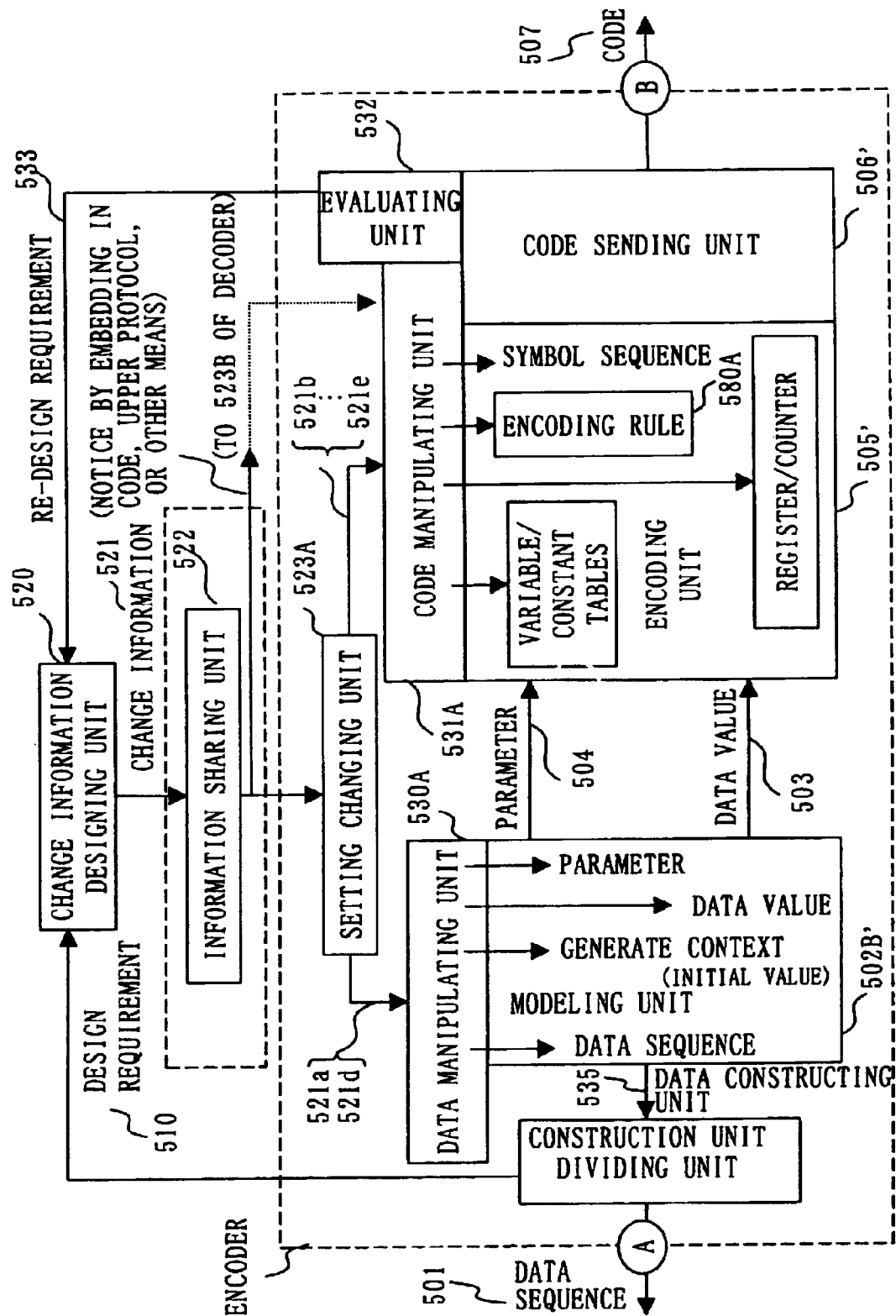
FIG. 26 shows a configuration of another encoder according to the second embodiment of the present invention.

The reproduction status of the data construction unit of the data decoded and reproduced by the conventional decoder including the decoding error varies according to the design of changing the setting. The design of changing the setting can be implemented by previously computing the decoding error for the data construction unit 535 of the encoder of FIG. 24 as well as FIG. 5. FIG. 26 shows a configuration of the encoder for setting the desired change information. The evaluation encoding which employs the evaluation/re-design can be implemented for whole data, or for each of the data construction unit.

It is required to select the data construction unit for encoding the data by dividing into plural data construction units. The data construction unit without setting the change information can be correctly decoded by the conventional decoder. For example, if representing an outline of the image data is the most important, the change information is not set in the corresponding data construction unit to be encoded. Further, in case of the confidential information which is an outline of the data and desired to be unreproducible, the change information is set for the data construction unit for the most important data and the data is encoded. Of course, the same change information can be set for all the data construction unit or an independent change information can be set for each of the data construction unit, so that more strong encryption can be implemented. Further, to control the reproduction quality, the change information is separately set for plural data construction units of the image data, the shared information is set to gradually disclosed by combining disclosure/concealment of the shared information, and controls the image quality by combining the status with or without including the decoding error for each of the data construction unit. To reproduce the outline of the image data first, the change information can be disclosed from the data construction unit having more importance, so that the best quality of the normal image can be obtained when all the data construction units are disclosed. Further, the code can be sent after sorting the data according to the importance of the data. As for one example of the gradual disclosure, a lank of the access right (user agreement) to the reproduction quality of the data can be classified based on the purchase amount of the data.

According to the present embodiment, not only achieving an object that the information is scrambled by dividing into the data construction unit and encrypting the data, and the unauthorized access to the data construction unit can be prevented, but the higher application can be implemented. Namely, first, it is notable that one piece of data is divided into plural data construction units and the generated data construction units are assembled into the reproduced data again. The code is generated by partially changing the setting with previously estimating the decoded result, generating the code by partially changing the setting. The equivalent effect can be achieved by not sharing the change information to generate the decoded data having the decoding error without giving the noise signal from the outside as performed conventionally. Further, a method has been explained, in which one code contents can supply the data from which plural different reproduction qualities are resulted by varying the way of giving the change information. By these methods, it can be expected that the copyright of the author of the data contents is protected, the user's desire to purchase/contract the data contents by first introducing the outline of the data is promoted, and the data contents are positively used.

The information which is sent by the encoder having the change information is set the change for the data construction unit has various change information according to the importance. Accordingly, for the decoder without sharing the change information such encoded data can be the equivalent scrambled information to the complete ciphertext data encrypted by the theoretical encryption process or the outline data having a certain distinguishable quality. Of course, without setting the change information, the encoder and the decoder of the embodiment can be compatible with the conventional encoder and the conventional decoder, respectively.

An application example of the data construction unit and the control of the reproduction quality according to the embodiment will be explained in the following.

First, a method will be explained, in which the encoding with setting the shared information and decoding is applied to bit plane which is one example of the encoding data construction unit, bit plane which is implemented gray-code conversion, and level plane. The encoding and decoding with setting concrete shared information will be described later.

Figure 27:
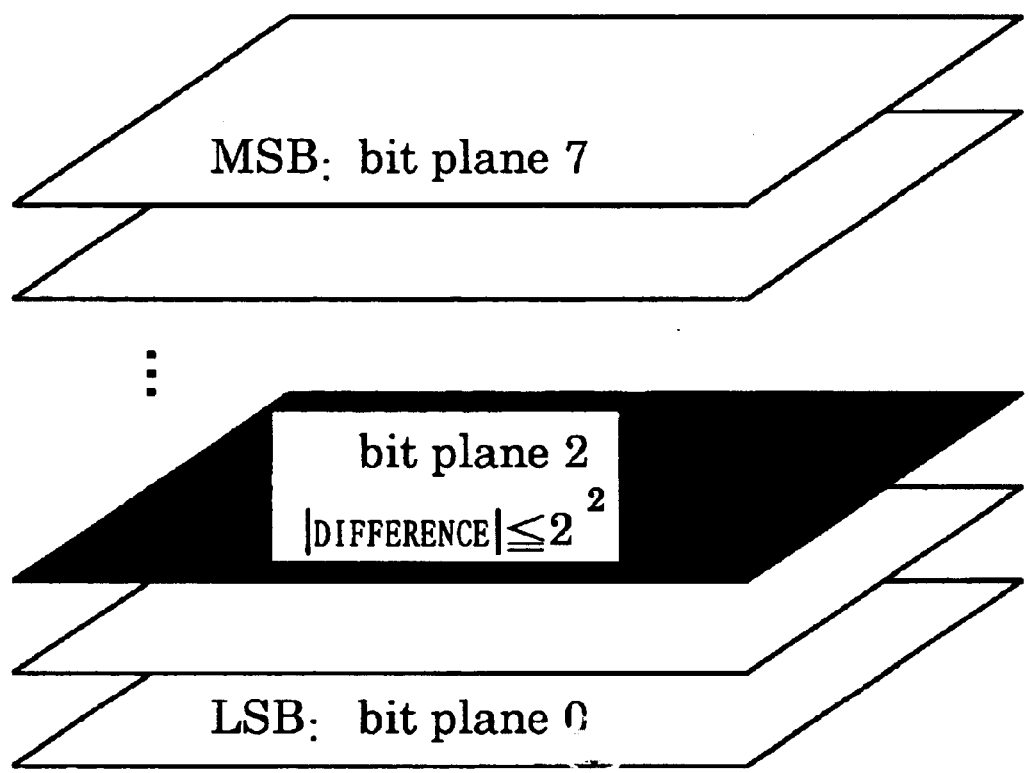
FIG. 27 explains an operation of bit-plane encoding according to the second embodiment.

In the ITU-T recommendation T.82 of the international standard encoding system, a method is defined that the multi-value image data is divided into bit plane unit, and each of the bit plane is encoded as binary image data. FIG. 27 shows encoding 8-bit image using eight bit planes, and all bit planes are encoded by the conventional system (standard system). According to the present embodiment, the encoder encodes the bit plane by changing a part of or all of the settings of one or plural bit planes, which makes the conventional encoder unable to decode correctly.

FIG. 27 shows a case in which among the bit planes 0 through 7, the bit plane 2 is encoded by changing the setting of the conventional encoder. Namely, the construction unit dividing unit 534 of the encoder side shown in FIGS. 24 and 26 manipulates only an image of the bit plane 2 using the setting changing unit 523A which has been explained in the modeling and encoding processes thereafter in the first embodiment and one of the data manipulating unit 530A and the code manipulating unit 531A. The same modeling and encoding are performed as the conventional method for other bit planes. Correspondingly, the construction unit assembling unit 536 of the decoder side manipulates only the image of the bit plane 2 using the setting changing unit 523B which has been explained in the decoding and modeling processes thereafter in the first embodiment and one of the data manipulating unit 530B and the code manipulating unit 531B. The same decoding and modeling are performed as the conventional method as well as the encoder side. By implementing this, the maximum difference from the original image becomes an absolute value of a square of 2, and in case of the bit plane n, the original image becomes an absolute value of n power of 2. When the conventional decoder decodes the encoded bit plane, the decoding error occurs in the bit plane to generate a noise. The noise degrades the image quality, which prevents to represent the normal original image. The correct decoding can be implemented only when the encoder and the decoder share the information how to encode/decode the data by modifying the conventional system.

In another case, encoding the most significant bit (MSB) having the most importance by the conventional encoder with changing the setting can provide almost undistinguishable image data as well as inserting the noise, which brings the same effect to the encryption.

Further, plural bit planes are encoded by the conventional encoder with changing the setting, which controls the maximum value of the error according to the ratio of sharing the setting change information for each of the bit planes. The ratio of sharing the information is determined by the location information of the bit planes encoded by changing the setting, the disclosure ratio of different encoding method, and so on. For example, in case of encoding the bit planes 1 and 2 by the conventional encoder with changing the setting, 2 (=m) planes are selected to encode, which causes to occur an error in $\{(m+1)$ power to $2\}-1$ ways including positive/negative values and 0. The absolute value of the maximum error is a sum of weights of each bit plane (1 power of 2)+(square of 2)=6. Based on the above ratio of sharing information, the following cases can be considered: all the bit planes can be decoded correctly; the bit plane 1 is an error; the bit plane 2 is an error; and both of the bit planes 1 and 2 are errors (decoded by the conventional decoder). The respective absolute values of the maximum error are 0, 2, 4, and 6.

In the above encoding of the bit plane, the image can be displayed using only upper bit plane without an error (noise), however, the gradation of the image is degraded because of limitation to employing the upper bit planes. This display status may cause to generate and display the image having high gradation but including noise due to the decoding error unless the display status should be forced to terminate the decoding momentarily at that point during the decoding process. Accordingly, only the image having low gradation or the image having high gradation but including noise is displayed to the user without sharing the change information.

Further, in another way to add noise to the result decoded by the ordinary decoder, the construction unit dividing unit 534 can perform a data transformation shown in FIG. 28. In this case, the construction unit assembling unit 536 performs an inverse transformation using the same operation of FIG. 28. The embodiment can be applied without any problem to a case in which the data value is converted into picture one by one using a gray code shown in FIG. 28, and the converted value is encoded by bit plane encoding. FIG. 28 shows an example having 3-bit data. If the difference between the data values is 1, the assignment rule is always set to have only 1-bit difference. This can be extended based on the number of bits of the data construction. The conventional decoder cannot perform an inverse transformation on the decoded data using the gray code. This is also considered as a simple encryption. The above example is merely one of examples using 3-bit data. To increase the strength of the cipher, the conversion table can be switched periodically or at random. The conversion table can vary if the conversion rule of gray code is not taken.

Further, the present embodiment can be applied to a level plane encoding, by which the occurred data is converted into another kind of data in data level of 0/1 Run-Length. For example, the data value X is converted into an X-bit level plane having (X−1) number of '0's and one '1'. By this conversion, the number of planes increases compared with the bit plane of the data value itself, however, the redundancy becomes controllable, which may improve the compression ratio.

Further, another example in which the encoding of the embodiment is applied to other data construction unit and reproduction quality control. First, the encoding by setting the shared information and the decoding according to the embodiment is applied to color palette which is one example of data construction unit. The encoding and the decoding by setting concrete shared information will be explained later.

The image encoding using color palette can be implemented by rather simple data switching. "Switching" palette can be "substituting" in case that the substituted data is modifiable at decoding, and "Mapping Conversion" one by one as described above. "Switching" can be implemented by XOR operation with a random value or a predetermined value as implemented in the conventional encryption. In this case, display color may be switched or unexpected color may appear in the image, which displays an image having the noise or a totally confusing image.

Another method employing the encoding by setting the shared information and the decoding using the data construction unit of the converted data by such as DCT transformation sub-band conversion, wavelet conversion will be explained. The encoding and the decoding by setting concrete shared information will be explained later.

Figure 29:
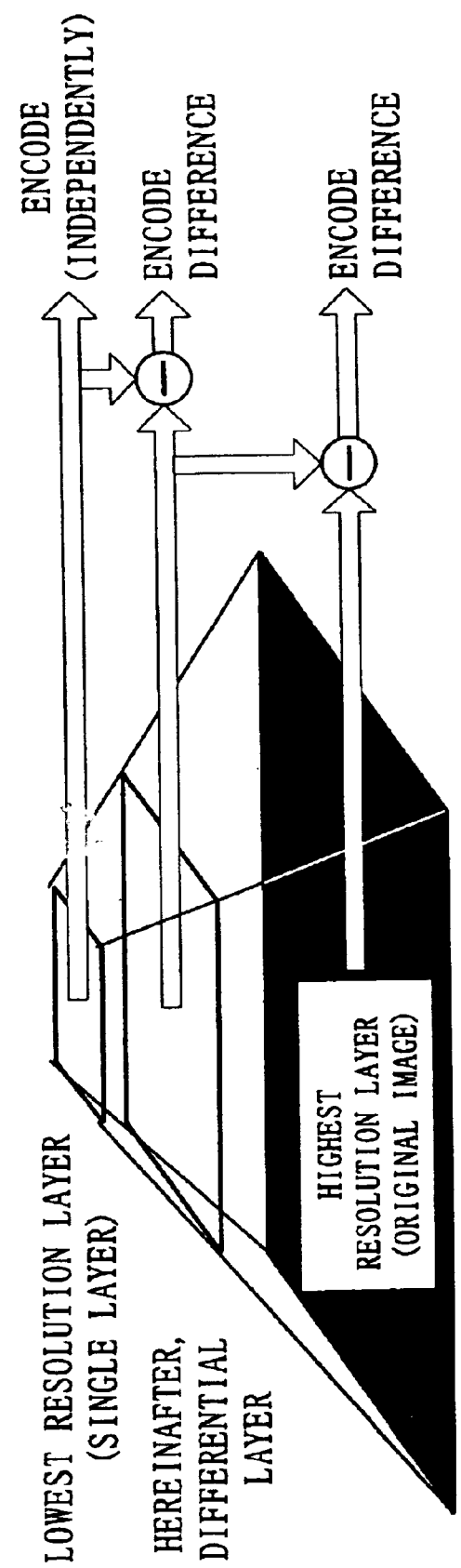
FIG. 29 explains multi-layering operation based on resolution according to the second embodiment.

The ITU-T Recommendation T.82, the international standard encoding system, defines a hierarchical encoding method, in which the original binary image is assumed as having the highest resolution, and from that some of reduction steps are implemented, and the encoding is performed from the data having the lowest resolution. In this case, the construction unit dividing unit 534 instructs to encode the most rough image (a single layer [the lowest resolution layer]) independently as shown in FIG. 29. After that, to encode the difference information of the difference to the next layer storing the image having the resolution next to the lowest is instructed. Accordingly, the modeling and the encoding thereafter are performed in the way of the first embodiment, and the difference information cannot be received at all resolution layers which is higher than the selected layer. Therefore, the conventional decoder without setting the change information cannot decode correctly.

In case of the above hierarchical encoding method, the image can be displayed using up to the layer having the resolution without an error (noise). In this case, however, it is required to extend the image to the desired size to display when the resolution is low, and thus a simple extension operation and an interpolation process such as smoothing the slant edge are required. Nevertheless, the original image cannot be reproduced completely through these processes.

As well as the hierarchical encoding, the embodiment can be applied to a sub-band encoding system which encodes the image data by dividing its band, a wavelet encoding system, and so on. Further, the embodiment can be applied to an encoding of DC/AC (direct-to-alternating current) conversion system such as DCT (Discrete Cosine Transformation) cited in the ITU-T Recommendation T.81, the International Standard Encoding System, in which the band is divided and the encoding is controlled for each divided band. In this case, as shown in an example of the wavelet encoding of FIG. 30, except an upper layer LL to be re-divided, each part of LL, HL, LH, HH is encoded to generate the code. The code generated from the layer (the second layer HL), in which the setting is changed by the construction unit dividing unit 534 as explained in the first embodiment, cannot be decoded correctly by the decoder without sharing the change information. The code generated from the layer upper than the second layer HL also cannot be decoded correctly by the conventional decoder, because it is reconstructed based on the data of the second layer HL, which creates disordered reproduction of the image.

Further, in case of animation, by assuming the image frame having the same resolution and size is used instead of the above resolution layer of the hierarchical encoding system, the reproduction quality of the image can be controlled similarly.

Further, if the change of the setting is applied to the resolution layer which is encoded first and independently, the band, and the frame, the encryption can be implemented for the conventional system.

Needless to say, the above-described examples can be applied to color image which is displayed based on the binary image, the continuous tone image (gradation image) and their combination. The component of the color image can be three primary colors such as RGB (red, green, blue), YMC (yellow, magenta, cyan), and any of luminance such as YCbCr, color difference, display precision of each component. Further, not only to the hierarchical encoding, but the embodiment can be applied to a case in which one image is divided by block unit, stripe unit, or unit of free shape, and each of them is assumed as the data construction unit and the application is done for each part. At this time, the hierarchical encoding can be implemented after dividing the image.

Further, the application is not limited to a case handling the image, but also a case in which the code sending order is controlled according to the importance that the data construction unit has. For example, it can be applied to an installation form in which the most important data is encoded first to generate the code, and at the first stage of the decoding process, the most important part is decoded and reproduced. In this case, if the encoding is implemented by changing the setting and the conventional decoder without changing the setting decodes the data, the reproduction quality is limited in the most important data to be decoded and reproduced in detail at the first stage. The standard for selecting the importance can specify from an arbitrary interesting part of the image as specified in the encoding so-called ROI (Region Of Interest). On the contrary, the code sending order can be controlled so that the important part is not made to reproduce at first stage, but at last stage the image is reproduced in detail. For a concrete example of this control, Mosaic processing is noted. By combining these controls, so-called progressive reproduction can be made.

FIG. 31 shows an example of encoding/decoding data consisting of two bit planes. The upper bit plane is the same as one shown in FIG. 12. The lower bit plane is decoded data for setting value when the data sequence '0100' is divided equally into subdivisions as well as the upper bit plane and encoded, where the first context CX=0, the prediction value of context 0, 1: prediction value MPS(0)=1, MPS(1)=0. By combining the two bit planes, 36 ways of the reproduced data can be obtained from 64 ways of combination of the setting values. If the setting value is intentionally controlled to disclose, plural reproduction qualities can be provided.

The above operations have been explained using the configurational elements shown in FIGS. 1 through 5, and further, the same function can be obtained by constructing a computer program for general purpose with the equivalent steps to these configurational elements.

Embodiment 3

Another embodiment will be explained as a business application employing the second embodiment.

Figure 32:
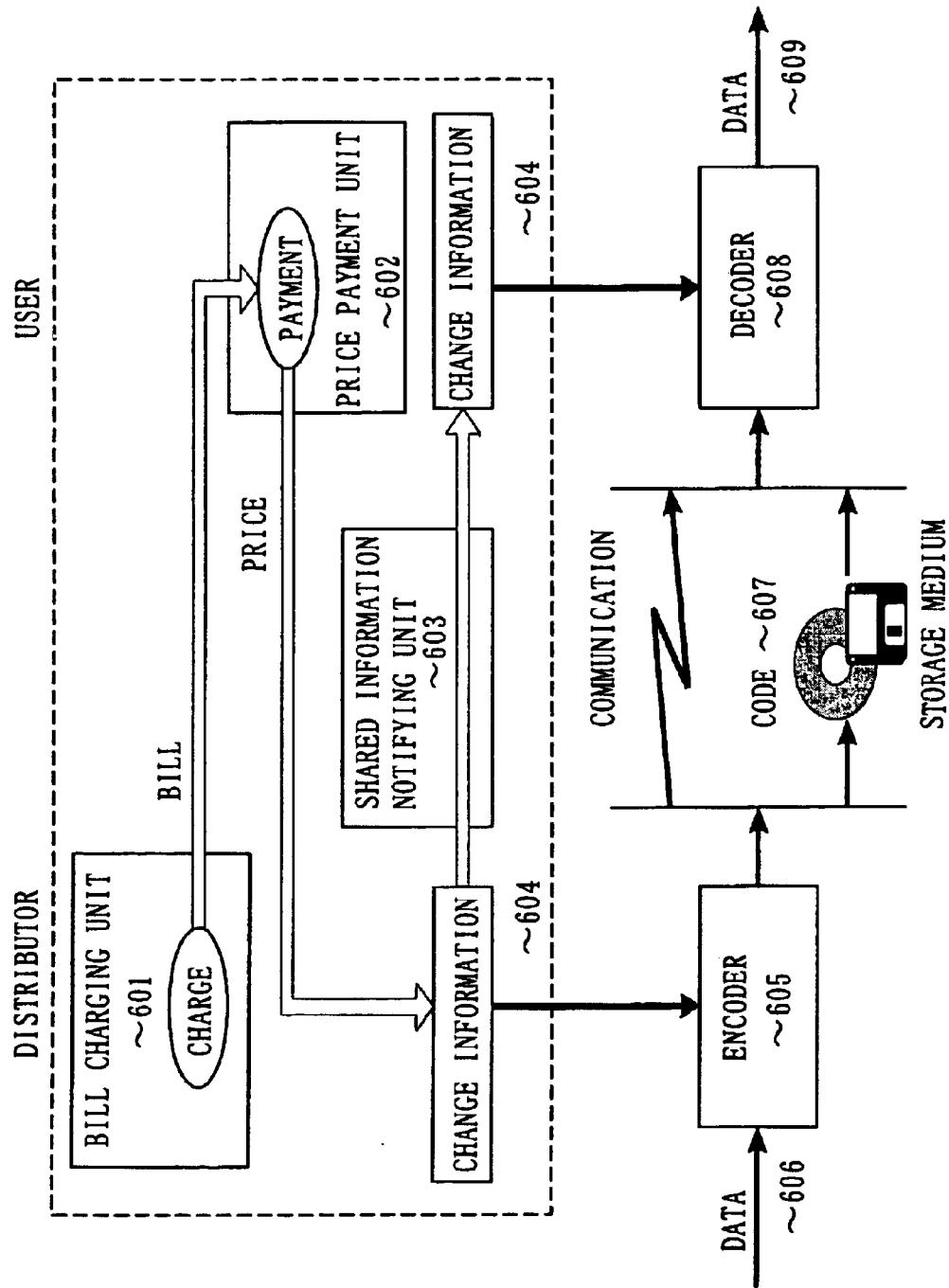
FIG. 32 shows a configuration of data distribution system according to the third embodiment.

The change information to be shared is applied to, for example, a bill charging unit 601 for charging a bill from the distributor for a normal data access right and a price paying unit 602 for paying the price in the data distribution system as shown in FIG. 32. In this case, when both of the distributor and the user reach an agreement, a shared information notifying unit 603 notifies the shared information and the both partners obtain it, and an improper access to the data can be prevented. To notify the shared information can be performed by any of data communication, postal delivery, and so on. First, the distributor generates a code 607 using an encoder 605, in which change information 604 is set, and sends the code to the user through the communication or the storage medium. Next, the receiving side decodes the code 607 into data 609 using a decoder 608 in which the shared information notified is set. Here, it can be considered that the reproduction quality can be controlled by disclosing the shared information 604 gradually. When the data is reproduced on trial, the reproduction quality is made degraded or limited, and after the user obtains a formal access right, the complete data can be provided, while the contents (code) are the same. This is an example of building a bill charging/price paying system for each data construction unit as shown in FIG. 32.

The data distribution system employing the above bill charging/price paying is effective for sales promotion in an electronic catalog sales system, in which the user wishes to check a sample before purchasing, especially, image, sound. The electronic catalog sales includes not only on-line shopping employing browsing/downloading from the Internet or through electronic mail but also delivery/distribution through disks of a flexible disk, a hard disk, and CD-ROM, tapes of DAT, and a physical storage medium such as a memory card, a memory chip, a body/supplement (medium form) of books/magazines, etc. and the installation can be fixed or removable. The communication method of the data can be in digital, analog signal, and further wired, wireless, by electric wave, optical wave, sound wave, etc. Further, the communication is not restricted by the wavelength/frequency, the carry speed of the infrared, the ground wave, the satellite wave, the microwave, etc., and it is possible to transfer the data itself or to transfer the data overlaid with other data. Yet further, the data storage method is not limited to electrically, magnetically, optically, in phase, etc., and the data storage method can be any of read only, recordable/read once-write many, etc.

The bill charging/price paying system includes payment by electronic commerce (EC). The business application of the embodiment are configured by the bill charging/price paying units (601, 602), the shared information notifying units (603, 604), and the elements relating to sending/receiving the code (604 through 609). When the notice of the shared information is performed by the communication, the bill charging/price paying for an actual service of sending/receiving the code is implemented by the upper protocol with strong cipher system such as DES (Data Encryption Standard), which is known in the existing encryption technology field.

Figure 33:
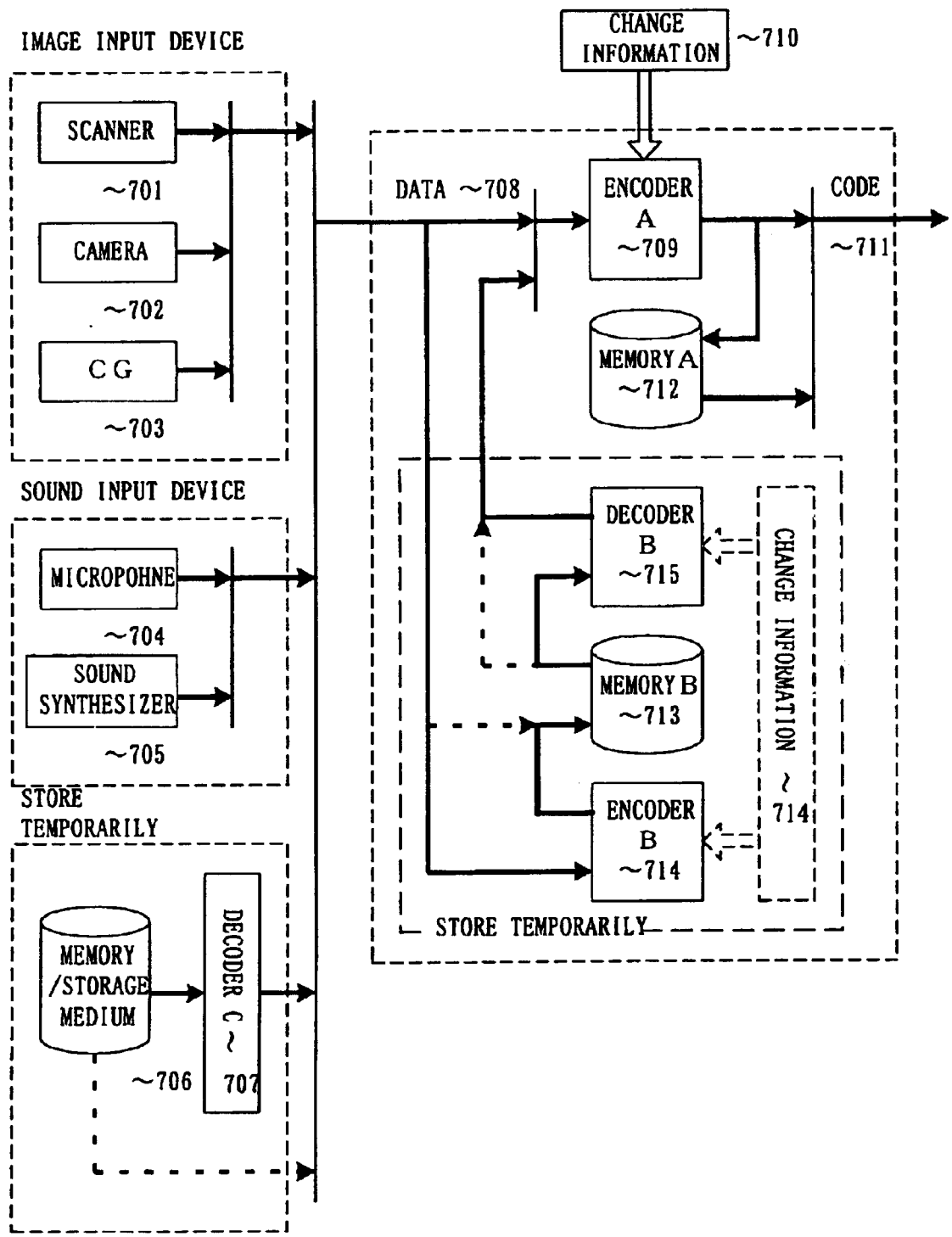
FIG. 33 shows a configuration of sender's device according to the third embodiment.

FIG. 33 shows a system configuration of the distributor's side of FIG. 32. Image data is generated by an image input device/apparatus such as a scanner 701, a camera 702, and a computer graphics generator (CG) 703. Further, sound data is generated by a sound input device/apparatus such as a microphone 704, and a sound synthesizer 705. Yet further, it is considered that the data is already stored in a storage device/apparatus such as a memory/storage medium 706, and if such data is stored in a form of compressed code, the data is decoded by a decoder C 707 and output as data 708.

Figure 30:
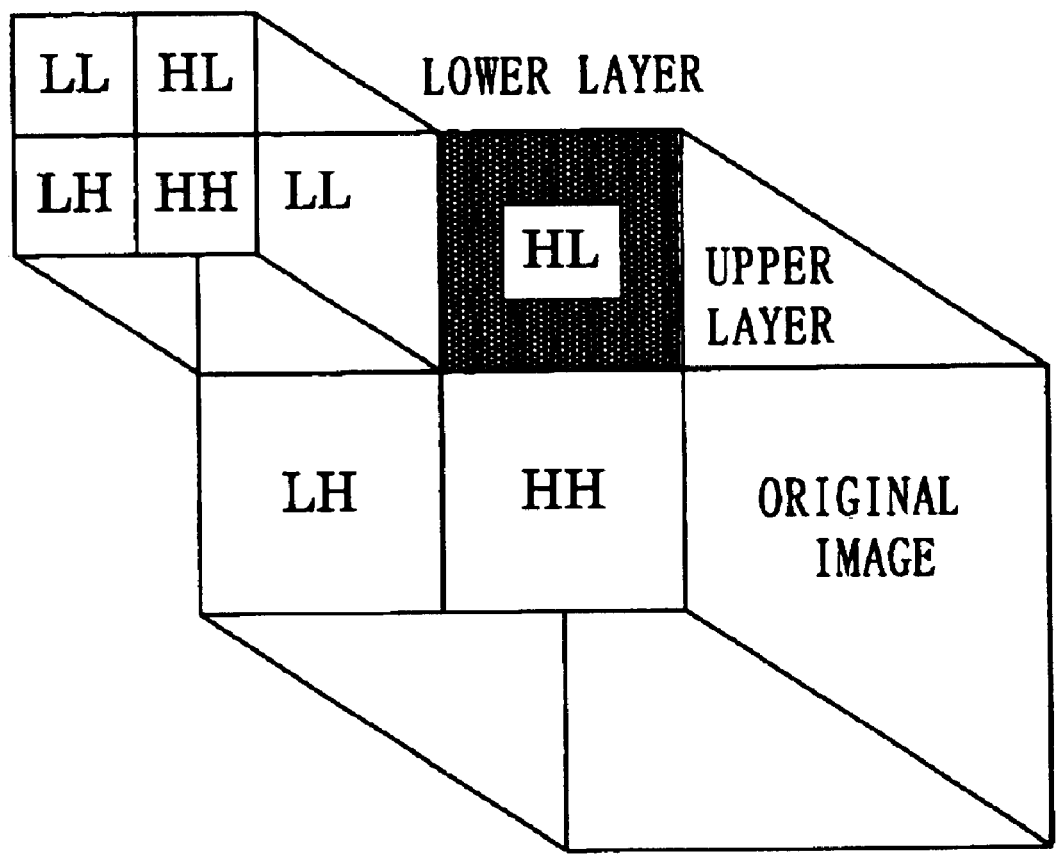
FIG. 30 explains a concept of wavelet according to the second embodiment.

An encoder A 709 sets change information 710 and encodes the data 708 prepared as explained above, outputs a code 711, and the code 711 is distributed through communication/storage medium as shown in FIG. 30. The code 711 can be temporarily stored in a memory A 712, and in case that distribution is made through communication, the code 711 is distributed at timing requested by the user. Further, the data 708 can be temporarily stored in a memory B 713 before encoding. The data 708 is compressed by an encoder B 714 and stored in a form of the code. Then, the compressed data 708 is extended by a decoder B 715 to send to the encoder A 709. In this system, the change information 710 is set for each user, re-coded by the encoder A 709, and the data is independently distributed. Further, the encoder B 714 and the decoder B 715 can perform encoding the data by setting change information 716 as set in the encoder A 709. In this case, the information is not scrambled. The change information 716, which is different from the change information 710 set in the encoder A 709, is set in the encoder B 714 and the decoder B 715 to achieve higher compression ratio of the data and store the data more efficiently.

Figure 34:
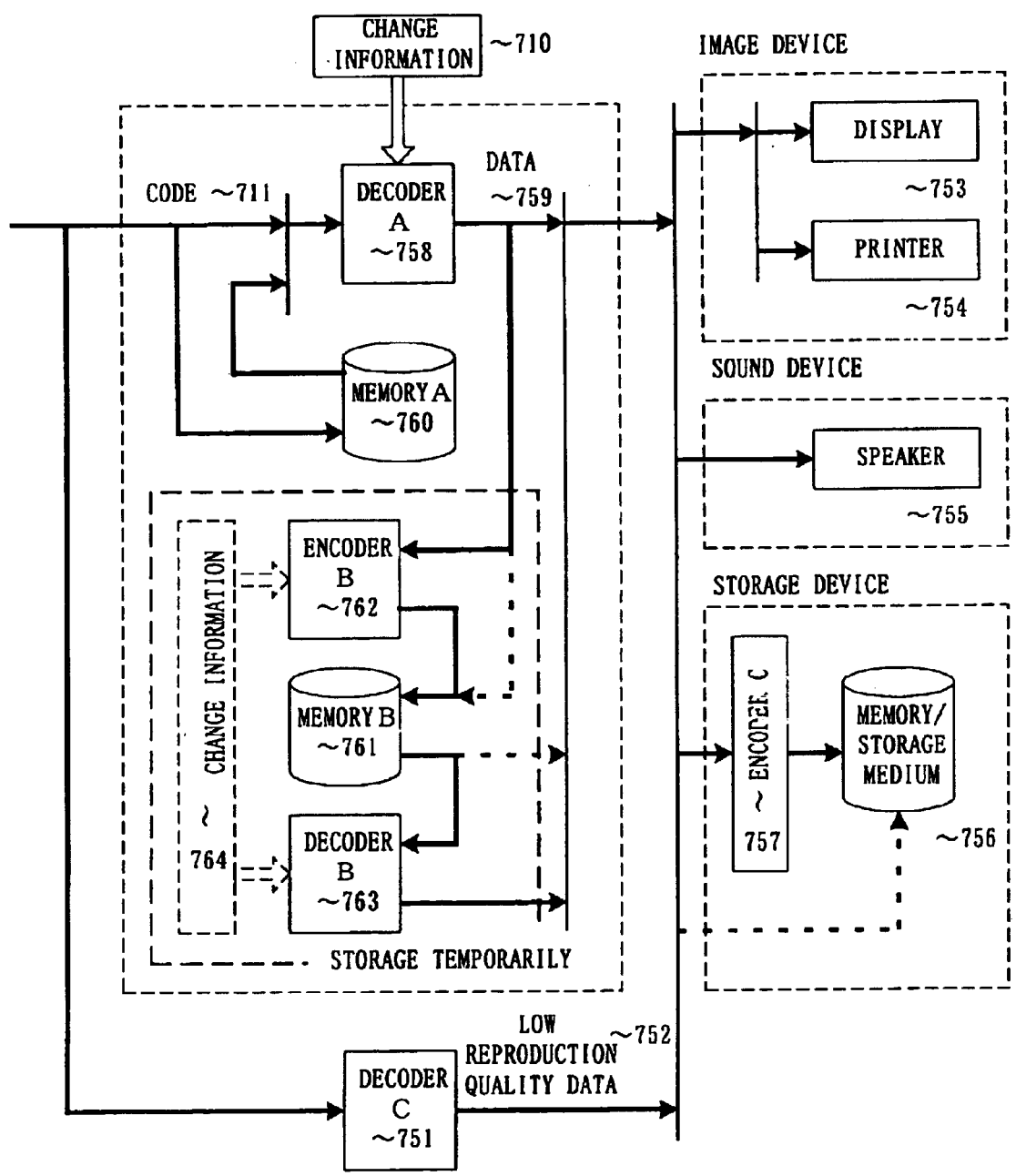
FIG. 34 a configuration of user's device according to the third embodiment.

FIG. 34 shows an example of system configuration of the user's side of FIG. 32. The code 711 which is either of the encoded data without setting the change information or the data construction unit can be decoded by a decoder C 751 without setting the change information as the conventional decoder. If the code 711 is encoded with setting the change information 710 and decoded by the decoder C 751 without setting the change information 710, low reproduction quality data 752 is obtained by the user without sharing the change information or the user who wants to check the outline of the data as a sample from the electronic catalog. At this time, if the data is the image data, the data is checked by an image output device/apparatus such as a display 753 and a printer 754. In case of the sound data, the data is checked by a sound output device/apparatus such as a speaker 755. Further, in case that the decoded data is stored in a storage device/apparatus such as a memory/storage medium 766, the stored data is sometimes converted by an encoder D 757. Regardless of the reproduction quality of the data, the user has to pay attention to the protection of the copyright of the author or transfer of the data. To clarify the explanation, the decoder C 751 is separately used from the decoder A 758, however, the decoder can be shared between the decoder C 751 and the decoder A 758, because the difference is only that the change information 710 is not set in the decoder C 751.

An authorized user who formally obtains the change information 710 can decode the code 711 encoded with setting the change information into the data 750 by setting the change information 710 in the decoder A 758. The code 711 can be temporarily stored in the memory A 760 inside the apparatus before decoding or the decoded data can be stored in the memory B 761 inside the apparatus. The code 711 can be compressed by the encoder B 762 and stored in the memory B 761, and extended by the decoder B 763 and output to the output device. The code can be stored in the form of the code without setting the change information. Further, change information 764, which is different from one set in the decoder A 758 (change information 710), can be set in order to efficiently store the code by achieving high compression ratio even in a non-standard encoding system.

As described above, at the user's side, the data is allowed to store only in the memory A 760 or the memory B 761 inside the apparatus, the decoder is used exclusively for reproducing, and the data is made not to store outside the apparatus such as in the memory/storage medium 756 in a form having high reproduction quality and uncompressed. Accordingly, the embodiment implements a form to prevent the user from an improper transfer of the data after the change information 710 is obtained by the user. In this case, the configuration of the apparatus can be a united form of an image and sound output device/apparatus, or a form in which an output path to the outside data storage device is secured directly and exclusively from the memory A 760 to the memory/storage medium 756.

Further, another case can be considered, in which inside the hardware device mounting the decoder or an application implemented by a CPU/LSI (ASIC) chips, middleware, and software library, the decoded data is allowed to process freely, however, it is prohibited to output the decoded data to the outside the apparatus/application through the communication and the storage medium. In this case, the apparatus includes an editing function of the inside data.

Further, the system configuration of the user's side can be a form of only data record as a hardcopy such as generated by a facsimile machine or data display as a softcopy. The sound quality control of the sound data can be performed by a telephone terminal including a cellular phone, and the image quality control can be performed to the data which is displayed on the appended display unit displaying the image or text. Yet further, in the image reproduction unit such as an internet browser, which easily copy and store the display image without an image output unit of a formal application on the PC, the shared change information is set and the resolution of the display image is restricted not to provide higher resolution than the user is allowed. In this case, it can be an effective way to provide a plug-in decoder of the browser with the above restriction function.

Industrial Applicability

As has been described, according to the present invention, an encoder has a setting changing unit for instructing to change data or a parameter based on change information, and at least one of a data manipulating unit and a code manipulating unit. The encoder can provide, with only one code data sequence, output data sequence of level desired by the encoder side to a receiver side of a decoder which has various levels, for example, the encoder can output only general data to the decoder which does not share corresponding change information.

Further, the encoder includes an evaluating unit, so that the change information can be set by previously evaluating the data sequence by the encoder side of the sender so as to become data sequence which is reproducible at the decoder side with various levels.

Further, the setting changing unit performs insertion/deletion of a specific bit, so that a process becomes simple compared with performing a separate encryption process and the circuit scale becomes small, and moreover, it requires less processing time.

Further, the setting changing unit changes an initial value/a prediction value of the context or adds/deletes a value to/from the encoding parameter, so that a process becomes simple compared with performing a separate encryption process and the circuit scale becomes small, and moreover, it requires less processing time.

Further, the code manipulating unit changes variables/constants, a value of a register/a counter, or an encoding rule, so that a process becomes simple compared with the encryption and circuit scale is small, and moreover, it requires less processing time.

Further, the insertion/deletion of a specific bit is performed according to an arithmetic encoding method, so that a process becomes simple compared with performing a separate encryption process and the circuit scale becomes small, and moreover, it requires less processing time.

Further, as the construction unit dividing unit is provided, a simple encryption process which is desired by the encoder side can be performed by changing only a specific data construction unit, so that a process becomes simple compared with performing a separate encryption process and the circuit scale becomes small, and moreover, it requires less processing time.

Yet further, according to the invention, a decoder has a setting changing unit for instructing to change data or a parameter based on the change information received from the encoder side, and at least one of a data manipulating unit and a code manipulating unit is provided, so that a process becomes simple compared with performing a separate encryption process and the circuit scale becomes small, and moreover, it requires less processing time. Further, in case of usual input for encoding without setting change information, desired output data sequence can be easily obtained.

What is claimed is:

1. An encoder for generating multiple quality data having a modeling unit for modeling input data sequence to obtain a data value and a parameter, an encoding unit for encoding an output from the modeling unit, and a code sending unit for sending an output from the encoding unit, the encoder comprising:
   a) a setting changing unit for instructing to change at least one of operation and setting based on change information; and
   b) at least one of:
      a data manipulating unit for manipulating at least one of the data value and the parameter output from the modeling unit to output to the encoding unit based on the change information; and
      a code manipulating unit either for obtaining encoded result by instructing the encoding unit to perform predetermined change operation based on the change information or for manipulating sending code output operation sent by the code sending unit based on the change information.

2. The encoder for generating multiple quality data of claim 1 further comprising an evaluating unit for evaluating sending output which has been changed based on the change information, and
   wherein the encoder sets the change information again based on an evaluation result of the evaluating unit.

3. The encoder for generating multiple quality data of claim 1, wherein the setting changing unit instructs to insert/delete a specific bit as the change information, and the data manipulating unit or the code manipulating unit correspondingly manipulates data based on the change information of inserting/deleting the specific bit.

4. The encoder for generating multiple quality data of claim 1, wherein the setting changing unit instructs to change an initial value of context or a prediction value of the context as the change information, and the data manipulating unit or the code manipulating unit correspondingly manipulates data based on above change information.

5. The encoder for generating multiple quality data of claim 1, wherein the setting changing unit instructs to add/delete a specific bit to/from encoding parameter on encoding, and the code manipulating unit correspondingly changes a value of an operation register for encoding performed by the encoding unit.

6. The encoding unit for generating multiple quality data of claim 3, wherein the setting changing unit instructs to insert or delete the specific bit according to an arithmetic coding method.

7. The encoding unit for generating multiple quality data of claim 1, wherein the code manipulating unit performs one of the following:

to change variable/constant tables in the encoding unit;

to change a value of a register/a counter; and to change a coding rule.

8. The encoding unit for generating multiple quality data of claim 1 further comprising a construction unit dividing unit for dividing the input data sequence into a predetermined data construction unit and outputting to the modeling unit, and wherein the changing setting unit, the data manipulating unit, and the code manipulating unit performs operations by each data construction unit divided.

9. The encoding unit for generating multiple quality data of claim 8, wherein the construction unit dividing unit changes setting of a specific bit plane to be encoded for each of the data construction unit divided.

10. The encoding unit for generating multiple quality data of claim 8, wherein the construction unit dividing unit, on hierarchical encoding each of the data construction unit divided, changes the setting of differential data for resolution of a layer which is located lower than a predetermined layer.

11. The encoding unit for generating multiple quality data of claim 1, wherein the change information specifies a location of a setting storage area in which actual change information is previously stored, and the data manipulating unit manipulates the change on modeling or the code manipulating unit manipulates the change on encoding based on the actual change information stored in the setting storage area.

12. A decoder for generating multiple quality data having a code receiving unit for receiving input code sequence, a decoding unit for decoding the input code sequence received, and a modeling unit for obtaining data sequence from data value decoded by the decoding unit and a self-generated parameter, the decoder comprising:

a) a setting changing unit for setting change information sent by an encoder instructing to change at least one of operation and setting; and b) at least one of:

a code manipulating unit either for manipulating the input code sequence received based on the change information to output to the code receiving unit or for instructing to change a way of decoding to the decoding unit to output the data value; and a data manipulating unit for obtaining a predetermined data sequence by instructing manipulation to the modeling unit to change either the data value output by the decoding unit or self-generated parameter based on the change information.

13. The decoder for generating multiple quality data of claim 12, wherein the setting changing unit instructs inserting/deleting a specific bit as the change information, and the data manipulating unit or the code manipulating unit correspondingly performs process based on the inserting/deleting.

14. The decoder for generating multiple quality data of claim 12, wherein the setting changing unit sets to change an initial value of context or a prediction value of the context as the change information, and the data manipulating unit or the code manipulating unit correspondingly performs changing process based on an instruction.

15. The decoder for generating multiple quality data of claim 12, wherein the setting changing unit instructs to add/delete a specific bit to/from the parameter decoded as the change information, and the code manipulating unit correspondingly changes a value of an operation register for decoding performed by the decoding unit.

16. The decoder for generating multiple quality data of claim 13, wherein the setting changing unit sets inserting/deleting the specific bit according to an arithmetic coding method corresponding to an encoder.

17. The decoder for generating multiple quality data of claim 12, wherein the code manipulating unit performs one of the following:

to change variable/constant tables in the decoding unit;

to change a value of a register/a counter; and to change a coding rule.

18. The decoding unit for generating multiple quality data of claim 12 further comprising a construction unit assembling unit for obtaining a normal data sequence from a predetermined data construction unit divided from the data sequence, and wherein the construction unit assembling unit performs decoding and modeling for each of the predetermined data construction unit based on the change information set by the setting changing unit.

19. The decoding unit for generating multiple quality data of claim 18, wherein the construction unit assembling unit changes setting of a specific bit plane to be decoded for each of the data construction unit divided.

20. The decoding unit for generating multiple quality data of claim 18, wherein the construction unit assembling unit, on hierarchical decoding each of the data construction unit divided, changer the setting of differential data for resolution of a layer which is located lower than a predetermined layer.

21. The decoding unit for generating multiple quality data of claim 12, wherein the change information specifies a location of a setting storage area in which actual change information is previously stored, and the data manipulating unit manipulates the change on modeling or the code manipulating unit manipulates the change on decoding based on the active change information stored in the setting storage area.

22. A encoding/decoding system including:

an encoder having a first modeling unit for modeling input data sequence to obtain a first data value and a first parameter, an encoding unit for encoding an output from the first modeling unit, and a code sending unit for sending an output from the encoding unit as a code sequence; and a decoder having a code receiving unit for receiving the code sequence, a decoding unit for decoding an output of the code receiving unit, and a second modeling unit for obtaining a second data sequence from a second data value decoded and a second self-generated parameter, wherein the encoder includes:
  a) a first setting changing unit for instructing to change at least one of operation and setting based on first change information; and
  b) at least one of:
    a first data manipulating unit for manipulating at least one of the first data value and the first parameter output from the first modeling unit to output to the encoding unit based on the first change information; and
    a first code manipulating unit either for obtaining encoded result by instructing the encoding unit to perform predetermined change operation based on the first change information, or for manipulating sending code output operation sent by the code sending unit based on the first change information; and wherein the decoder includes:
  c) a second setting changing unit for setting second change information instructing to change at least one of operation and setting sent by an encoder side; and
  d) at least one of:
    a second code manipulating unit either for manipulating the code sequence received based on the second change information to output to the code receiving unit or for instructing to change a way of decoding to the decoding unit to output the second data value; and
    a second data manipulating unit for obtaining a predetermined data sequence by instructing manipulation to the second modeling unit to change either the second data value output by the decoding unit or the second self-generated parameter based on the second change information.

23. The encoding/decoding system for generating multiple quality data of claim 22, wherein the change information is sent to a decoder side after a predetermined procedure is completed.

24. An encoding method for generating multiple quality data having a modeling step for modeling input data sequence to obtain a data value and a parameter, an encoding step for encoding an output from the modeling step, and a code sending step for sending an output from the encoding step, the encoding method comprising:
  a) a setting changing step for instructing to change at least one of operation and setting based on change information; and
  b) at least one of:
    a data manipulating step for manipulating at least one of the data value and the parameter output from the modeling step to output before the encoding step based on the change information; and
    a code manipulating step either for obtaining encoded result by instructing the encoding step to perform predetermined change operation or for manipulating sending code output operation sent by the code sending step based on the change information.

25. A decoding method for generating multiple quality data having a code receiving step for receiving input code sequence, a decoding step for decoding the input code sequence received, and a modeling step for obtaining data sequence from data value decoded and a self-generated parameter, the decoding method comprising:
  a) a setting changing step for setting change information instructing to change at least one of operation and setting sent by an encoder; and
  b) at least one of:
    a code manipulating step either for manipulating the input code sequence received based on the change information to output to the code receiving step or for instructing to change a way of decoding to the decoding step to have the data value; and
    a data manipulating step for obtaining a predetermined data sequence by instructing manipulation to the modeling step to change either the data value output by the decoding step or the self-generated parameter based on the change information.

26. A encoding/decoding method for generating multiple quality data having a first modeling step for modeling input data sequence to obtain a first data value and a first parameter, an encoding step for encoding an output from the first modeling step, and a code sending step for sending an output from the encoding step as a code sequence, a code receiving step for receiving the code sequence, a decoding step for decoding an output of the code receiving step, and a second modeling step for obtaining a second data sequence from a second data value decoded and a second self-generated parameter, the encoding/decoding method comprising:
  a) a first setting changing step for instructing to charge at least one of operation and setting based on first change information; and
  b) at least one of a first data manipulating step for manipulating either the first data value or the first parameter output from the first modeling step to output to the encoding step based on the first change information, and a first code manipulating step either for obtaining encoded result by instructing the encoding step to perform predetermined change operation or for manipulating sending code output operation sent by the code sending step based on the first change information;
  c) a second setting changing step for setting second change information instructing to change at least one of operation and setting sent by an encoder side; and
  d) at least one of a second code manipulating step either for manipulating the code sequence received based on the second change information to output to the code receiving step or for instructing to change a way of decoding to the decoding step to have the second data value, and a second data manipulating step for obtaining a predetermined data sequence by instructing manipulation to the second modeling step to change either the second data value output by the decoding step or the second self-generated parameter based on the second change information.

* * * * *